United States Patent
Masuoka et al.

(10) Patent No.: US 12,029,022 B2
(45) Date of Patent: Jul. 2, 2024

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 248 days.

(21) Appl. No.: 17/730,561

(22) Filed: Apr. 27, 2022

(65) Prior Publication Data
US 2022/0254790 A1 Aug. 11, 2022

Related U.S. Application Data

(63) Continuation of application No. PCT/JP2019/042593, filed on Oct. 30, 2019.

(51) Int. Cl.
H10B 99/00 (2023.01)
H10B 10/00 (2023.01)

(52) U.S. Cl.
CPC ............ H10B 10/12 (2023.02); H10B 99/00 (2023.02)

(58) Field of Classification Search
CPC ................................. H10B 10/12; H10B 99/00
USPC ........................................................ 257/329
See application file for complete search history.

(56) References Cited

U.S. PATENT DOCUMENTS

| | | | |
|---|---|---|---|
| 10,651,180 B2 * | 5/2020 | Masuoka | H01L 21/2253 |
| 2008/0303083 A1 | 12/2008 | Oyu | |
| 2010/0219483 A1 | 9/2010 | Masuoka et al. | |
| 2015/0221750 A1 | 8/2015 | Masuoka et al. | |
| 2019/0027483 A1 | 1/2019 | Zang et al. | |
| 2019/0148387 A1 | 5/2019 | Masuoka et al. | |
| 2019/0295900 A1 | 9/2019 | Masuoka et al. | |

FOREIGN PATENT DOCUMENTS

| | | |
|---|---|---|
| JP | 02-188966 A | 7/1990 |
| JP | 2008-305896 A | 12/2008 |
| TW | 201312693 | 3/2013 |
| WO | WO 2015/022744 A1 | 2/2015 |

(Continued)

OTHER PUBLICATIONS

International Preliminary Report on Patentability, English translation, for Application No. PCT/JP2019/042593, dated May 12, 2022, 5 pages.

(Continued)

*Primary Examiner* — Monica D Harrison
(74) *Attorney, Agent, or Firm* — Crowell & Moring LLP

(57) ABSTRACT

A bottom portion of a Ta pillar serving as a contact portion is connected to an $N^+$ layer and a $P^+$ layer, and a gate $HfO_2$ layer is connected to side surfaces of Si pillars and a Ta pillar serving as a contact portion and an upper surface of a $SiO_2$ layer between the Si pillars and the Ta pillar serving as the contact portion. Gate TiN layers are provided on a side surface of the gate $HfO_2$ layer surrounding the Si pillars. Midpoints of the Si pillars and the Ta pillar serving as the contact portion are on one first line in plan view.

19 Claims, 35 Drawing Sheets

(56) References Cited

FOREIGN PATENT DOCUMENTS

WO    WO 2018/070034 A1    4/2018
WO    WO 2019/087328 A1    5/2019

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

* cited by examiner

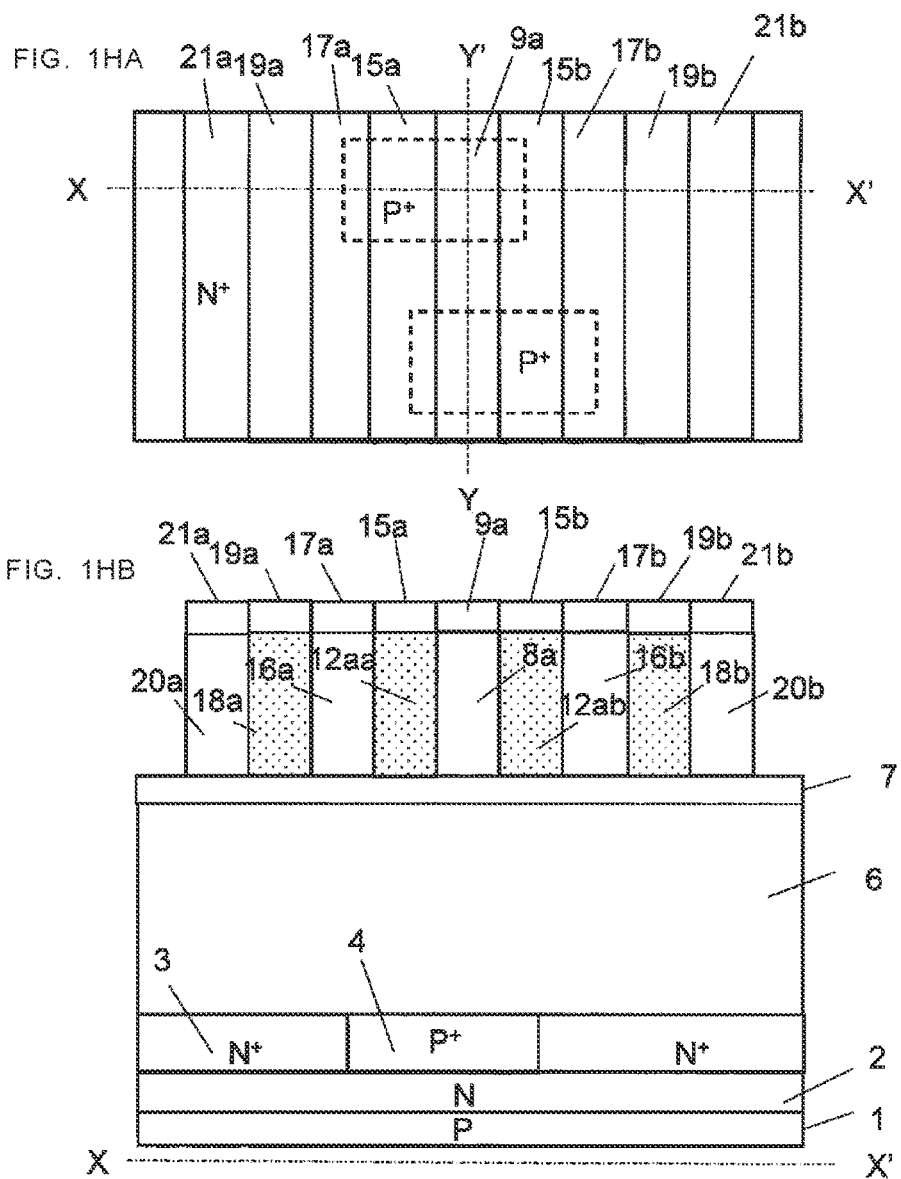

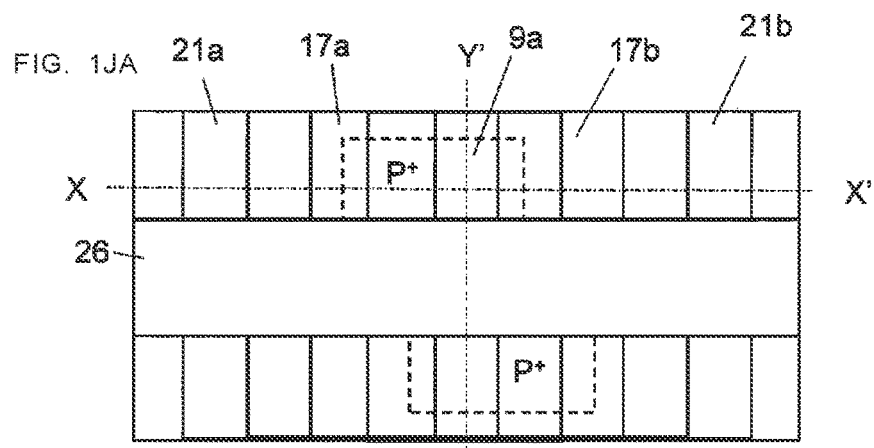
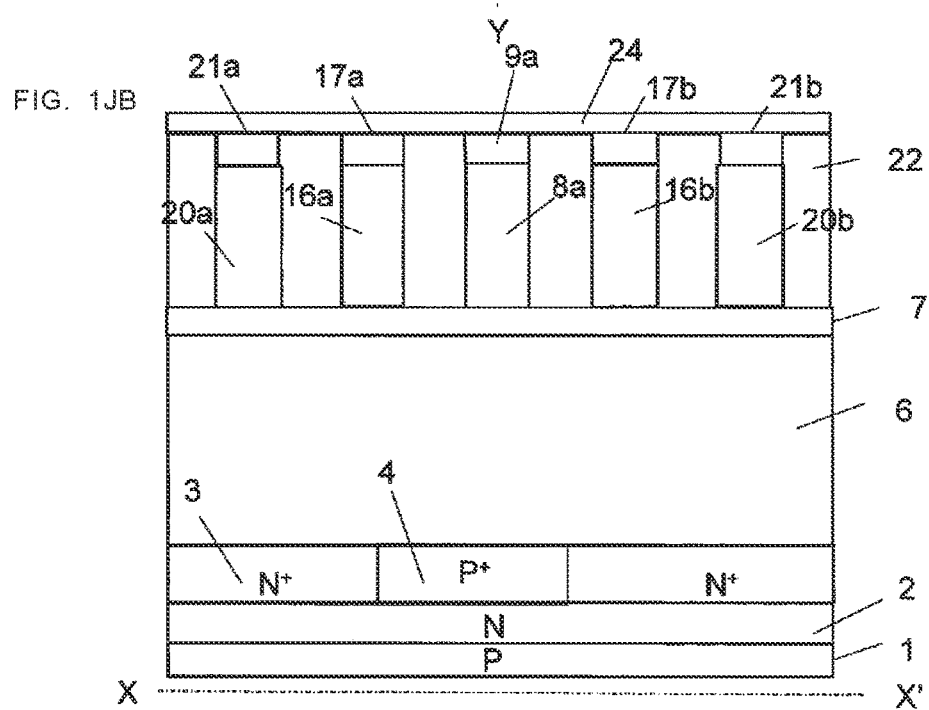
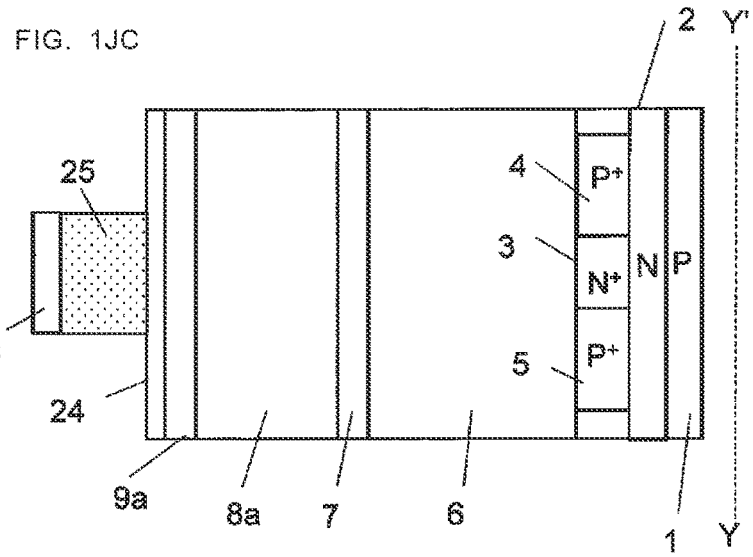

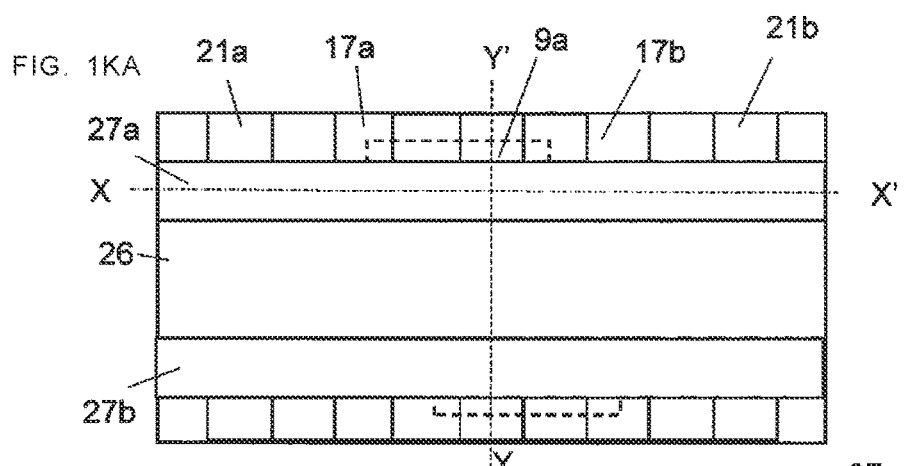
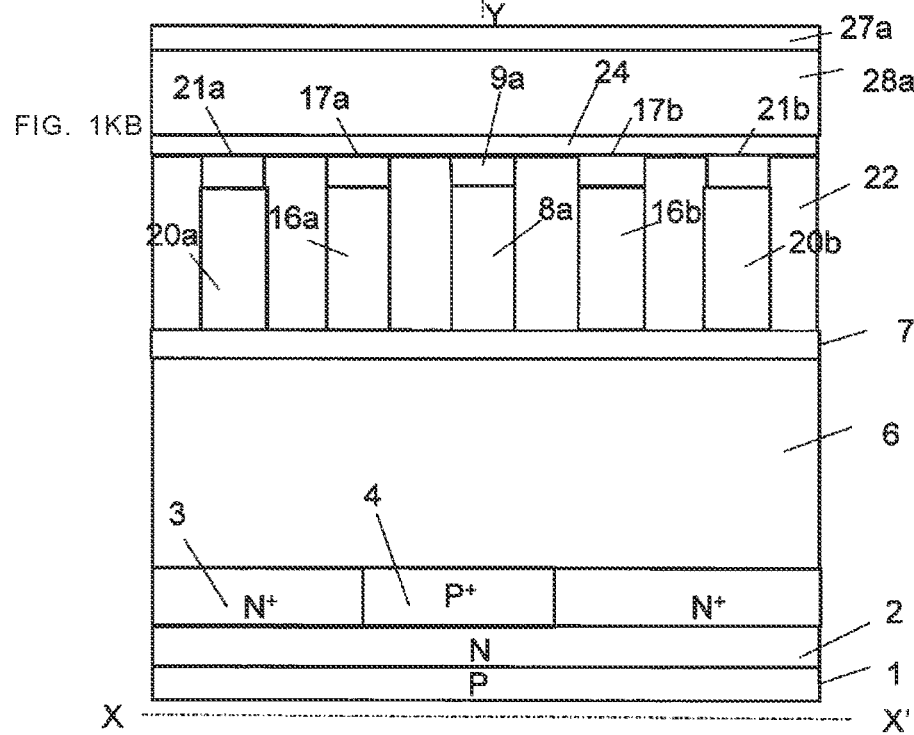
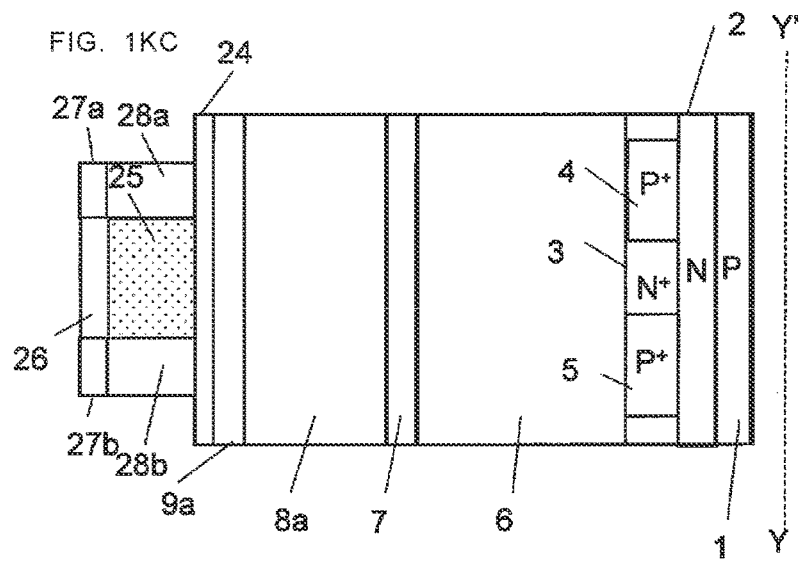

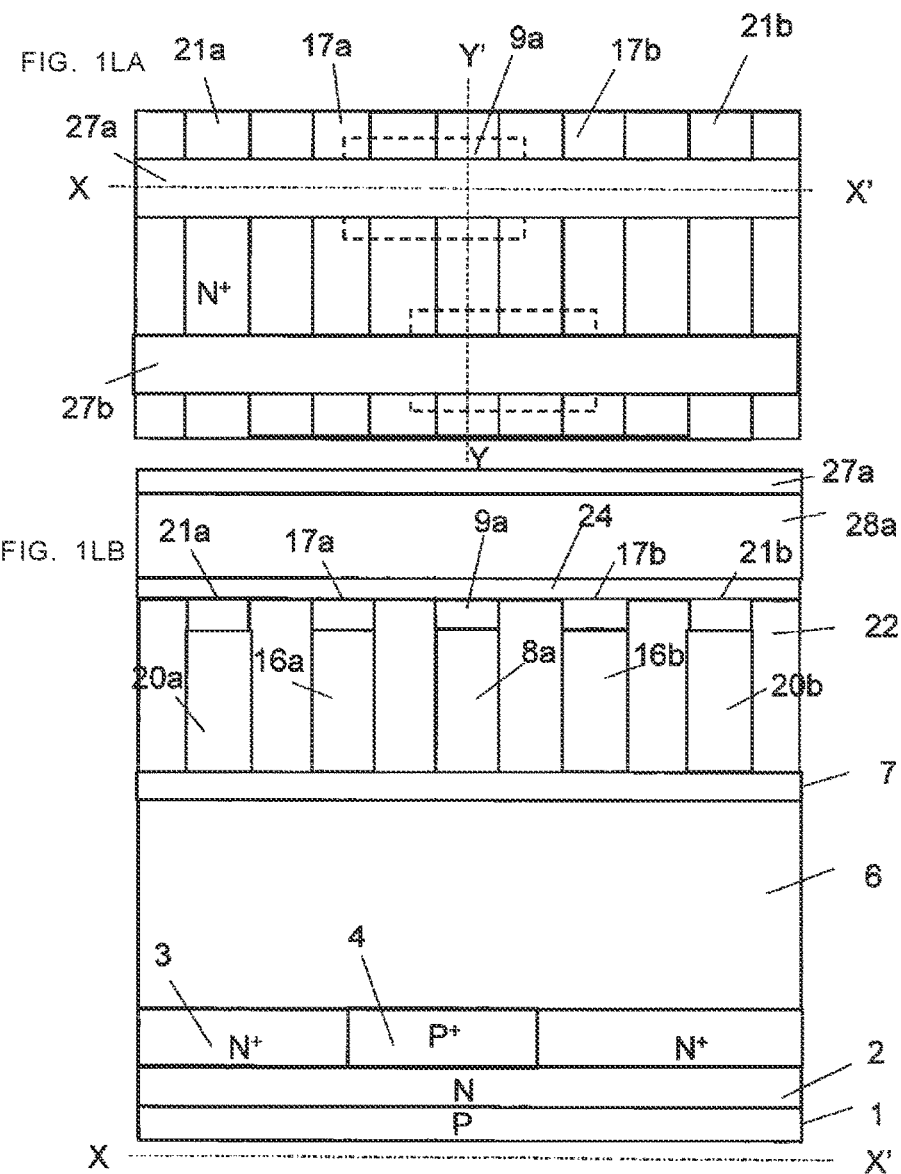
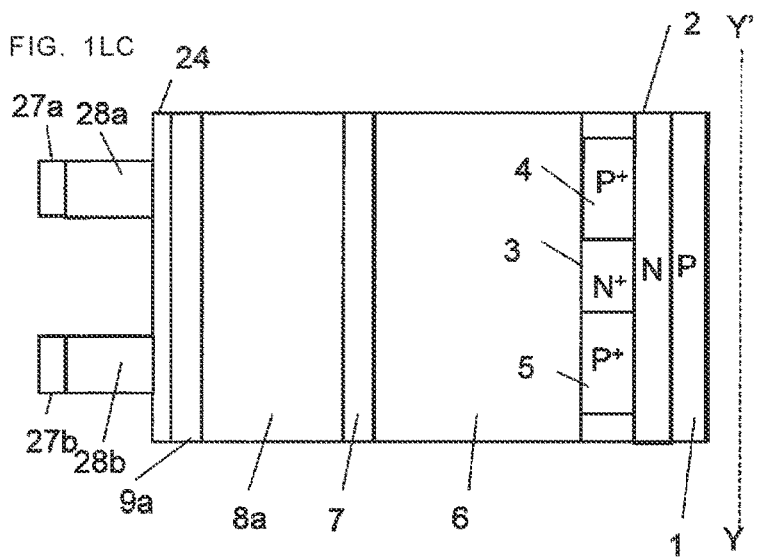

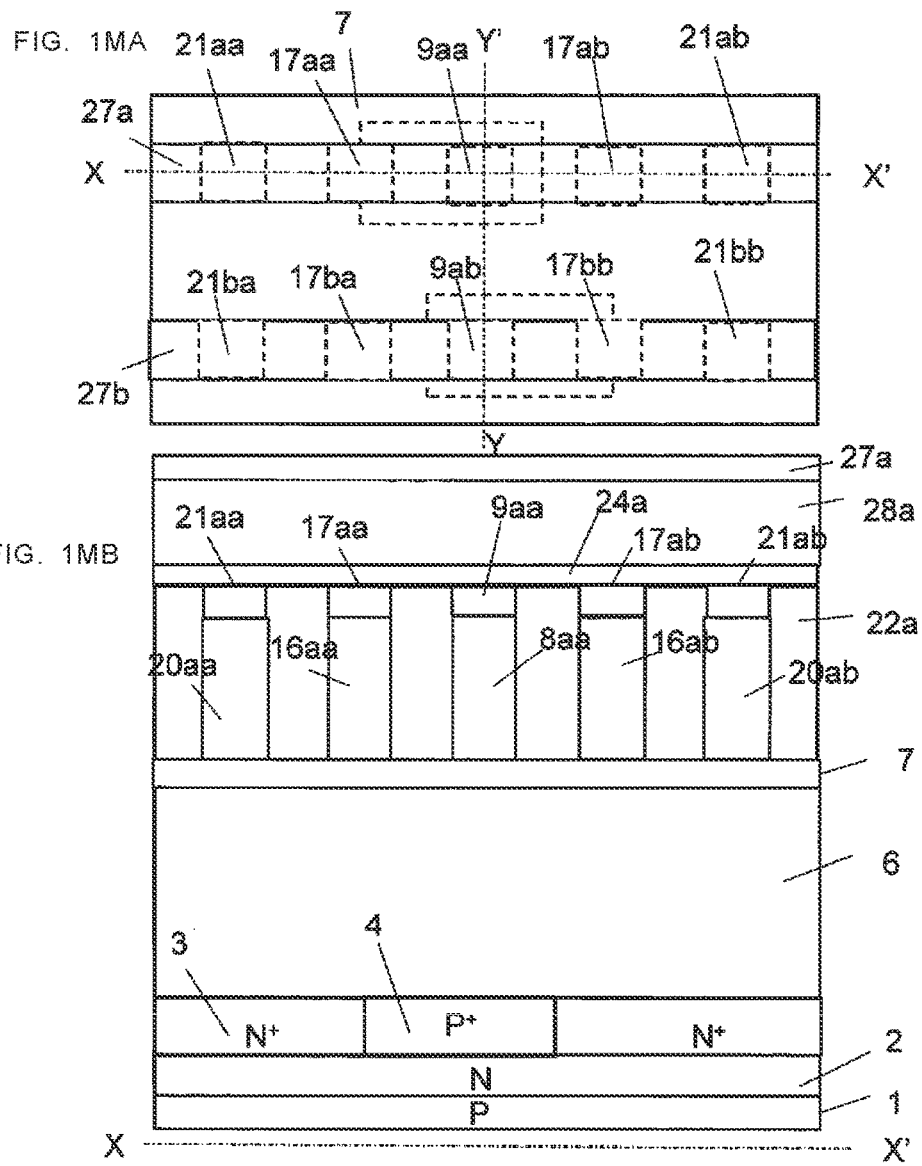
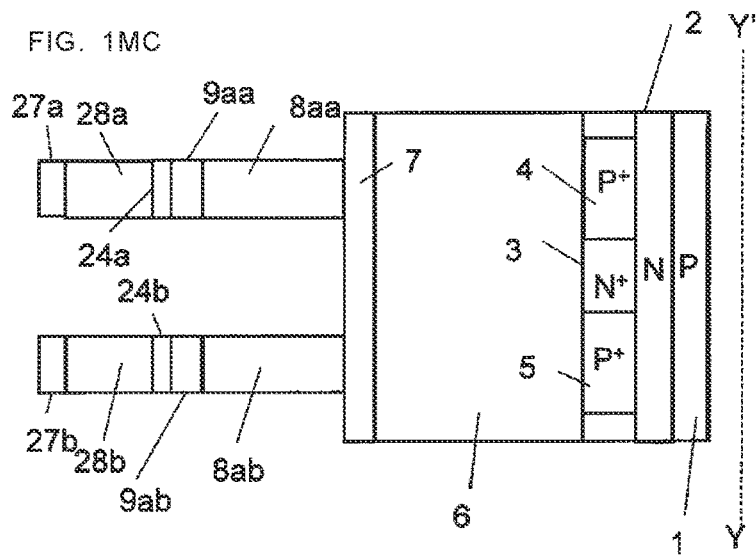

PILLAR-SHAPED SEMICONDUCTOR DEVICE AND METHOD FOR PRODUCING THE SAME

RELATED APPLICATIONS

The present application is a continuation application of PCT/JP2019/042593, filed Oct. 30, 2019, the entire content of which is incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In recent years, three-dimensional-structure transistors have been used for large scale integration (LSI). In such three-dimensional-structure transistors, surrounding gate transistors (SGTs), which are pillar-shaped semiconductor devices, have received attention as semiconductor elements that provide highly integrated semiconductor devices. A further increase in the degree of integration and a further improvement in the performance of semiconductor devices including SGTs have been demanded.

Typical planar metal oxide semiconductor (MOS) transistors have a channel that extends in the horizontal direction along an upper surface of a semiconductor substrate. In contrast, SGTs have a channel that extends in a direction perpendicular to an upper surface of a semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 5 is a structural schematic view of an N-channel SGT. A Si pillar 215 of P type or i type (intrinsic) (hereafter, silicon semiconductor pillars are referred to as "Si pillars") has, in its upper and lower portions, $N^+$ regions 216a and 216b. When one of the $N^+$ regions 216a and 216b functions as a source, the other functions as a drain. A region of the Si pillar 215 between the $N^+$ regions 216a and 216b functioning as a source and a drain, serves as a channel region 217. A gate insulating layer 218 is formed so as to surround the channel region 217. A gate conductor layer 219 is formed so as to surround the gate insulating layer 218. In the SGT, the $N^+$ regions 216a and 216b functioning as a source and a drain, the channel region 217, the gate insulating layer 218, and the gate conductor layer 219 are formed in the one Si pillar 215. Thus, the area occupied by the surface of the SGT apparently corresponds to an area occupied by an $N^+$ region functioning as one source or drain of a planar MOS transistor. Therefore, a further reduction in the size of the chip can be achieved in SGT-including circuit chips compared with circuit chips including a planar MOS transistor.

FIG. 6 illustrates a sectional view of a complementary metal-oxide semiconductor (CMOS) inverter circuit using a SGT (see, for example, the specification of U.S. Patent Application Publication No. 2010/0219483).

In this CMOS inverter circuit, an i layer 121 ("i layer" indicates an intrinsic Si layer) is formed on an insulating-layer substrate 120. A Si pillar SP1 for a P-channel SGT and a Si pillar SP2 for an N-channel SGT are formed on the i layer 121. A $P^+$ region 122 functioning as a drain of the P-channel SGT is formed in the same layer as the i layer 121 so as to surround a lower portion of the Si pillar SP1 in plan view. A $N^+$ region 123 functioning as a drain of the N-channel SGT is formed in the same layer as the i layer 121 so as to surround a lower portion of the Si pillar SP2 in plan view. A $P^+$ region 124 functioning as a source of the P-channel SGT is formed at a top portion of the Si pillar SP1. A $N^+$ region 125 functioning as a source of the N-channel SGT is formed at a top portion of the Si pillar SP2. Gate insulating layers 126a and 126b are formed so as to surround the Si pillars SP1 and SP2 and extend on upper surfaces of the $P^+$ region 122 and the $N^+$ region 123. A gate conductor layer 127a of the P-channel SGT and a gate conductor layer 127b of the N-channel SGT are formed so as to surround the gate insulating layers 126a and 126b. Sidewall nitride films 128a and 128b serving as insulating layers are formed so as to surround these gate conductor layers 127a and 127b. Similarly, sidewall nitride films 128c and 128d serving as insulating layers are formed so as to respectively surround the $P^+$ region and the $N^+$ region at the top portions of the Si pillars SP1 and SP2. The $P^+$ region 122 functioning as a drain of the P-channel SGT and the $N^+$ region 123 functioning as a drain of the N-channel SGT are connected through a silicide layer 129b. A silicide layer 129a is formed on the $P^+$ region 124 functioning as a source of the P-channel SGT. A silicide layer 129c is formed on the $N^+$ region 125 functioning as a source of the N-channel SGT. Further, silicide layers 129d and 129e are formed at top portions of the gate conductor layers 127a and 127b. An i layer 130a of the Si pillar SP1 between the $P^+$ regions 122 and 124 functions as a channel of the P-channel SGT. An i layer 130b of the Si pillar SP2 between the $N^+$ regions 123 and 125 functions as a channel of the N-channel SGT. A $SiO_2$ layer 131 is formed so as to cover the insulating-layer substrate 120, the i layer 121, and the Si pillars SP1 and SP2. A power supply wiring metal layer Vd is connected to the $P^+$ region 124 and the silicide layer 129a through a contact hole 132a. An output wiring metal layer Vo is connected to the $P^+$ region 122, the $N^+$ region 123, and the silicide layer 129b through a contact hole 132b. Further, a ground wiring metal layer Vs is connected to the $N^+$ region 125 and the silicide layer 129c through a contact hole 132c. The gate conductor layer 127a of the P-channel SGT and the gate conductor layer 127b of the N-channel SGT are connected to an input wiring metal layer (not illustrated) while being connected to each other. Thus, a CMOS inverter circuit using SGTs is formed.

The CMOS inverter circuit including the SGTs illustrated in FIG. 6 is also demanded for further increases in the density and performance of the circuit. This circuit has the following problems with regard to further increases in the density and performance of the circuit. The contact hole 132b is formed between the Si pillar SP1 and the Si pillar SP2. The Si pillars SP1 and SP2 and the contact hole 132b are formed by separate lithography and etching steps. Thus, the position of the contact hole 132b is close to one of the Si pillars SP1 and SP2 due to mask misalignment in the lithography step. If the mask misalignment causes a large displacement to one side, an electrical short-circuit failure occurs between one of the gate conductor layers 127a and 127b and the output wiring metal layer Vo. Thus, it is necessary to increase the distances between the Si pillars SP1 and SP2 and the contact hole 132b so as not to cause the electrical short circuit. This is an impediment to a further increase in the density of the circuit.

An increase in the degree of integration of circuits using SGTs is demanded.

SUMMARY OF THE INVENTION

It is demanded to realize an increase in the density of a pillar-shaped semiconductor device.

A SGT pillar-shaped semiconductor device according to an aspect of the present invention includes: a first semiconductor pillar and a second semiconductor pillar standing in a vertical direction on a substrate; a first impurity layer that is connected to a bottom portion of the first semiconductor pillar and/or to a side surface of the bottom portion and that serves as a drain or a source, and a second impurity layer that is connected to a bottom portion of the second semiconductor pillar and/or to a side surface of the bottom portion and that serves as a source or a drain; a third impurity layer that is provided inside an upper portion of the first semiconductor pillar and/or provided to surround the upper portion and that serves as a drain or a source, and a fourth impurity layer that is provided inside an upper portion of the second semiconductor pillar and/or provided to surround the upper portion and that serves as a source or a drain; a first gate insulating layer surrounding the first semiconductor pillar and the second semiconductor pillar; a first gate conductor layer surrounding the first gate insulating layer on an outer periphery of the first semiconductor pillar, and a second gate conductor layer surrounding the first gate insulating layer on an outer periphery of the second semiconductor pillar; and a first contact pillar located between the first impurity layer and the second impurity layer in plan view, standing in the vertical direction, and including a conductor layer at least in a central portion of the first contact pillar, wherein the first gate insulating layer extends to and connects to the first contact pillar and surrounds a side surface of the first contact pillar.

Preferably, a position of a bottom portion of the first contact pillar in the vertical direction is lower than positions of the bottom portions of the first semiconductor pillar and the second semiconductor pillar.

Preferably, two parallel virtual tangent lines in contact with the first semiconductor pillar and the second semiconductor pillar are also in contact with the first contact pillar in plan view.

Preferably, the first gate insulating layer is made of different materials at an outer peripheral portion of the first semiconductor pillar and an outer peripheral portion of the second semiconductor pillar, and the first gate insulating layer of one of the first semiconductor pillar and the second semiconductor pillar is connected to an outer peripheral portion of the first contact pillar.

A first material layer constituted by one layer or a plurality of layers of a metal, alloy, or insulating layer may be provided on an outer peripheral portion of the contact pillar in plan view.

Further, a midpoint of the first contact pillar may be located on a first line connecting a midpoint of the first semiconductor pillar and a midpoint of the second semiconductor pillar in plan view, the SGT pillar-shaped semiconductor device may include a third semiconductor pillar being adjacent to the second semiconductor pillar on a side opposite to the first contact pillar and having a midpoint on the first line, the first gate insulating layer may extend from the second semiconductor pillar and surround a side surface of the third semiconductor pillar, the second gate conductor layer may extend from the second semiconductor pillar and surround a side surface of an outer peripheral portion of the third semiconductor pillar, and the second gate conductor layer may be in contact with an entire side surface of the first gate insulating layer of the second semiconductor pillar and the third semiconductor pillar.

Further, the SGT pillar-shaped semiconductor device may include a fourth semiconductor pillar being adjacent to the third semiconductor pillar on a side opposite to the second semiconductor pillar and having a midpoint on the first line, the first gate insulating layer may extend from the second semiconductor pillar and the third semiconductor pillar and surround a side surface of the fourth semiconductor pillar, the second gate conductor layer may extend from the second semiconductor pillar and the third semiconductor pillar and surround a side surface of an outer peripheral portion of the fourth semiconductor pillar, and the second gate conductor layer may be in contact with an entire side surface of the first gate insulating layer of the second semiconductor pillar, the third semiconductor pillar, and the fourth semiconductor pillar.

The first semiconductor pillar may include a selection SGT, the second semiconductor pillar may include a load SGT, the third semiconductor pillar may include a drive SGT, and the first semiconductor pillar, the second semiconductor pillar, and the third semiconductor pillar may constitute a SRAM cell.

The first semiconductor pillar may include a selection SGT, the second semiconductor pillar may include a load SGT, the third semiconductor pillar may include a drive SGT, the fourth semiconductor pillar may include a drive SGT, and the first semiconductor pillar, the second semiconductor pillar, the third semiconductor pillar, and the fourth semiconductor pillar may constitute a SRAM cell.

Further, the first semiconductor pillar, the second semiconductor pillar, and the first contact pillar may have rectangular shapes extending in one direction in plan view, and may be arranged in parallel to each other in plan view.

A method for producing a SGT pillar-shaped semiconductor device according to another aspect of the present invention includes: a step of forming a first semiconductor pillar, a fifth semiconductor pillar, and a second semiconductor pillar on a substrate such that midpoints of the first semiconductor pillar, the fifth semiconductor pillar, and the second semiconductor pillar are on a first line in plan view, a step of forming a first impurity layer that is connected to a bottom portion of the first semiconductor pillar and that serves as a source or a drain, and forming a second impurity layer that is connected to a bottom portion of the second semiconductor pillar and that serves as a drain or a source; a step of forming a first gate insulating layer that surrounds and is connected to the first semiconductor pillar, the fifth semiconductor pillar, and the second semiconductor pillar; a step of forming a first conductor layer that surrounds and is connected to the first semiconductor pillar, the fifth semiconductor pillar, and the second semiconductor pillar on an outer side of the first gate insulating layer; a step of etching the fifth semiconductor pillar to form a first hole; a step of forming a first contact pillar in the first hole, at least a central portion of the first contact pillar being a conductor; a step of etching the first conductor layer to remove the first conductor layer surrounding an outer peripheral portion of the first contact pillar and to form a first gate conductor layer constituted by the first conductor layer surrounding the first semiconductor pillar and a second gate conductor layer constituted by the first conductor layer surrounding the second semiconductor pillar; and a step of forming a first insulating layer on outer peripheral portions of the first gate conductor layer, the first gate insulating layer surrounding the first contact pillar, and the second gate conductor layer, wherein the first contact pillar is electrically connected to the first impurity layer and the second impurity layer, and the connection extends in a vertical direction.

Preferably, in the method, the first hole is formed such that a position of a bottom portion of the first hole is below positions of the bottom portions of the first semiconductor pillar and the second semiconductor pillar in the vertical direction.

Preferably, the method further includes: a step of forming a first material layer constituted by one layer or a plurality of layers of a metal, alloy, or insulating layer on a side surface of the hole after the first hole is formed; and a step of forming a second conductor layer on an inner side of the first material layer in plan view, wherein the first material layer and the second conductor layer are the first contact pillar.

Preferably, the method further includes: a step of forming the first semiconductor pillar, the fifth semiconductor pillar, and the second semiconductor pillar in rectangular shapes extending in a direction perpendicular to the first line in plan view.

The method may include: before the first semiconductor pillar, the fifth semiconductor pillar, and the second semiconductor pillar extending in the direction perpendicular to the first line are formed, a step of removing one of upper and lower partial regions in plan view of a first etching mask layer for forming the fifth semiconductor pillar, the first etching mask layer being included in an etching mask material layer for forming the first semiconductor pillar, the fifth semiconductor pillar, and the second semiconductor pillar.

The method may include: a step of forming a third semiconductor pillar being adjacent to the second semiconductor pillar on a side opposite to the first contact pillar and having a midpoint on a first line, the first line connecting the midpoint of the first semiconductor pillar and the midpoint of the fifth semiconductor pillar in plan view; a step of extending the first gate insulating layer from the second semiconductor pillar to surround a side surface of the third semiconductor pillar; and a step of forming the second gate conductor layer to be in contact with an entire side surface of the first gate insulating layer of the second semiconductor pillar and the third semiconductor pillar.

The method may include: a step of forming, on the first line, a fourth semiconductor pillar being adjacent to the third semiconductor pillar on a side opposite to the second semiconductor pillar; a step of extending the first gate insulating layer from the third semiconductor pillar to surround a side surface of the fourth semiconductor pillar; and a step of forming the second gate conductor layer to be in contact with an entire side surface of the first gate insulating layer of the second semiconductor pillar, the third semiconductor pillar, and the fourth semiconductor pillar.

The method may include: a step of forming a selection SGT at the first semiconductor pillar, forming a load SGT at the second semiconductor pillar and forming a drive SGT at the third semiconductor pillar, wherein the first semiconductor pillar, the second semiconductor pillar, and the third semiconductor pillar constitute a portion of a SRAM cell.

Further, the method may include: a step of forming a selection SGT at the first semiconductor pillar, forming a load SGT at the second semiconductor pillar, forming a drive SGT at the third semiconductor pillar, and forming a drive SGT at the fourth semiconductor pillar, wherein the first semiconductor pillar, the second semiconductor pillar, the third semiconductor pillar, and the fourth semiconductor pillar constitute a portion of a SRAM cell.

According to the present invention, a high-density pillar-shaped semiconductor device is realized.

DETAILED DESCRIPTION OF THE PREFERRED EMBODIMENTS

Hereinafter, methods for producing pillar-shaped semiconductor devices according to embodiments of the present invention will be described with reference to the drawings.

First Embodiment

Hereinafter, a method for producing a pillar-shaped semiconductor device including a SGT according to a first embodiment of the present invention will be described with reference to FIGS. 1AA to 1ZD. In the respective drawings, figures suffixed with A are plan views, figures suffixed with B are sectional structural views taken along lines X-X' in the corresponding figures suffixed with A, figures suffixed with C are sectional structural views taken along lines Y-Y' in the corresponding figures suffixed with A, and figures suffixed with D are sectional structural views taken along lines Y1-Y1' in the corresponding figures suffixed with A.

Figure 1A:
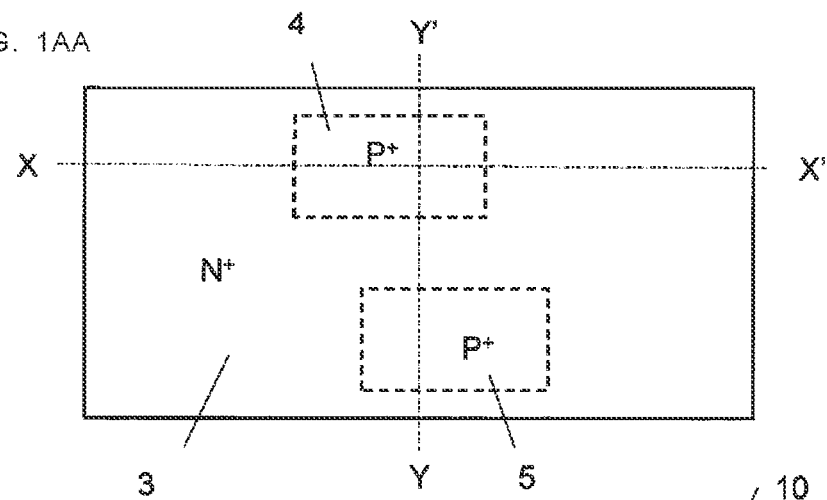
FIGS. 1AA, 1AB, and 1AC are a plan view and sectional structural views for describing a method for producing a pillar-shaped semiconductor device including a SGT according to a first embodiment.
Figure 1A:
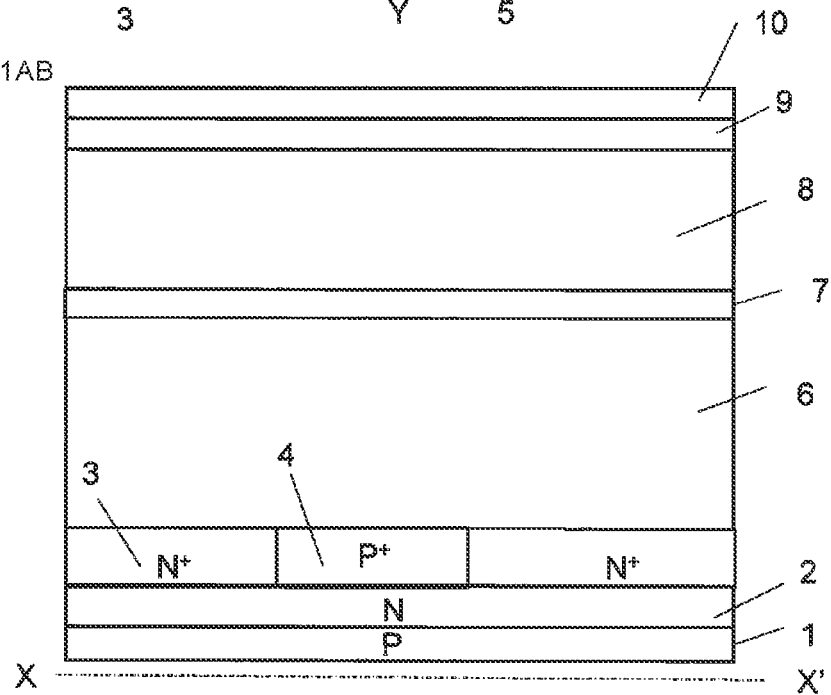
Figure 1A:
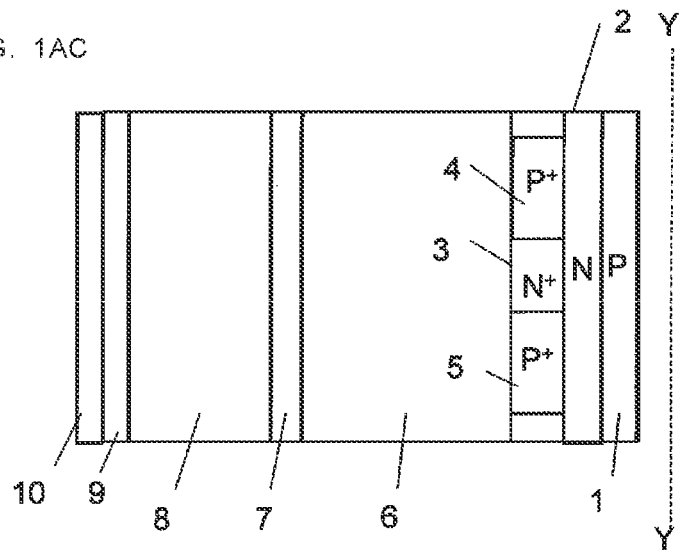

As illustrated in FIGS. 1AA to 1AC, an N-type semiconductor layer (hereinafter also referred to as "N layer") 2 is formed on a P-type semiconductor layer (hereinafter also referred to as "P layer") substrate 1 by epitaxial growth. Then, an $N^+$ layer 3 and $P^+$ layers 4 and 5 are formed in a top layer of the N layer 2 by ion implantation. Then, an i layer (intrinsic Si layer) 6 is formed. The i layer 6 may be formed of N-type or P-type Si containing a donor or acceptor impurity in a small amount. Then, a mask material layer 7 in which, for example, a $SiO_2$ layer, an aluminum oxide ($Al_2O_3$, hereinafter referred to as AlO) layer, and a $SiO_2$ layer are stacked is formed. Then, a silicon nitride (SiN) layer 8 is deposited. Then, a mask material layer 9 made of a $SiO_2$ layer is deposited. Then, an upper mask material layer 10 made of a SiN layer is deposited. Note that a semiconductor material other than silicon (Si) may be used for the portion that is the silicon (Si) layer in the present embodiment. The same applies to the other embodiments.

Figure 1B:
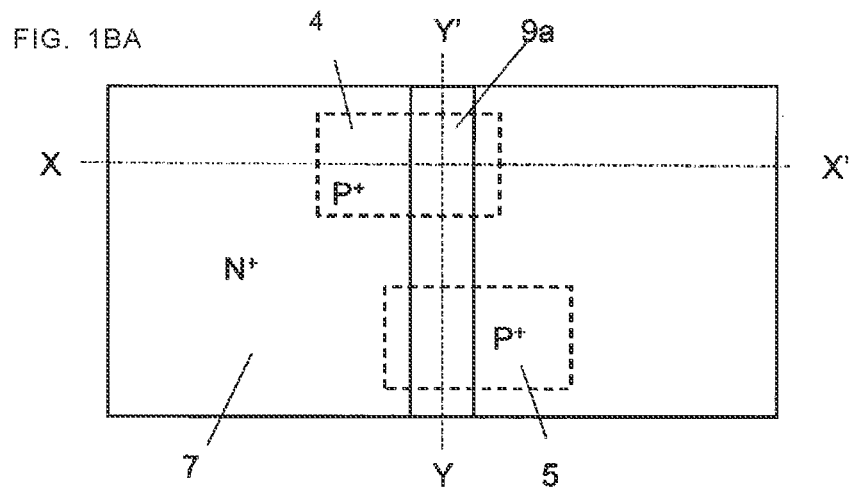
FIGS. 1BA, 1BB, and 1BC are a plan view and sectional structural views for describing the method for producing the pillar-shaped semiconductor device including the SGT according to the first embodiment.
Figure 1B:
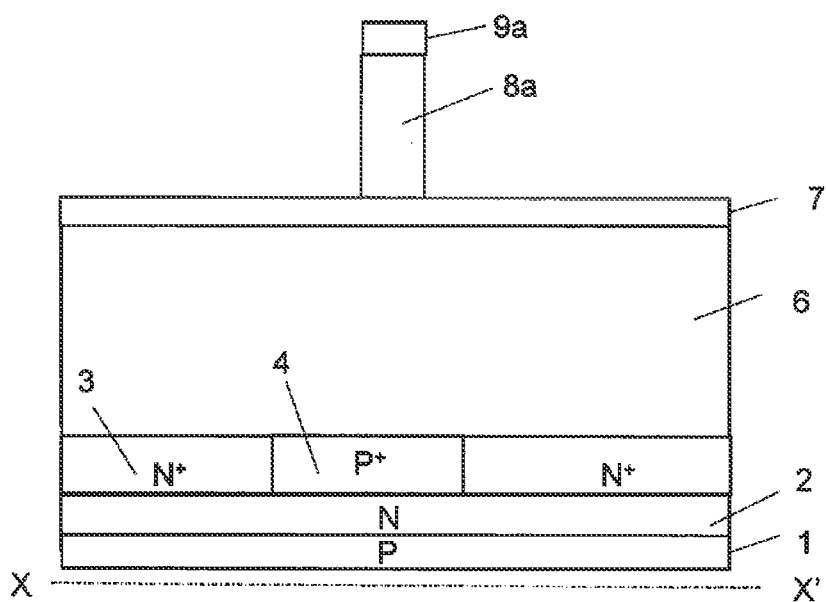
Figure 1B:
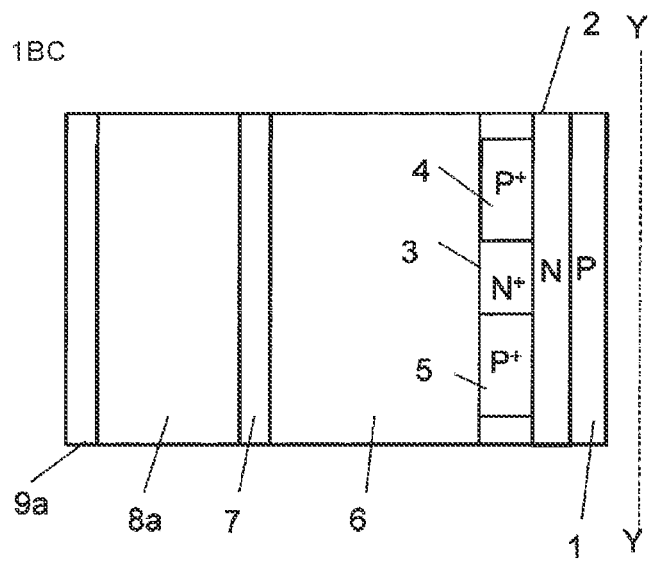

Next, the upper mask material layer 10 is etched using a band-shaped resist layer (not illustrated) formed by lithography and extending in a Y direction in plan view as a mask. Thus, an upper band-shaped mask material layer (not illustrated) extending in the Y direction in plan view is formed. The upper band-shaped mask material layer is isotropically etched such that the width of the upper band-shaped mask material layer is smaller than the width of the resist layer. Thus, it is possible to form the upper band-shaped mask material layer having the width smaller than the width of the smallest resist layer that can be formed by lithography. Then, as illustrated in FIGS. 1BA to 1BC, the mask material layer 9 and the SiN layer 8 are etched by, for example, reactive ion etching (RIE) using the upper band-shaped mask material layer as an etching mask to form a band-shaped mask material layer 9a and a band-shaped SiN layer 8a. The cross section of the upper band-shaped mask material layer formed by isotropic etching has a trapezoidal shape in which the width of a bottom portion is larger than the width of a top portion, whereas the cross section of the band-shaped mask material layer 9a has a rectangular shape because the band-shaped mask material layer 9a is etched by RIE. Then, the upper band-shaped mask material layer is removed. Alternatively, the upper band-shaped mask material layer may be left after the SiN layer 8 is etched.

Next, a SiGe layer (not illustrated) and a $SiO_2$ layer (not illustrated) are entirely formed by atomic layered deposition (ALD) to cover the mask material layer 7, the band-shaped SiN layer 8a, and the band-shaped mask material layer 9a. In this case, the cross section of the SiGe layer has a rounded portion at a top portion. The rounded portion is desirably formed so as to be above the band-shaped mask material layer 9a.

Figure 1C:
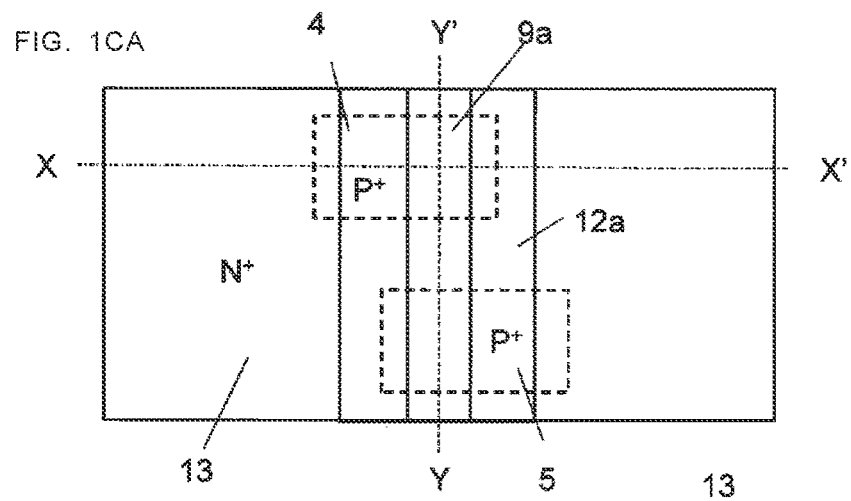
FIGS. 1CA, 1CB, and 1CC are a plan view and sectional structural views for describing the method for producing the pillar-shaped semiconductor device including the SGT according to the first embodiment.
Figure 1C:
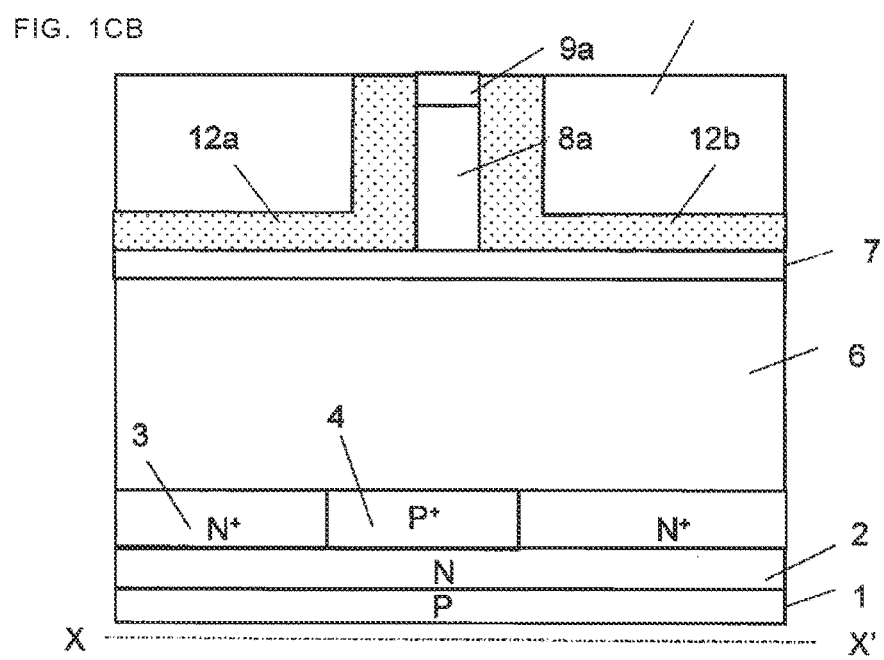
Figure 1C:
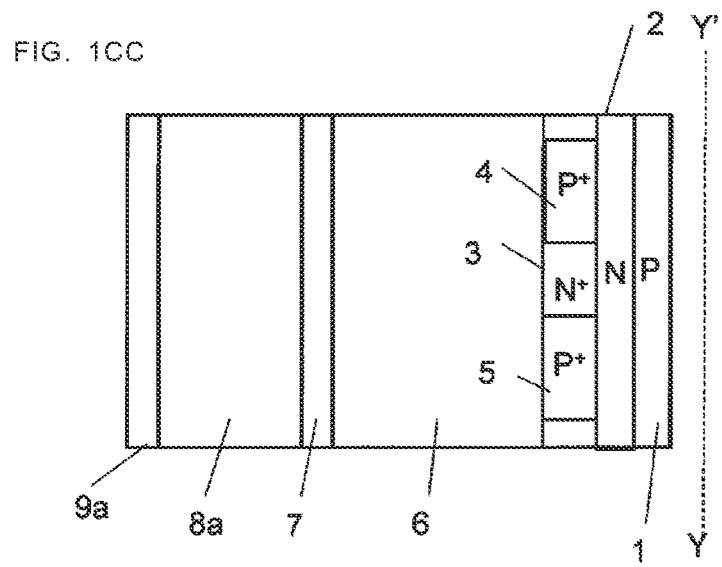

Next, the whole is covered with a $SiO_2$ layer (not illustrated) by, for example, flow chemical vapor deposition (flow CVD). Then, as illustrated in FIGS. 1CA to 1CC, the $SiO_2$ layer is polished such that the position of an upper surface thereof meets the position of an upper surface of the band-shaped mask material layer 9a by chemical mechanical polishing (CMP) to form a $SiO_2$ layer 13 and SiGe layers 12a and 12b. In this case, side surfaces of top portions of the SiGe layers 12a and 12b are desirably vertical. For this purpose, it is desirable to polish the $SiO_2$ layer covering the whole and the SiGe layer so as not to produce rounded portions at the top portions of the SiGe layers 12a and 12b.

Figure 1D:
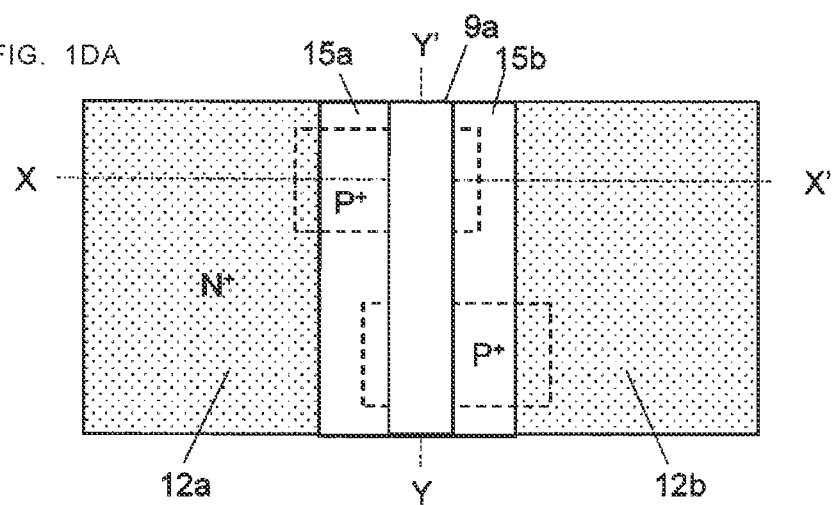
FIGS. 1DA, 1DB, and 1DC are a plan view and sectional structural views for describing the method for producing the pillar-shaped semiconductor device including the SGT according to the first embodiment.
Figure 1D:
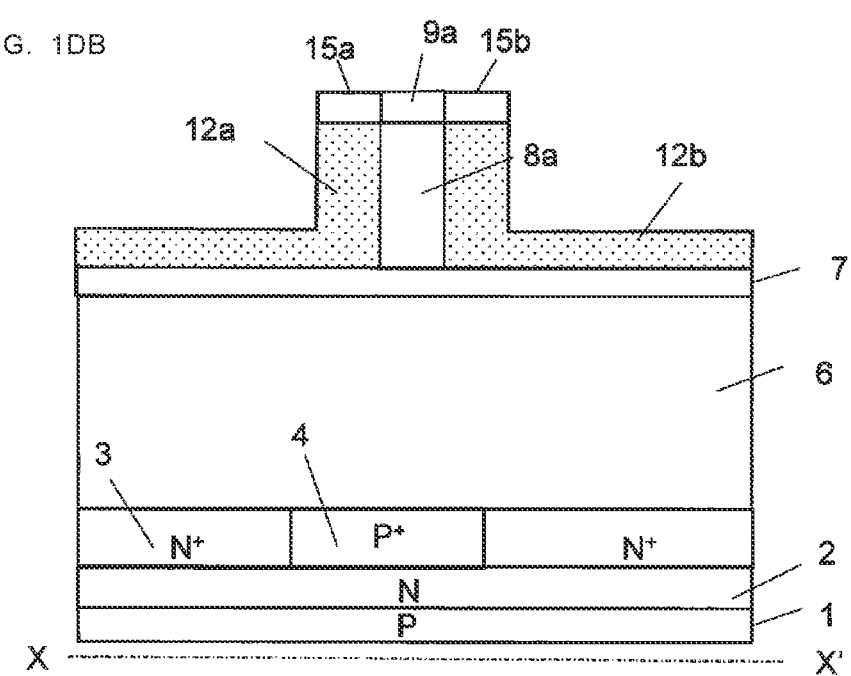
Figure 1D:
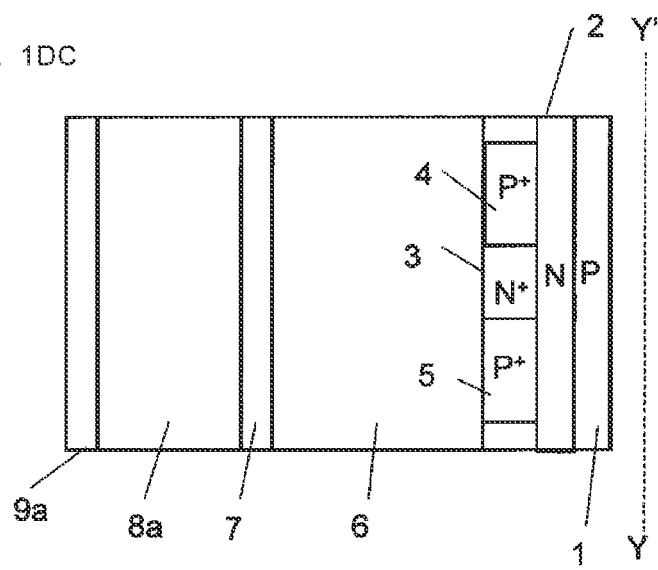

Next, the top portions of the SiGe layers 12a and 12b are etched to form recessed portions (not illustrated) using the $SiO_2$ layer 13 and the band-shaped mask material layer 9a as masks. This etching is performed such that the positions of bottom portions of the recessed portions are at the position of a lower portion of the mask material layer 9a. Next, a SiN layer (not illustrated) is entirely applied. Then, the SiN layer is entirely polished by CMP such that the position of an upper surface thereof meets the position of an upper surface of the mask material layer 9a. Then, the $SiO_2$ layer 13 is removed. Thus, as illustrated in FIGS. 1DA to 1DC, SiN layers (band-shaped mask material layers) 15a and 15b having the same shapes as the shapes of top portions of the SiGe layers 12a and 12b in plan view are formed on both sides of the band-shaped mask material layer 9a.

Figure 1E:
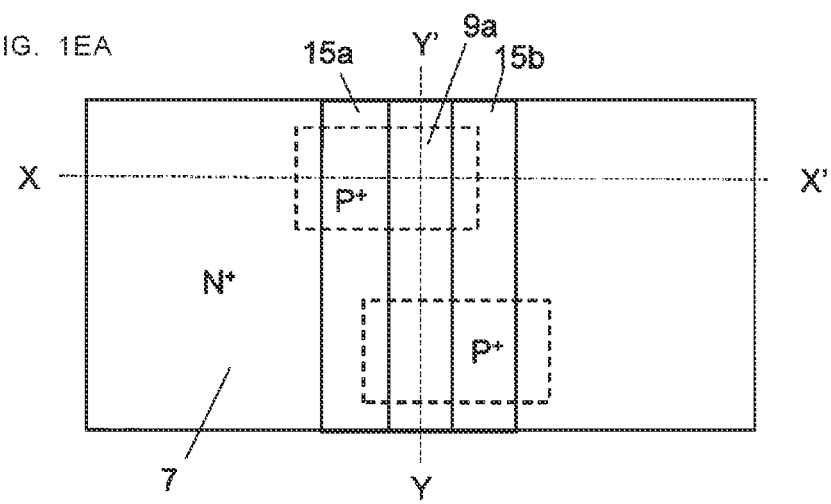
FIGS. 1EA, 1EB, and 1EC are a plan view and sectional structural views for describing the method for producing the pillar-shaped semiconductor device including the SGT according to the first embodiment.
Figure 1E:
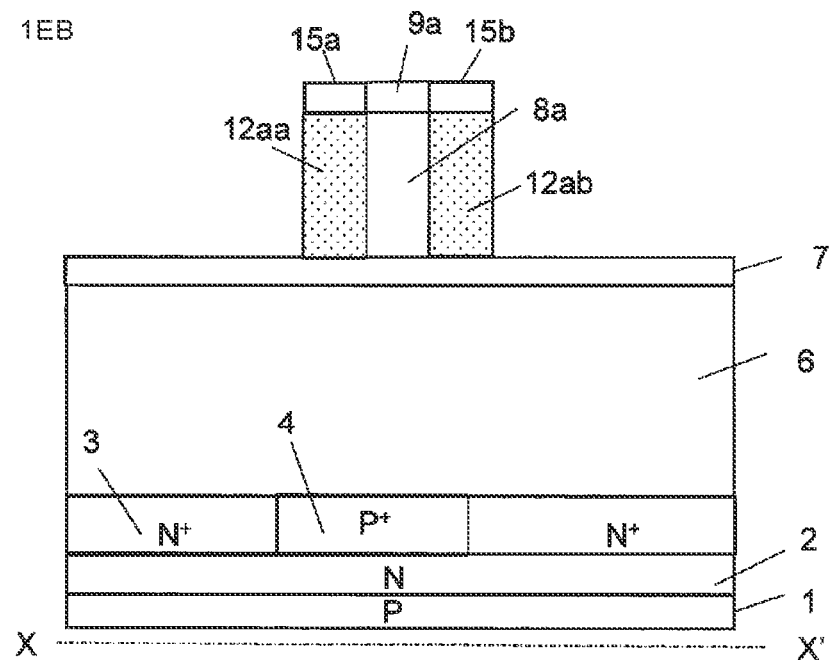
Figure 1E:
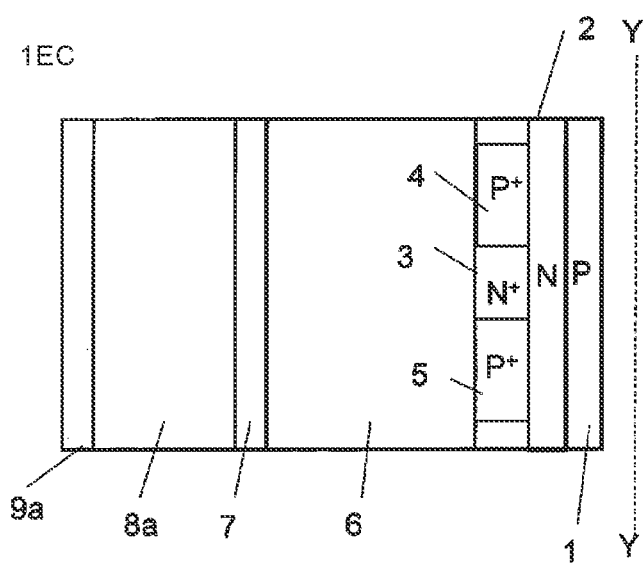

Next, as illustrated in FIGS. 1EA to 1EC, the SiGe layers 12a and 12b are etched using the band-shaped mask material layers 9a, 15a, and 15b as masks to form band-shaped SiGe layers 12aa and 12ab. In this case, the width of the band-shaped SiGe layer 12aa and the width of the band-shaped SiGe layer 12ab are the same in plan view.

Figure 1F:
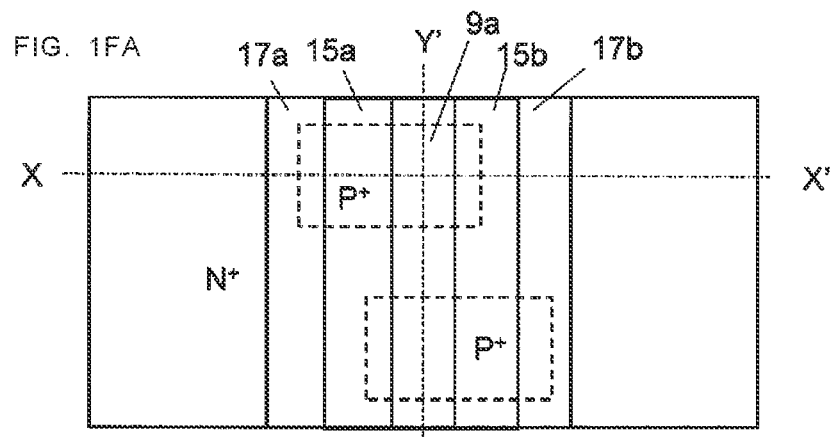
FIGS. 1FA, 1FB, and 1FC are a plan view and sectional structural views for describing the method for producing the pillar-shaped semiconductor device including the SGT according to the first embodiment.
Figure 1F:
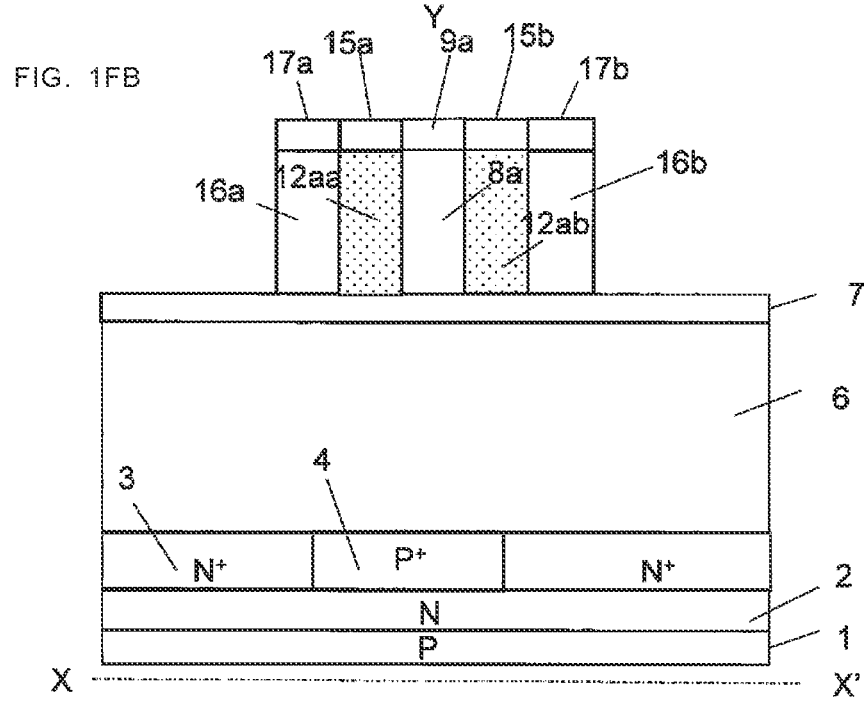
Figure 1F:
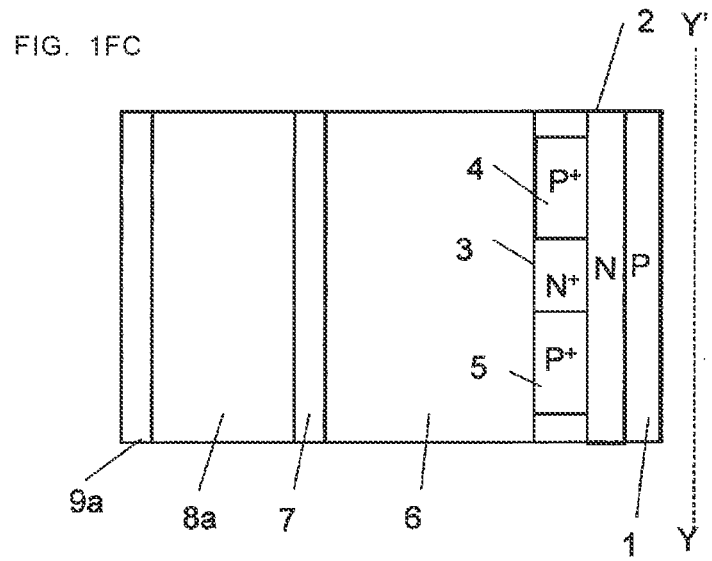

Then, by using a method similar to that used to form the band-shaped mask material layers 15a and 15b and the band-shaped SiGe layers 12aa and 12ab, as illustrated in FIGS. 1FA to 1FC, a band-shaped SiN layer 16a in contact with a left side surface (in FIG. 1FB, the same applies to the following description) of the band-shaped SiGe layer 12aa, a band-shaped SiN layer 16b in contact with a right side surface of the band-shaped SiGe layer 12ab, a band-shaped mask material layer 17a in contact with a left side surface of the band-shaped mask material layer 15a, and a band-shaped mask material layer 17b in contact with a right side surface of the band-shaped mask material layer 15b are formed.

Figure 1G:
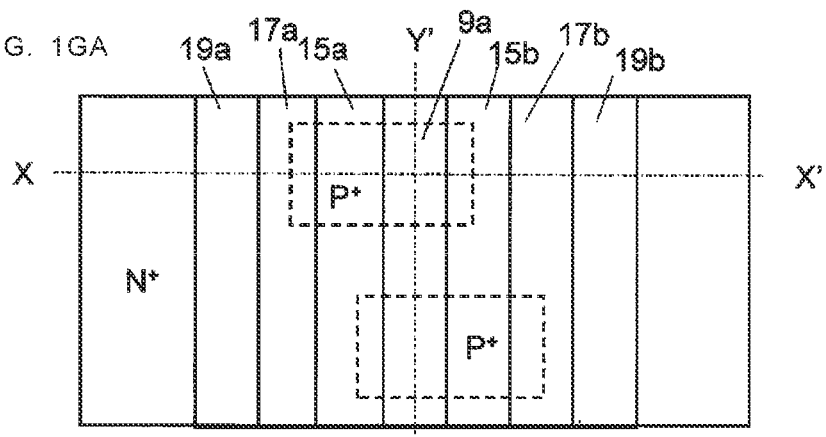
FIGS. 1GA, 1GB, and 1GC are a plan view and sectional structural views for describing the method for producing the pillar-shaped semiconductor device including the SGT according to the first embodiment.
Figure 1G:
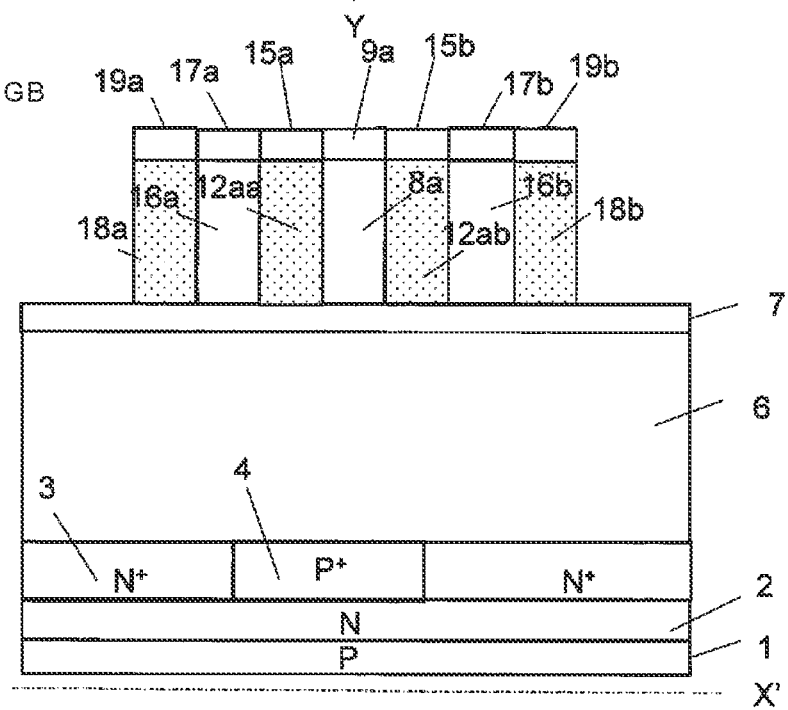
Figure 1G:
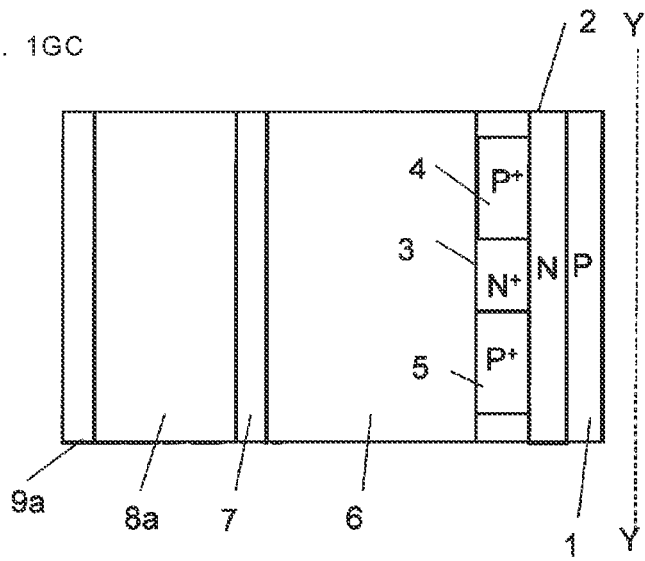

Then, by using a method similar to that used to form the band-shaped mask material layers 15a and 15b and the band-shaped SiGe layers 12aa and 12ab, as illustrated in FIGS. 1GA to 1GC, a band-shaped SiGe layer 18a in contact with a left side surface (in FIG. 1GB, the same applies to the following description) of the band-shaped SiN layer 16a, a band-shaped SiGe layer 18b in contact with a right side surface of the band-shaped SiN layer 16b, a band-shaped mask material layer 19a in contact with a left side surface of the band-shaped mask material layer 17a, and a band-shaped mask material layer 19b in contact with a right side surface of the band-shaped mask material layer 17b are formed.

Then, by using a method similar to that used to form the band-shaped mask material layers 17a and 17b and the band-shaped SiN layers 16a and 16b, as illustrated in FIGS. 1HA to 1HC, a band-shaped SiN layer 20a in contact with a left side surface (in FIG. 1HB, the same applies to the following description) of the band-shaped SiGe layer 18a, a band-shaped SiN layer 20b in contact with a right side surface of the band-shaped SiGe layer 18b, a band-shaped mask material layer 21a in contact with a left side surface of the band-shaped mask material layer 19a, and a band-shaped mask material layer 21b in contact with a right side surface of the band-shaped mask material layer 19b are formed.

Figure 1I:
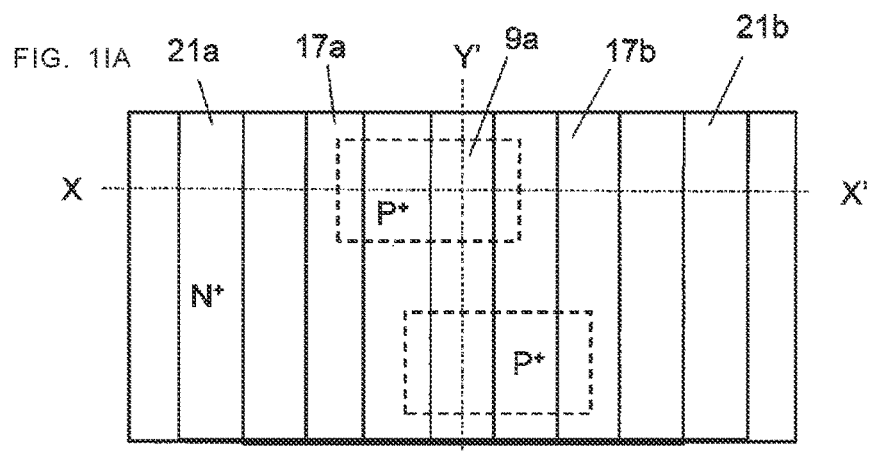
FIGS. 1IA, 1IB, and 1IC are a plan view and sectional structural views for describing the method for producing the pillar-shaped semiconductor device including the SGT according to the first embodiment.
Figure 1I:
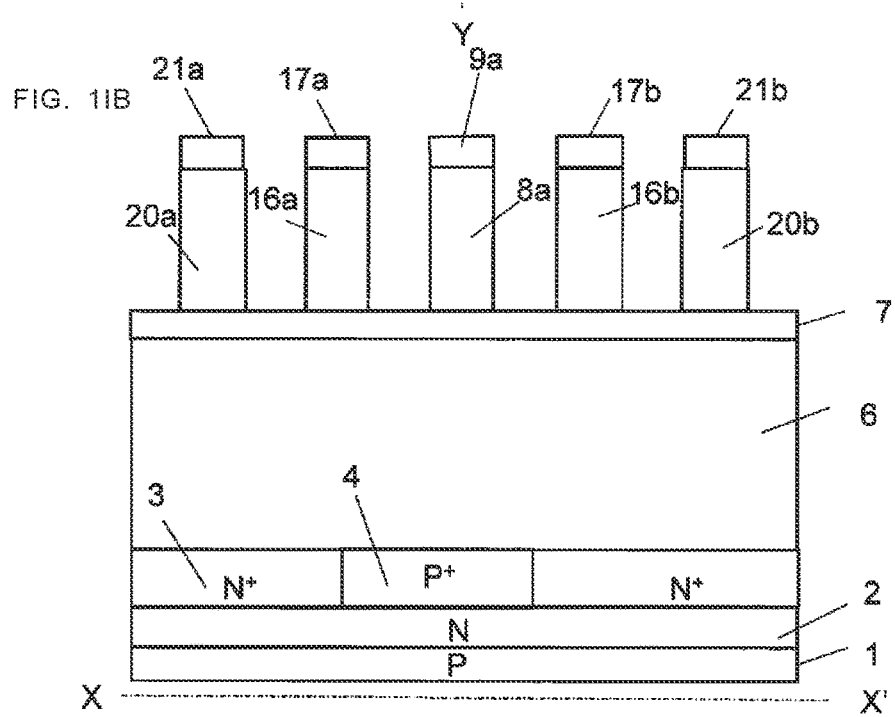
Figure 1I:
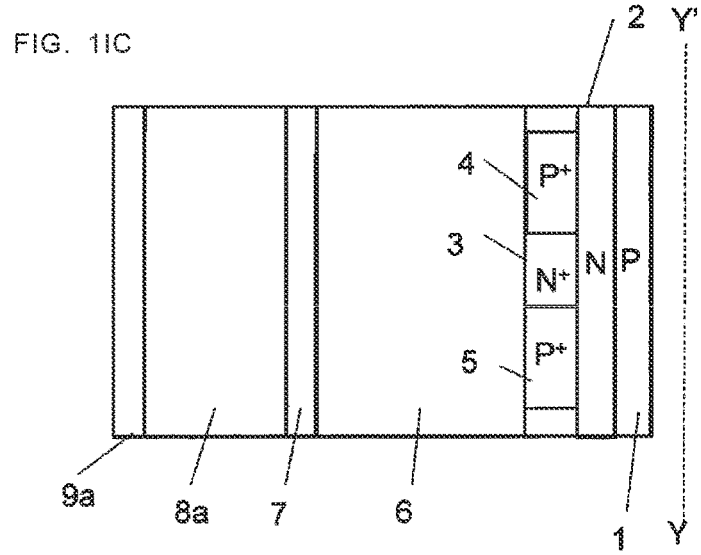

Next, the band-shaped mask material layers 15a, 15b, 19a, and 19b and the band-shaped SiGe layers 12aa, 12ab, 18a, and 18b are removed by etching. Thus, as illustrated in FIGS. 1IA to 1IC, the band-shaped SiN layers 8a, 16a, 16b, 20a, and 20b and the band-shaped mask material layers 9a, 17a, 17b, 21a, and 21b on the band-shaped SiN layers 8a, 16a, 16b, 20a, and 20b are formed on the mask material layer 7.

Next, a $SiO_2$ layer (not illustrated) is entirely applied. Then, as illustrated in FIGS. 1JA to 1JC, the $SiO_2$ layer is polished by CMP such that the position of an upper surface of the $SiO_2$ layer meets the position of the upper surface of the band-shaped mask material layer 9a to form a $SiO_2$ layer 22. Then, a SiN layer 24, a SiGe layer (not illustrated), and a mask material layer (not illustrated) are entirely formed. Then, a band-shaped mask material layer 26 extending in an X direction and a band-shaped SiGe layer 25 are formed by lithography and RIE etching.

Then, by using a method similar to that used to form the band-shaped mask material layers 15a and 15b and the band-shaped SiGe layers 12aa and 12ab, as illustrated in FIGS. 1KA to 1KC, band-shaped SiN layers 28a and 28b in contact with both side surfaces of the band-shaped SiGe layer 25, and band-shaped mask material layers 27a and 27b in contact with both side surfaces of the band-shaped mask material layer 26 are formed.

Next, as illustrated in FIGS. 1LA to 1LC, the band-shaped mask material layer 26 and the band-shaped SiGe layer 25 are removed to form the band-shaped SiN layers 28a and 28b extending in the X direction in plan view and the band-shaped mask material layers 27a and 27b on the band-shaped SiN layers 28a and 28b on the SiN layer 24.

Next, as illustrated in FIGS. 1MA to 1MC, the SiN layer 24, the band-shaped mask material layers 9a, 17a, 17b, 21a, and 21b, the band-shaped SiN layers 8a, 16a, 16b, 20a, and 20b, and the $SiO_2$ layer 22 are etched using the band-shaped mask material layers 27a and 27b and the band-shaped SiN layers 28a and 28b as masks. Thus, a band-shaped SiN layer 24a, mask material layers 21aa, 21ab, 17aa, 17ab, and 9aa having square shapes in plan view, and square SiN layers 20aa, 20ab, 16aa, 16ab, and Baa located under the square mask material layers 21aa, 21ab, 17aa, 17ab, and 9aa are formed under the band-shaped mask material layer 27a and the band-shaped SiN layer 28a. Similarly, a band-shaped SiN layer 24b, mask material layers 21ba, 21bb, 17ba, 17bb, and 9ab having square shapes in plan view, and square SiN layers 20ba (not illustrated), 20bb (not illustrated), 16ba (not illustrated), 16bb (not illustrated), and 8ab located under the square mask material layers 21ba, 21bb, 17ba, 17bb, and 9ab are formed under the band-shaped mask material layer 27b and the band-shaped SiN layer 28b. At the same time, a SiO₂ layer 22a is formed between the square mask material layers 21aa, 21ab, 17aa, 17ab, and 9aa and between the square SiN layers 20aa, 20ab, 16aa, 16ab, and 8aa, under the band-shaped SiN layer 24a. Similarly, a SiO₂ layer 22b (not illustrated) is formed between the square mask material layers 21ba, 21bb, 17ba, 17bb, and 9ab and between the square SiN layers 20ba, 20bb, 16ba, 16bb, and 8ab, under the band-shaped SiN layer 24b.

Figure 1N:
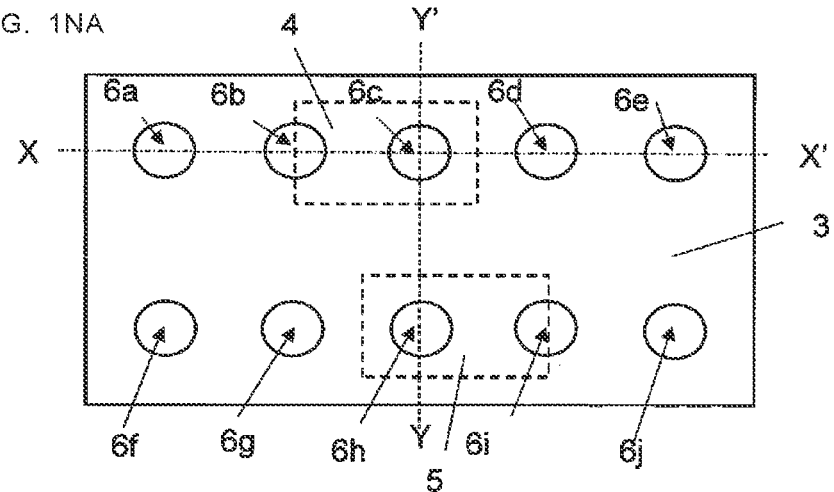
FIGS. 1NA, 1NB, and 1NC are a plan view and sectional structural views for describing the method for producing the pillar-shaped semiconductor device including the SGT according to the first embodiment.
Figure 1N:
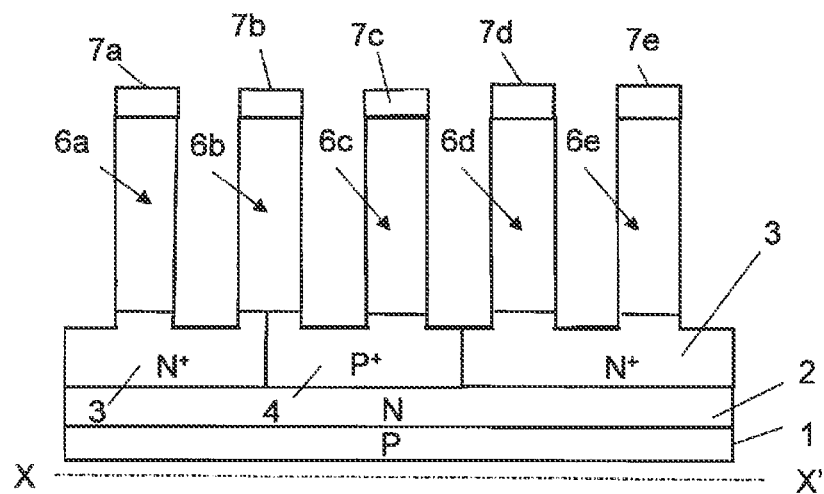
Figure 1N:
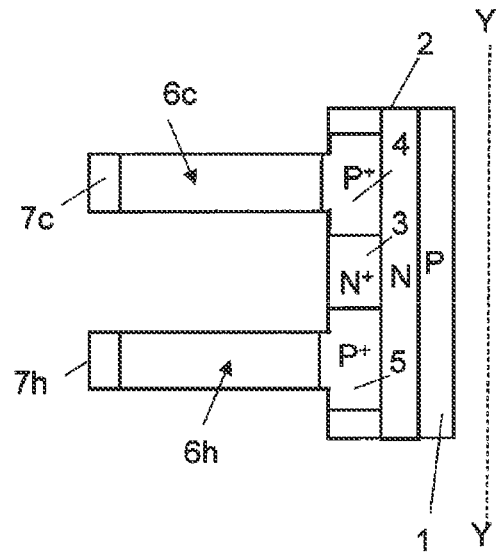
Figure 10A:
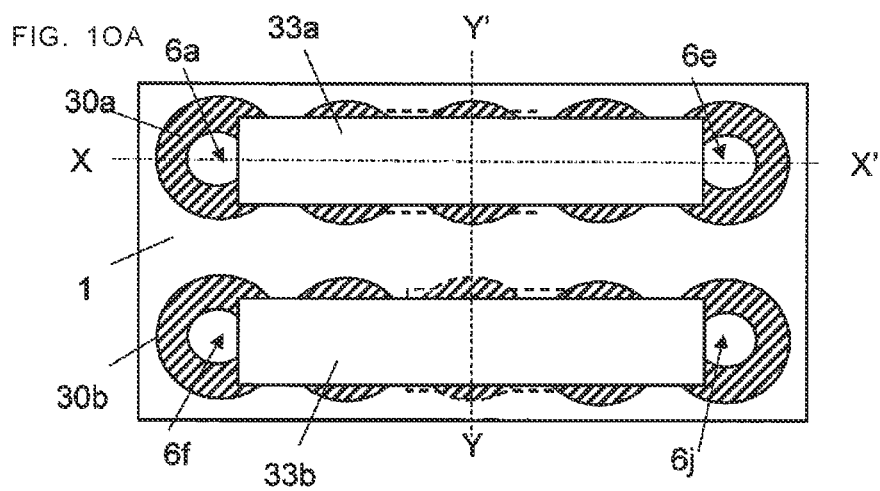
Figure 10B:
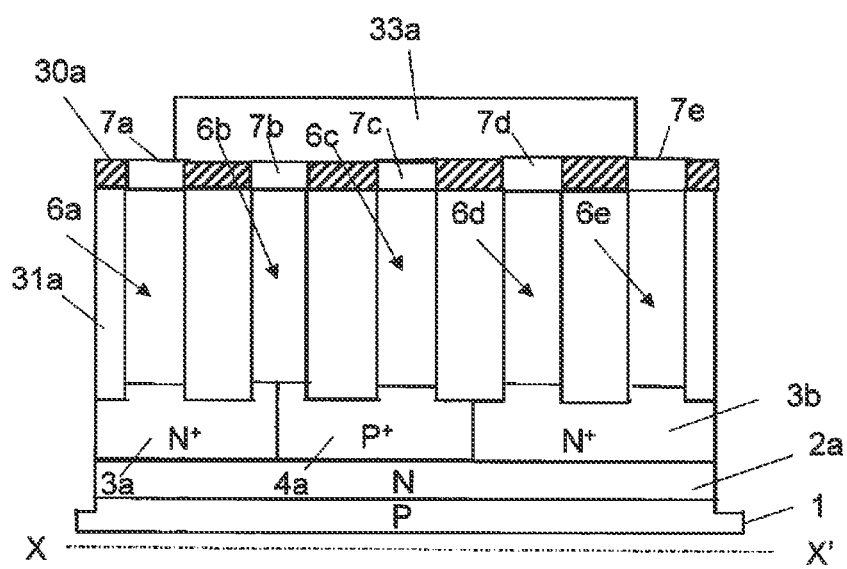
Figure 10C:
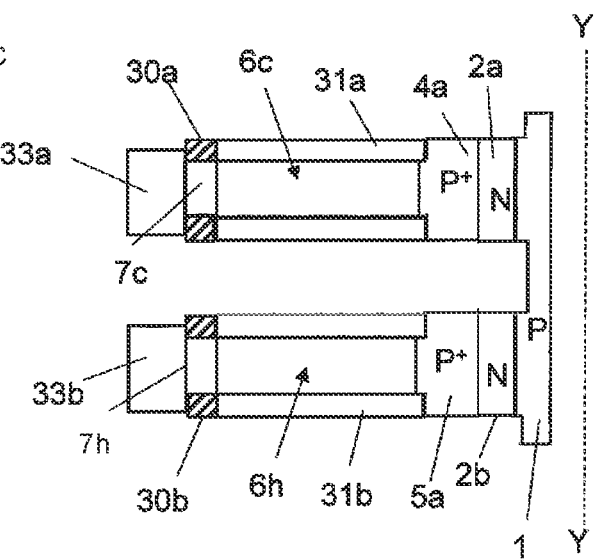

Next, the band-shaped mask material layers 27a and 27b, the band-shaped SiN layers 28a and 28b, the band-shaped SiN layers 24a and 24b, and the SiO₂ layers 22a and 22b are removed. Thus, the square mask material layers 21aa, 21ab, 21ba, 21bb, 17aa, 17ab, 17ba, 17bb, 9aa, and 9ab and the square SiN layers 20aa, 20ab, 20ba, 20bb, 16aa, 16ab, 16ba, 16bb, 8aa, and 8ab are formed on the mask material layer 7 in plan view. Next, the mask material layer 7 is etched by RIE using the square mask material layers 21aa, 21ab, 21ba, 21bb, 17aa, 17ab, 17ba, 17bb, 9aa, and 9ab and the square SiN layers 20aa, 20ab, 20ba, 20bb, 16aa, 16ab, 16ba, 16bb, 8aa, and 8ab as masks. Then, the square mask material layers 21aa, 21ab, 21ba, 21bb, 17aa, 17ab, 17ba, 17bb, 9aa, and 9ab and the square SiN layers 20aa, 20ab, 20ba, 20bb, 16aa, 16ab, 16ba, 16bb, 8aa, and 8ab are removed. Thus, mask material layers 7a, 7b, 7c, 7d, 7e, 7f (not illustrated), 7g, 7h, 7i (not illustrated), and 7j (not illustrated) are formed on the i layer 6. For example, before RIE etching of the mask material layer 7, one or both of a subset of the square mask material layers 21aa, 21ab, 21ba, 21bb, 17aa, 17ab, 17ba, 17bb, 9aa, and 9ab and a subset of the square SiN layers 20aa, 20ab, 20ba, 20bb, 16aa, 16ab, 16ba, 16bb, 8aa, and 8ab are lightly isotropically etched. Thus, the shapes of the mask material layers 7a to 7j are made circular in plan view. Next, as illustrated in FIGS. 1NA to 1NC, the i layer 6 is etched using the mask material layers 7a to 7j as masks to form Si pillars 6a (corresponding to a first semiconductor pillar in the claims), 6b (corresponding to a fifth semiconductor pillar in the claims), 6c (corresponding to a second semiconductor pillar in the claims), 6d (corresponding to a third semiconductor pillar in the claims), 6e (corresponding to a fourth semiconductor pillar in the claims), 6f, 6g, 6h, 6i, and 6j on the N⁺ layer 3 and the P⁺ layers 4 and 5. Since it is clear that the Si pillar 6j also corresponds to the first semiconductor pillar in the claims, the Si pillar 6i also corresponds to the fifth semiconductor pillar in the claims, and the Si pillar 6h also corresponds to the second semiconductor pillar in the claims, this point is not particularly described below.

Next, a SiO₂ layer (not illustrated) is applied by flowable chemical vapor deposition (FCVD), and then polished by CMP and RIE such that the position of a surface thereof meets the positions of upper portions of the mask material layers 7a to 7j to form a SiO₂ layer (not illustrated). Next, the SiO₂ layer is etched by RIE until the position of an upper surface thereof reaches the positions of bottom portions of the mask material layers 7a to 7j. Then, as illustrated in FIGS. 1OA to 1OC, a mask material layer 30a surrounding side surfaces of the mask material layers 7a, 7b, 7c, 7d, and 7e, and a mask material layer 30b surrounding side surfaces of the mask material layers 7f, 7g, 7h, 7i, and 7j are formed.

Then, a band-shaped mask material layer 33a connected to the Si pillars 6a, 6b, 6c, 6d, and 6e, and a band-shaped mask material layer 33b connected to the Si pillars 6f, 6g, 6h, 6i, and 6j in plan view are formed on the smooth surface. Next, the SiO₂ layer, the N⁺ layer 3, the P⁺ layers 4 and 5, the N layer 2, and the P-layer substrate 1 are etched by RIE using the mask material layers 30a, 30b, 7a to 7j, 33a, and 33b as masks. Thus, a SiO₂ layer 31a is formed under the mask material layer 30a and the band-shaped mask material layer 33a. At the same time, a SiO₂ layer 31b is formed under the mask material layer 30b and the band-shaped mask material layer 33b. Then, an N layer 2a, N⁺ layers 3a and 3b, and a P⁺ layer 4a are formed below the Si pillars 6a, 6b, 6c, 6d, and 6e and above the P-layer substrate 1. Similarly, an N layer 2b, N⁺ layers 3c (not illustrated) and 3d (not illustrated), and a P⁺ layer 5a are formed below the Si pillars 6f, 6g, 6h, 6i, and 6j and above the P-layer substrate 1.

Figure 1P:
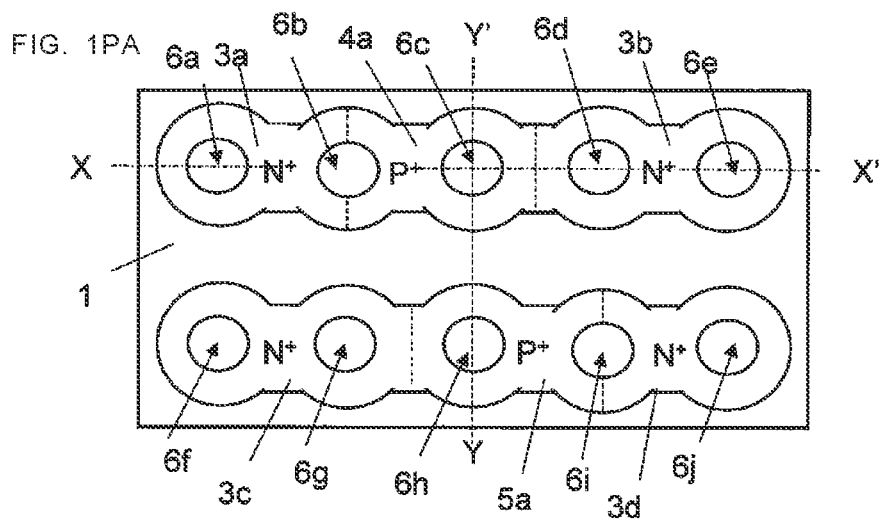
FIGS. 1HA, 1HB, and 1HC are a plan view and sectional structural views for describing the method for producing the pillar-shaped semiconductor device including the SGT according to the first embodiment.
FIGS. 1JA, 1JB, and 1JC are a plan view and sectional structural views for describing the method for producing the pillar-shaped semiconductor device including the SGT according to the first embodiment.
FIGS. 1KA, 1KB, and 1KC are a plan view and sectional structural views for describing the method for producing the pillar-shaped semiconductor device including the SGT according to the first embodiment.
FIGS. 1LA, 1LB, and 1LC are a plan view and sectional structural views for describing the method for producing the pillar-shaped semiconductor device including the SGT according to the first embodiment.
FIGS. 1MA, 1MB, and 1MC are a plan view and sectional structural views for describing the method for producing the pillar-shaped semiconductor device including the SGT according to the first embodiment.
FIGS. 1OA, 1OB, and 1OC are a plan view and sectional structural views for describing the method for producing the FIGS. 1PA, 1PB, and 1PC are a plan view and sectional structural views for describing the method for producing the pillar-shaped semiconductor device including the SGT according to the first embodiment.
FIGS. 1QA, 1QB, and 1QC are a plan view and sectional structural views for describing the method for producing the pillar-shaped semiconductor device including the SGT according to the first embodiment.
FIGS. 1RA, 1RB, and 1RC are a plan view and sectional structural views for describing the method for producing the pillar-shaped semiconductor device including the SGT according to the first embodiment.
FIGS. 1SA, 1SB, and 1SC are a plan view and sectional structural views for describing the method for producing the pillar-shaped semiconductor device including the SGT according to the first embodiment.
FIGS. 1TA, 1TB, and 1TC are a plan view and sectional structural views for describing the method for producing the pillar-shaped semiconductor device including the SGT according to the first embodiment.
FIGS. 1UA, 1UB, and 1UC are a plan view and sectional structural views for describing the method for producing the pillar-shaped semiconductor device including the SGT according to the first embodiment.
FIGS. 1VA, 1VB, 1VC, and 1VD are a plan view and sectional structural views for describing the method for producing the pillar-shaped semiconductor device including the SGT according to the first embodiment.
FIGS. 1WA, 1WB, 1WC, and 1WD are a plan view and sectional structural views for describing the method for producing the pillar-shaped semiconductor device including the SGT according to the first embodiment.
FIGS. 1XA, 1XB, 1XC, and 1XD are a plan view and sectional structural views for describing the method for producing the pillar-shaped semiconductor device including the SGT according to the first embodiment.
FIGS. 1YA, 1YB, 1YC, and 1YD are a plan view and sectional structural views for describing the method for producing the pillar-shaped semiconductor device including the SGT according to the first embodiment.
FIGS. 1ZA, 1ZB, 1ZC, and 1ZD are a plan view and sectional structural views for describing the method for producing the pillar-shaped semiconductor device including the SGT according to the first embodiment.
Figure 1P:
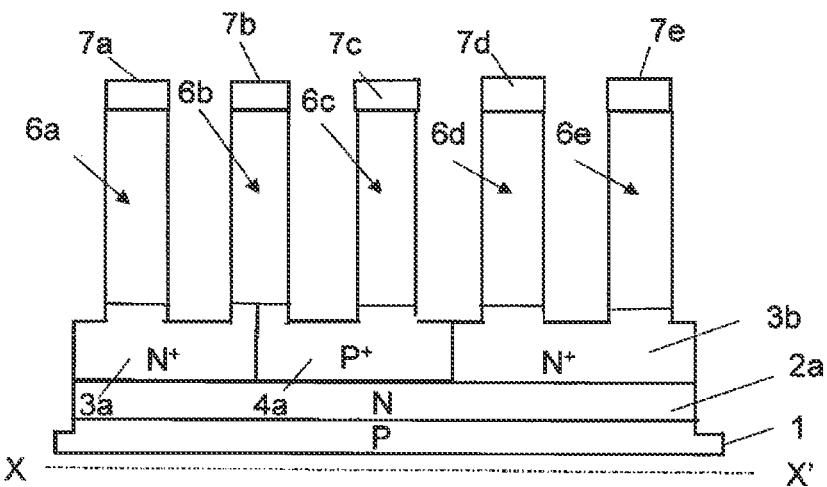
Figure 1P:
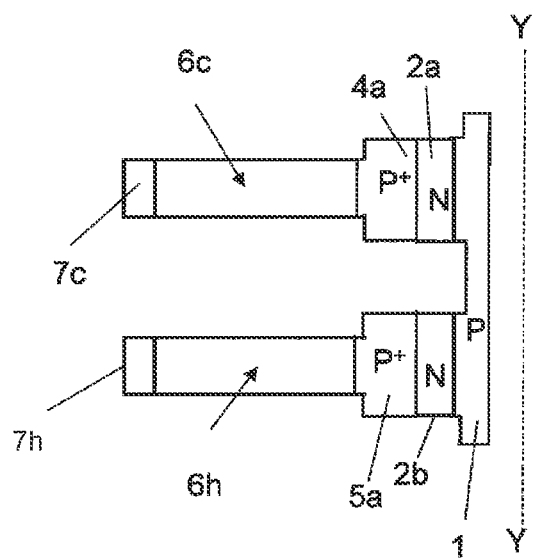

Next, the mask material layers 30a, 30b, 33a, and 33b and the SiO₂ layers 31a and 31b are removed. Thus, as illustrated in FIGS. 1PA to 1PC, the Si pillars 6a, 6b, 6c, 6d, and 6e are formed on the connected N⁺ layer 3a (corresponding to a first impurity layer in the claims) and 3b and P⁺ layer 4a (corresponding to a second impurity layer in the claims). Similarly, the Si pillars 6f, 6g, 6h, 6i, and 6j are formed on the connected N⁺ layers 3c and 3d and P⁺ layer 5a.

Figure 1Q:
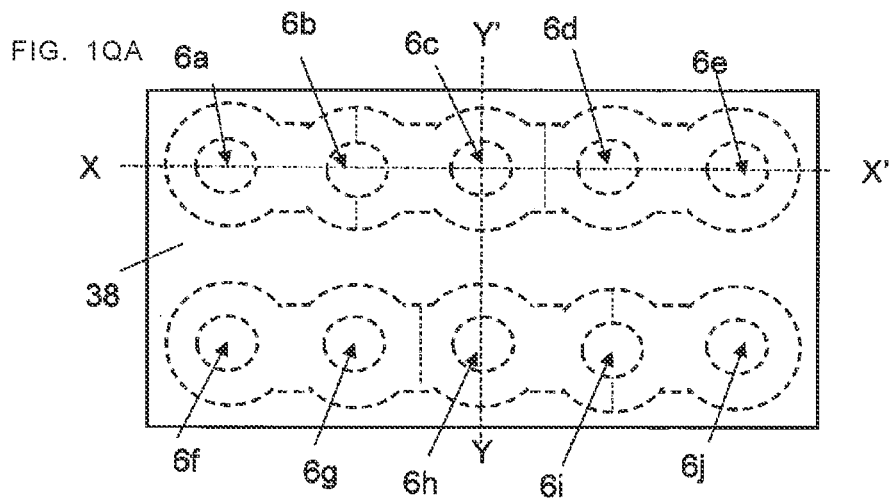
Figure 1Q:
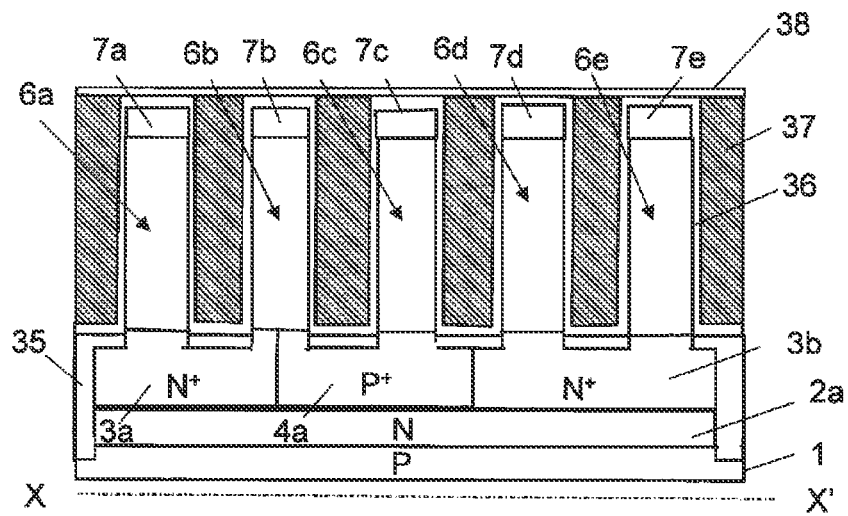
Figure 1Q:
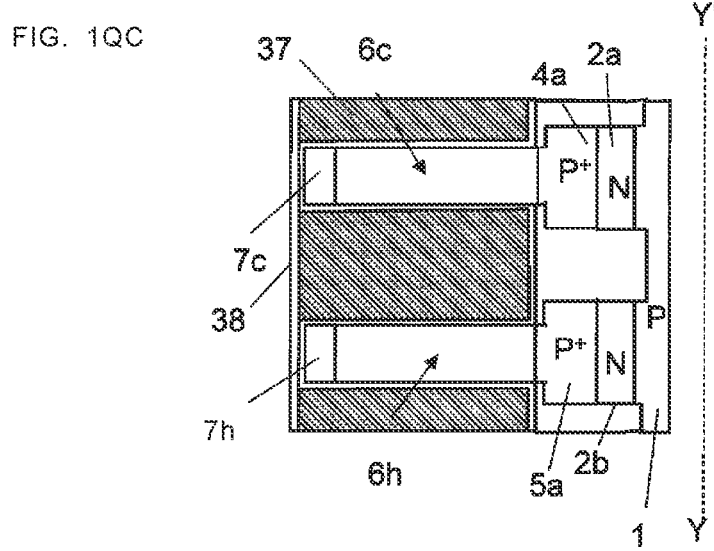

Next, as illustrated in FIGS. 1QA to 1QC, a SiO₂ layer 35 is formed on outer peripheral portions of the N⁺ layers 3a, 3b, 3c, and 3d, the P⁺ layers 4a and 5a, and the N layers 2a and 2b, and on the P-layer substrate 1. Then, a HfO₂ layer 36 serving as a gate insulating layer (corresponding to a first gate insulating layer in the claims) and a TiN layer 37 serving as a gate conductor layer are formed by ALD and CMP to cover the SiO₂ layer 35, the Si pillars 6a to 6j, and the mask material layers 7a to 7j. In this case, it is desirable that the TiN layer 37 (corresponding to a first conductor layer in the claims) is provided in a contact manner between the side surfaces of the Si pillars 6a, 6b, 6c, 6d, and 6e. Similarly, it is desirable that the TiN layer 37 is provided in a contact manner between the side surfaces of the Si pillars 6f, 6g, 6h, 6i, and 6j. Then, a mask material layer 38 is entirely formed. The TiN layer 37 may be formed by a thickness that allows the TiN layer 37 to be provided in a contact manner between the side surfaces of the Si pillars 6a, 6b, 6c, 6d, and 6e and between the Si pillars 6f, 6g, 6h, 6i, and 6j, and then outer peripheral portions of the TiN layer 37 may be formed of a tungsten layer (hereafter, also referred to as "W layer").

Figure 1R:
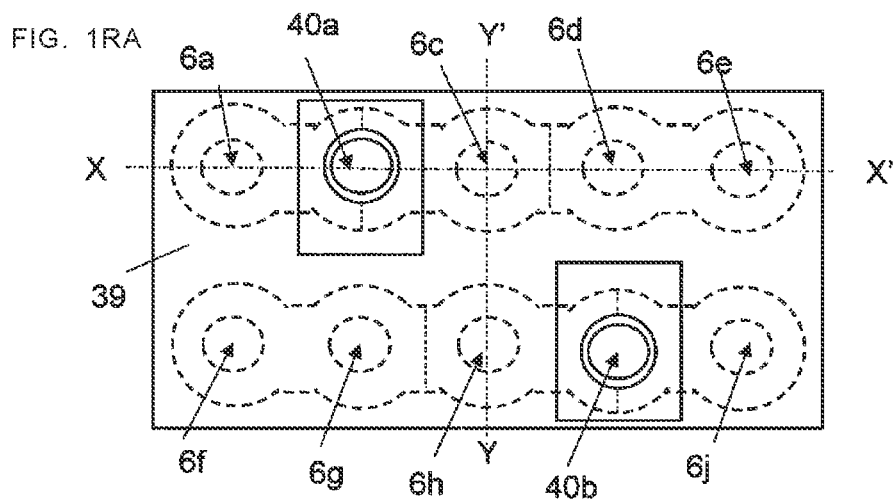
Figure 1R:
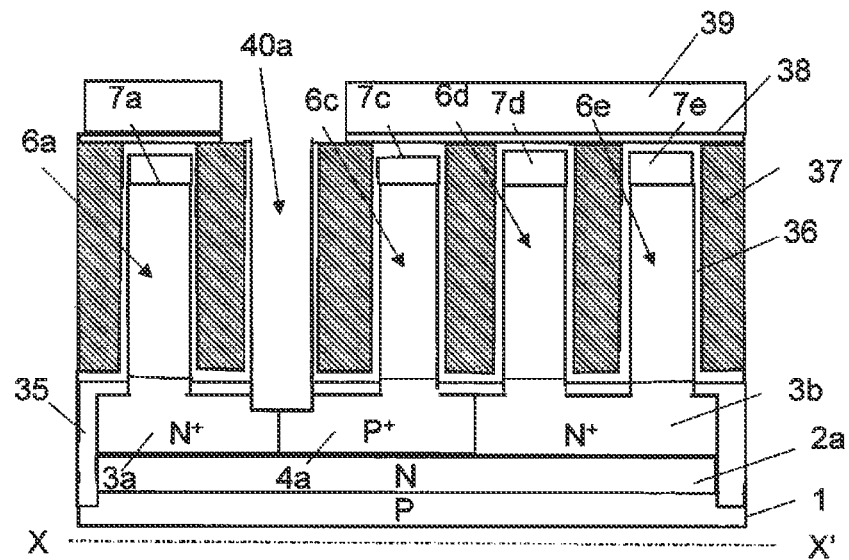
Figure 1R:
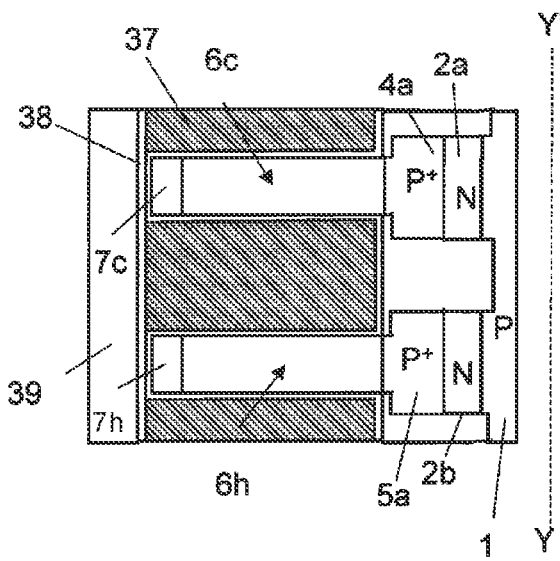

Next, as illustrated in FIGS. 1RA to 1RC, a resist layer 39 having windows to surround the Si pillars 6b and 6i in plan view is formed by lithography. Then, the mask material layer 38, the HfO₂ layer 36, the mask material layers 7b and 7i, and the Si pillars 6b and 6i are etched to form holes 40a and 40b using the resist layer 39 as an etching mask. This etching is performed such that the positions of bottom portions of the holes 40a and 40b are lower than the positions of upper surfaces of the N⁺ layers 3a and 3d and the P⁺ layers 4a and 5a surrounding the holes 40a and 40b. The resist layer 39 may be another material layer constituted by one layer or a plurality of layers as long as it is suitable for the purpose of forming the holes 40a and 40b.

Figure 1S:
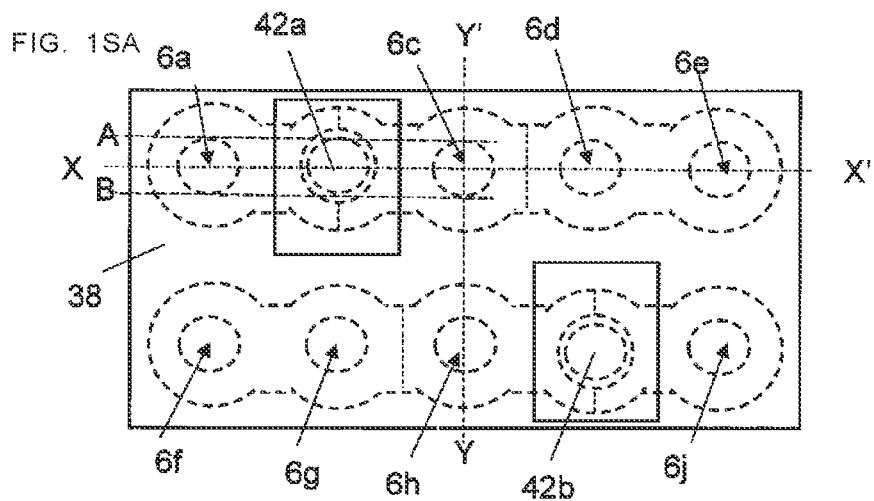
Figure 1S:
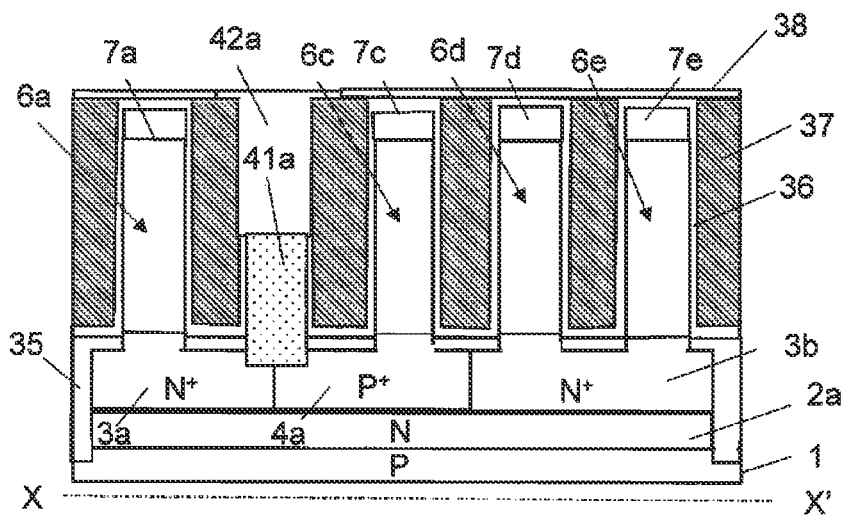
Figure 1S:
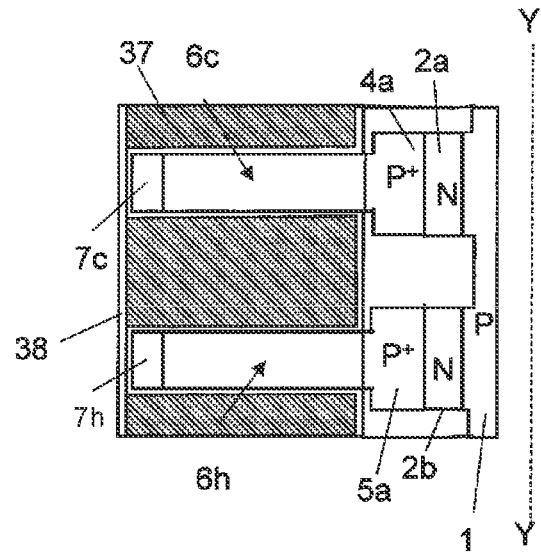

Next, the resist layer 39 is removed. Then, as illustrated in FIGS. 1SA to 1SC, a conductor layer (not illustrated) of such as tantalum (Ta) is formed entirely in the holes 40a and 40b by ALD. Then, the whole is polished by CMP. Then, as illustrated in FIGS. 1SA to 1SC, upper portions of the pillar Ta layer are etched back by RIE to form Ta pillars 41a and 41b. Then, portions of the HfO₂ layer 36 located above the Ta pillars 41a and 41b in the vertical direction are removed. Then, a SiO$_2$ layer (not illustrated) is entirely applied and polished by CMP such that the position of an upper surface thereof meets the position of an upper surface of the mask material layer 38 to form SiO$_2$ layers 42a and 42b on the Ta pillars 41a (corresponding to a first contact pillar in the claims) and 41b. The Ta pillar 41a serves as a contact portion for connecting the N$^+$ layer 3a and the P$^+$ layer 4a. Similarly, the Ta pillar 41b serves as a contact portion for connecting the N$^+$ layer 3d and the P$^+$ layer 5a. The Ta pillars 41a and 41b are formed at the same positions and in the same shapes as those of the Si pillars 6b and 6i formed simultaneously with the Si pillars 6a, 6c, 6d, 6e, 6f, 6h, and 6j. Thus, the Ta pillars 41a and 41b are formed in self-alignment with the Si pillars 6a, 6c, 6d, 6e, 6f, 6h, and 6j. The self-alignment means that when two structures are formed, the two structures can be formed without mask misalignment in, for example, lithography. By this self-alignment, the structures can be formed with high density and high accuracy. Before the Ta pillars 41a and 41b are formed, a buffer conductor layer for reducing contact resistance between the Ta pillar 41a and a subset of the N$^+$ layer 3a and the P$^+$ layer 4a and contact resistance between the Ta pillar 41b and a subset of the N$^+$ layer 3d and the P$^+$ layer 5a may be formed on inner surfaces of the holes 40a and 40b. In plan view, the Si pillars 6a, 6c, 6d, and 6e and the Ta pillar 41a are disposed in contact with two common tangent lines A and B. Similarly, the Si pillars 6f, 6g, 6h, and 6j and the Ta pillar 41b are disposed in contact with two common tangent lines. The midpoints of the Si pillars 6a, 6c, 6d, and 6e and the Ta pillar 41a are on line X-X'. Similarly, the midpoints of the Si pillars 6f, 6g, 6h, and 6j and the Ta pillar 41b are on the same line parallel to line X-X'.

Before the Ta layer is formed in the holes 40a and 40b, a side wall constituted by a conductor layer, an insulator layer, or a composite layer thereof may be formed on side surfaces of the Ta layer.

Figure 1T:
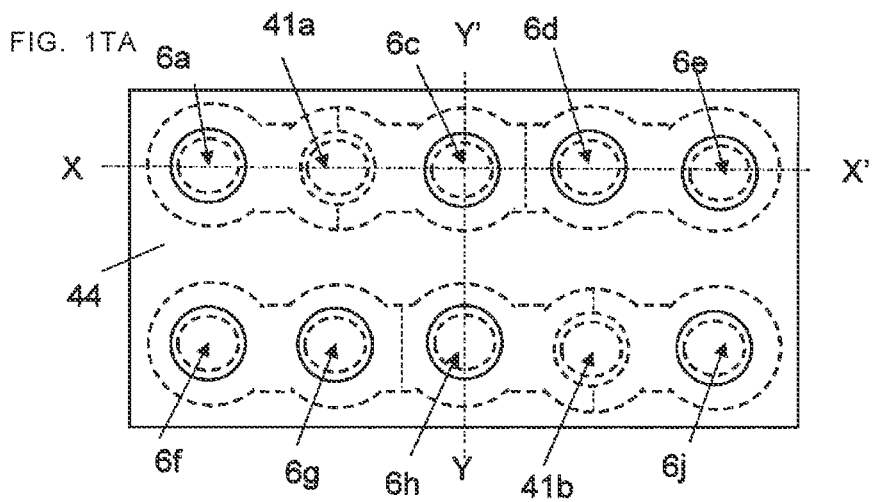
Figure 1T:
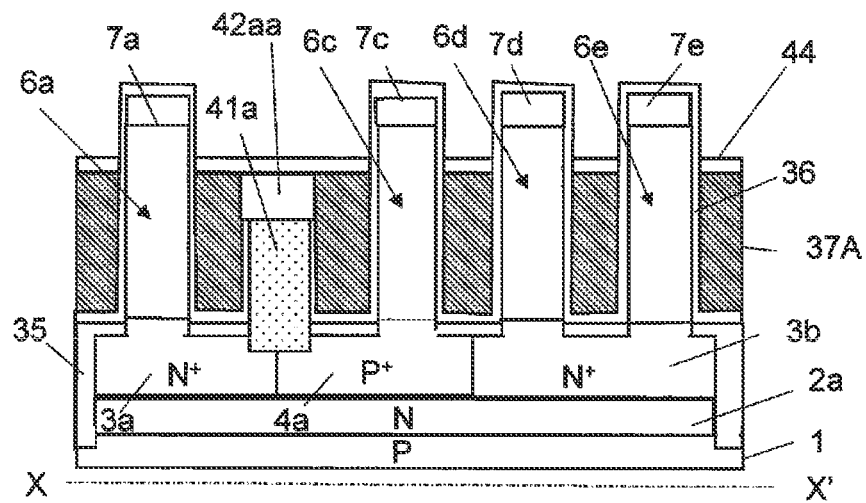
Figure 1T:
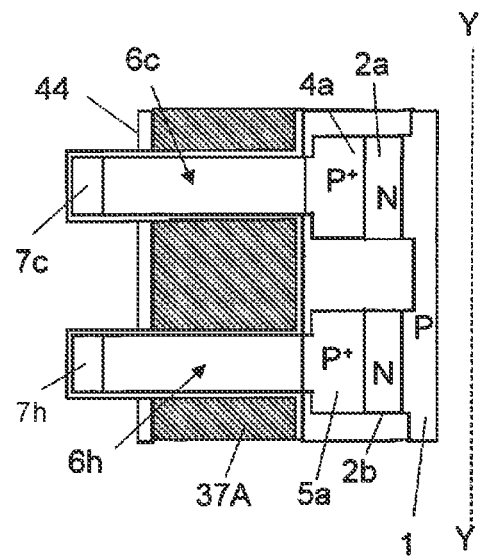

Next, as illustrated in FIGS. 1TA to 1TC, the mask material layer 38, the TiN layer 37, and the SiO$_2$ layers 42a and 42b are etched back by RIE such that the positions of upper surfaces thereof are located at positions of upper portions of the Si pillars 6a, 6c, 6d, 6e, 6f, 6h, and 6j to form a TiN layer 37A and SiO$_2$ layers 42aa and 42bb (not illustrated). Then, a SiN layer 44 is formed on outer peripheral portions of top portions of the Si pillars 6a, 6c, 6d, 6e, 6f, 6h, and 6j.

Figure 1U:
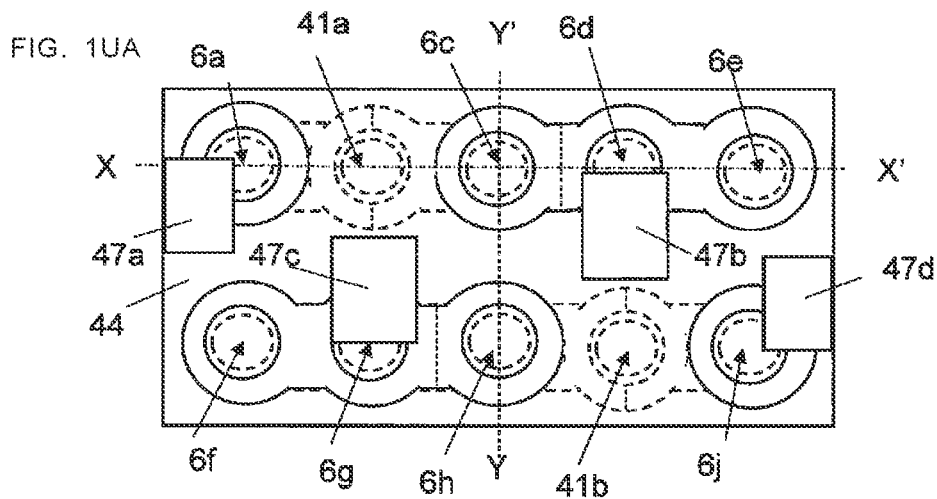
Figure 1U:
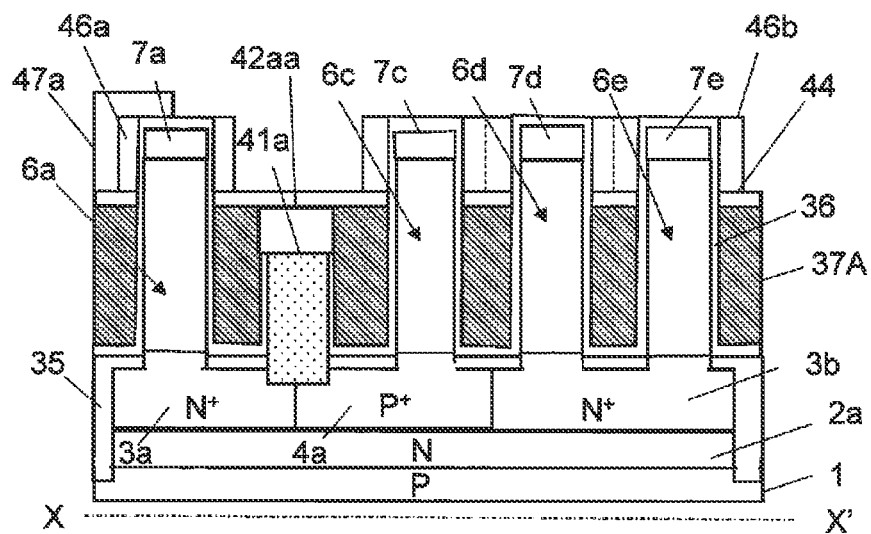
Figure 1U:
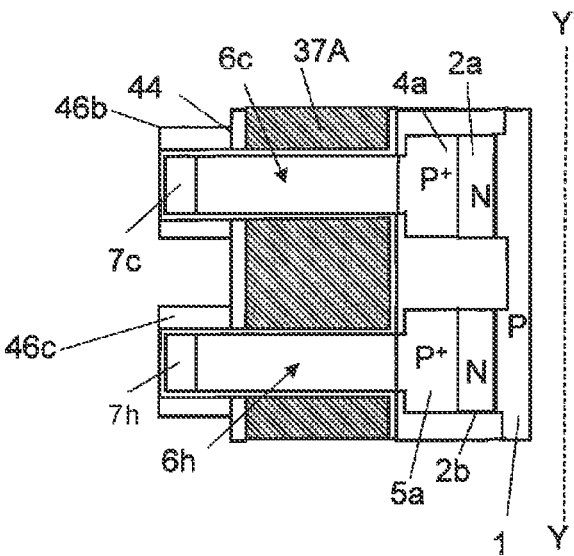

Next, a SiO$_2$ layer (not illustrated) is entirely applied. Then, as illustrated in FIGS. 1UA to 1UC, the SiO$_2$ layer is etched by RIE to form SiO$_2$ layers 46a, 46b, 46c, and 46d (not illustrated) on side surfaces of the top portions of the Si pillars 6a, 6c, 6d, 6e, 6f, 6g, 6h, and 6j and the mask material layers 7a, 7c, 7d, 7e, 7f, 7g, 7h, and 7j on the SiN layer 44. In this case, the SiO$_2$ layer 46b is formed continuously among the Si pillars 6c, 6d, and 6e. Similarly, the SiO$_2$ layer 46c is formed continuously among the Si pillars 6f, 6g, and 6h. Then, in plan view, a resist layer 47a partially overlapping the Si pillar 6a, a resist layer 47b partially overlapping the Si pillar 6d, a resist layer 47c partially overlapping the Si pillar 6g, and a resist layer 47d partially overlapping the Si pillar 6j are formed by lithography.

Figure 1V:
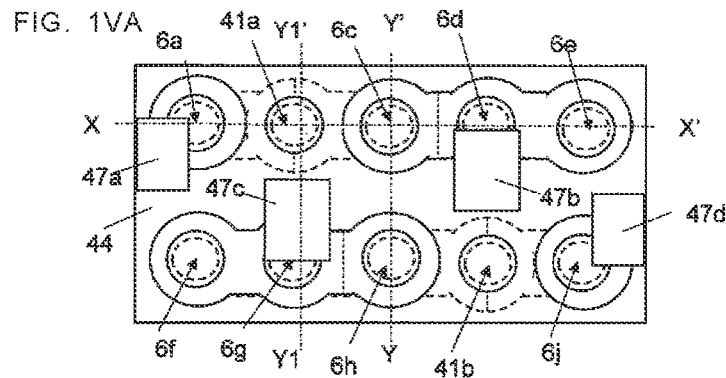
Figure 1V:
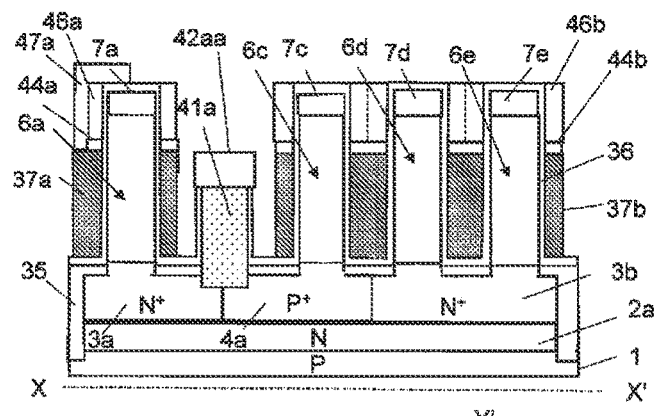
Figure 1V:
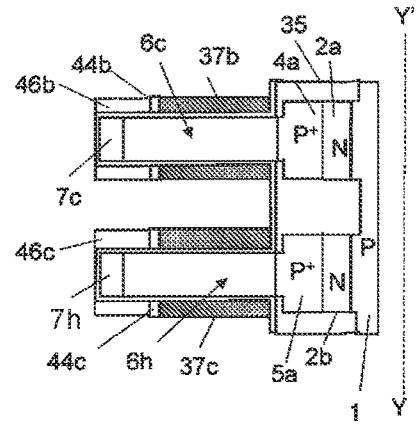
Figure 1V:
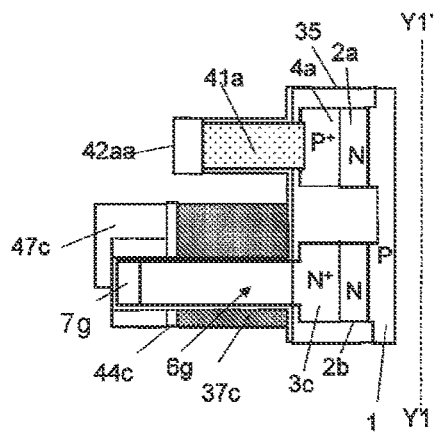

Next, as illustrated in FIGS. 1VA to 1VD, the SiN layer 44 and the TiN layer 37A are etched by RIE using the SiO$_2$ layers 46a, 46b, 46c, and 46d and the resist layers 47a, 47b, 47c, and 47d as masks to form a TiN layer 37a (corresponding to a first gate conductor layer in the claims) serving as a gate conductor layer surrounding the Si pillar 6a (corresponding to the first semiconductor pillar in the claims), a TiN layer 37b (corresponding to a second gate conductor layer in the claims) serving as a gate conductor layer surrounding the Si pillars 6c, 6d, and 6e, a TiN layer 37c serving as a gate conductor layer surrounding the Si pillars 6f, 6g, and 6h, and a TiN layer 37d serving as a gate conductor layer surrounding the Si pillar 6j in plan view. Thus, the SiO$_2$ layers 42aa and 42bb covering the Ta pillars 41a (corresponding to the first contact pillar in the claims) and 41b, and the TiN layer 37 covering an outer side of the HfO$_2$ layer 36 are removed. Then, the resist layers 47a, 47b, 47c, and 47d are removed.

Figure 1W:
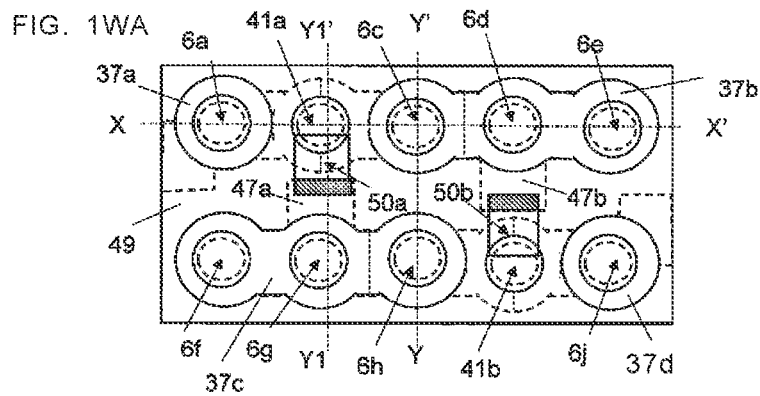
Figure 1W:
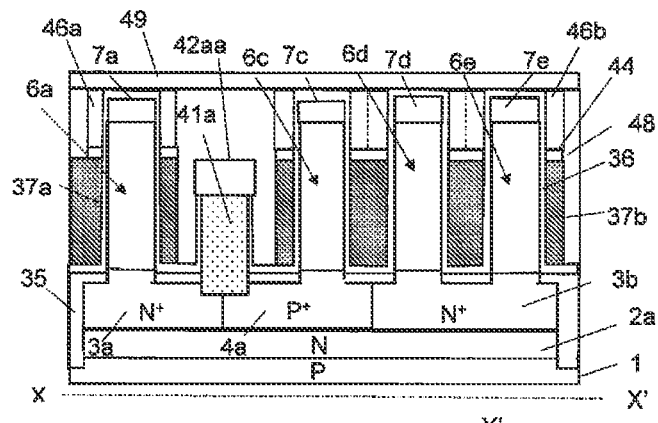
Figure 1W:
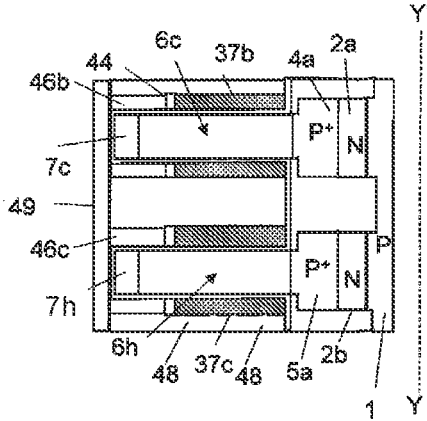
Figure 1W:
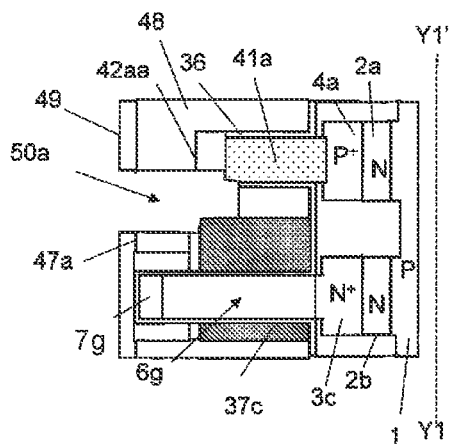

Next, a SiO$_2$ layer (not illustrated) is entirely applied by flowable chemical vapor deposition (FCVD). Then, the SiO$_2$ layer is polished by CMP to form a SiO$_2$ layer 48 as illustrated in FIGS. 1WA to 1WD. Then, the SiO$_2$ layers 48, 42aa, and 42bb are etched by lithography and RIE using a resist layer 49 as a mask to form a recessed portion 50a partially overlapping the Ta pillar 41a and the TiN layer 37c and a recessed portion 50b partially overlapping the Ta pillar 41b and the TiN layer 37b in plan view. A bottom portion of the recessed portion 50a is located at upper surfaces of the TiN layer 37c and the Ta pillar 41a. A bottom portion of the recessed portion 50b is located at upper surfaces of the TiN layer 37b and the Ta pillar 41b.

Figure 1X:
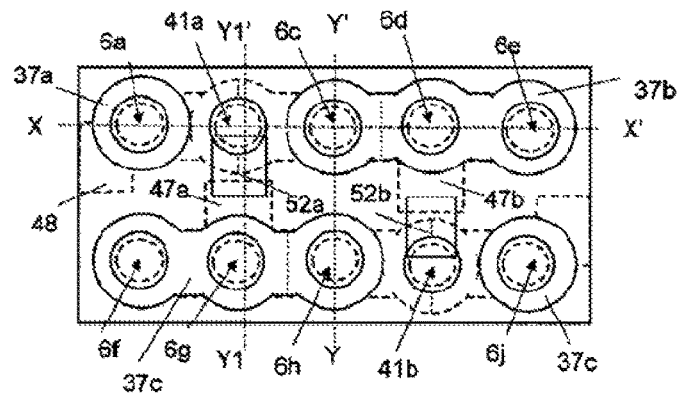
Figure 1X:
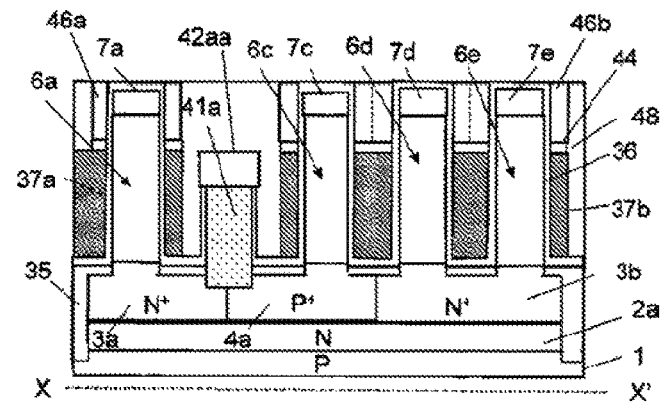
Figure 1X:
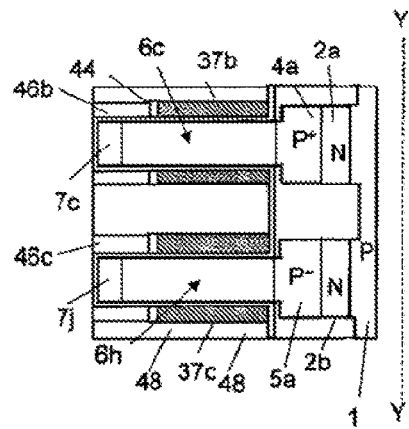
Figure 1X:
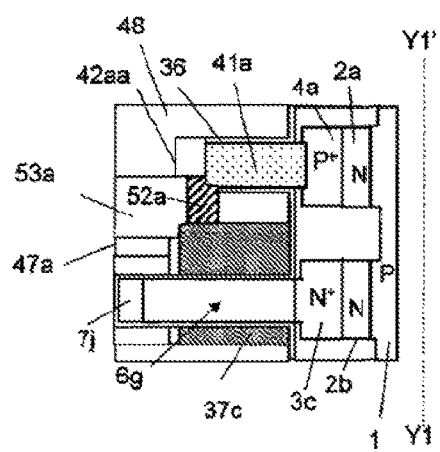

Next, a W layer is entirely applied, an upper surface of the W layer is polished by CMP. Then, as illustrated in FIGS. 1XA to 1XD, the W layer is etched back by RIE to form a W layer 52a at the bottom portion of the recessed portion 50a and a W layer 52b at the bottom portion of the recessed portion 50b. Then, SiO$_2$ layers 53a and 53b (not illustrated) are respectively formed on the W layers 52a and 52b. The positions of upper surfaces of the SiO$_2$ layers 53a and 53b are made the same as the position of an upper surface of the SiO$_2$ layer 48 by CMP. Thus, the N$^+$ layer 3a, the P$^+$ layer 4a, and the TiN layer 37c are electrically connected to each other through the Ta pillar 41a serving as the contact portion and the W layer 52a. Similarly, the N$^+$ layer 3d, the P$^+$ layer 5a, and the TiN layer 37b are electrically connected to the Ta pillar 41b serving as the contact portion through the W layer 52b.

Figure 1Y:
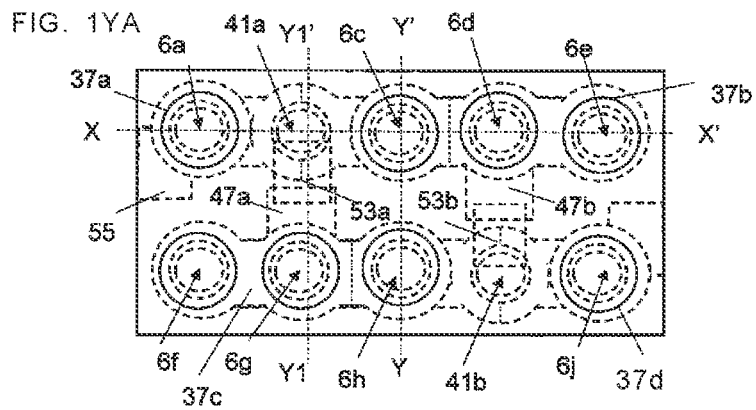
Figure 1Y:
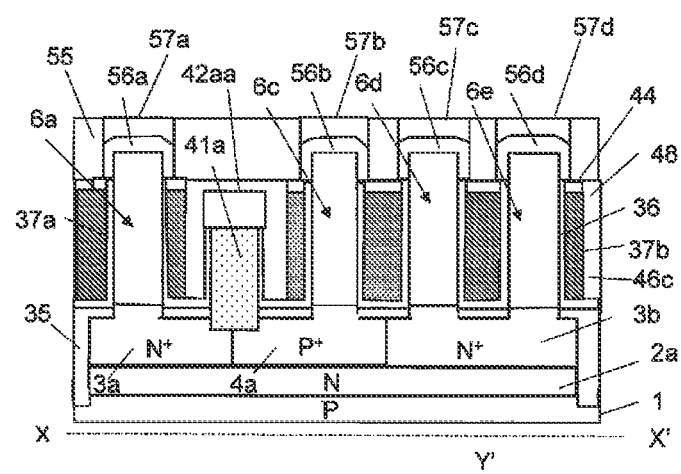
Figure 1Y:
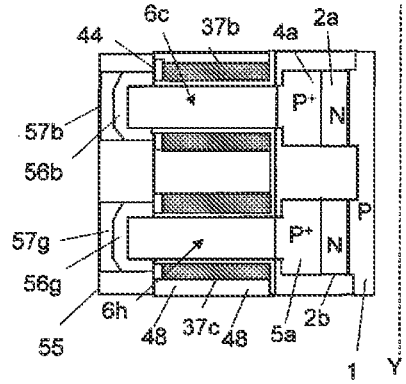
Figure 1Y:
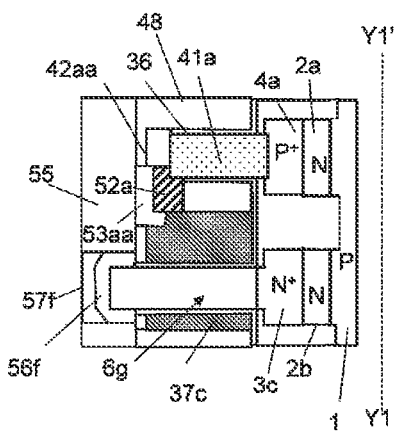

Next, the SiO$_2$ layers 48, 46a, 46b, 46c, and 46d are etched back by RIE such that the positions of upper surfaces thereof meet the position of an upper surface of the SiN layer 44. Then, a SiO$_2$ layer 55 is entirely formed. Then, the mask material layers 7a, 7c, 7d, 7e, 7f, 7g, 7h, and 7j and the SiO$_2$ layer 55 on the outer peripheries of the top portions of the Si pillars 6a, 6c, 6d, 6e, 6f, 6g, 6h, and 6j are etched to form recessed portions (not illustrated). Then, as illustrated in FIGS. 1YA to 1YD, N$^+$ layers 56a (corresponding to a third impurity layer in claims), 56c, 56d, 56e (not illustrated), 56f, and 56h (not illustrated) containing donor impurity atoms are formed by, for example, selective epitaxial growth to cover the respective Si pillars 6a, 6d, 6e, 6f, 6g, and 6j. Then, P$^+$ layers 56b (corresponding to a fourth impurity layer in the claims) and 56g containing acceptor impurity atoms are formed by, for example, selective epitaxial growth to cover the Si pillars 6c and 6h. Then, W layers 57a, 57c, 57d, 57e (not illustrated), 57f, and 57h (not illustrated) are formed in recessed portions above the N$^+$ layers 56a, 56c, 56d, 56e (not illustrated), 56f, and 56h (not illustrated). Similarly, W layers 57b and 57g are formed in recessed portions above the P$^+$ layers 56b and 56g. The donor or acceptor impurity atoms may be diffused from the N$^+$ layers 56a, 56c, 56d, 56e, 56f, and 56h and the P$^+$ layers 56b and 56g to the top portions of the Si pillars 6a, 6c, 6d, 6e, 6f, 6g, 6h, and 6j to form N$^+$ regions or P$^+$ regions in the top portions of the Si pillars 6a, 6c, 6d, 6e, 6f, 6g, 6h, and 6j by performing heat treatment.

Before the N⁺ layers 56a, 56c, 56d, 56e, 56f, and 56h and the P⁺ layers 56b and 56g are formed, N⁺ regions or P⁺ regions may be formed in the top portions of the Si pillars 6a, 6c, 6d, 6e, 6f, 6g, 6h, and 6j by, for example, ion implantation.

Figure 1Z:
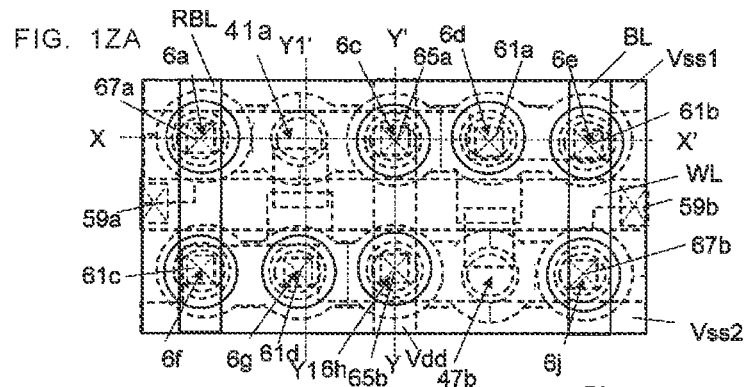
Figure 1Z:
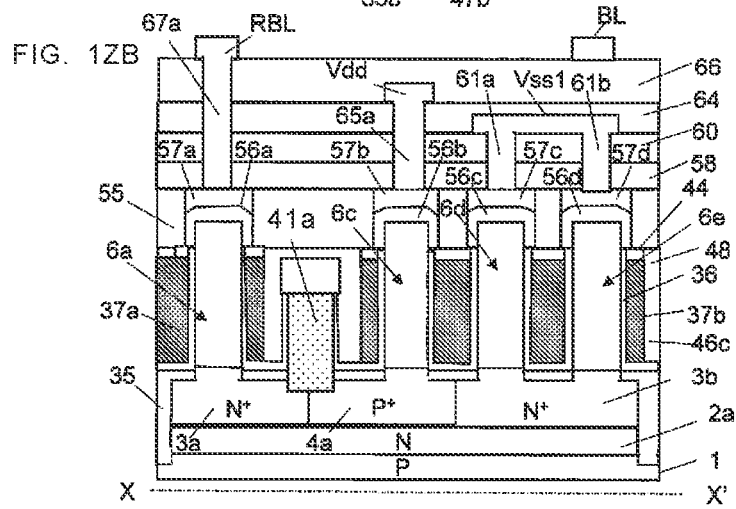
Figure 1Z:
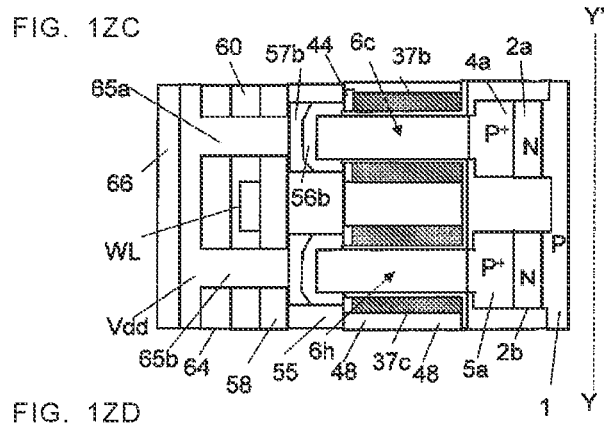
Figure 1Z:
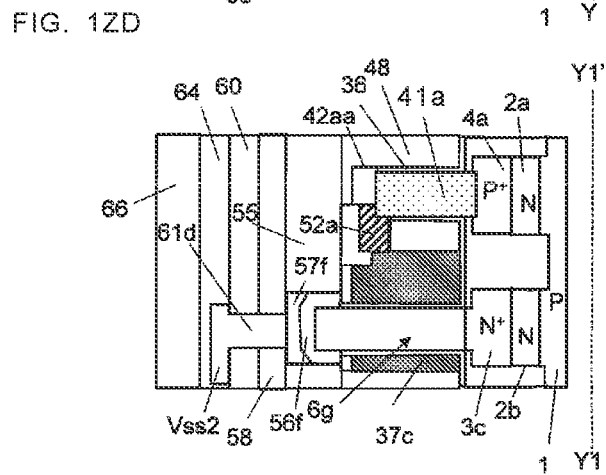

Next, as illustrated in FIGS. 1ZA to 1ZD, a SiO₂ layer 58 having a flat upper surface is formed to cover the whole. Then, a word metal wiring layer WL is formed through contact holes 59a and 59b formed on the TiN layers 37a and 37d. A SiO₂ layer 60 having a flat upper surface is formed to cover the whole. Then, a ground wiring metal layer Vss1 is formed through contact holes 61a and 61b formed on the W layers 57c and 57d. At the same time, a ground wiring metal layer Vss2 is formed through contact holes 61c and 61d formed on the W layers 57e (not illustrated) and 57f. Then, a SiO₂ layer 64 having a flat upper surface is formed to cover the whole. Then, a power supply wiring metal layer Vdd is formed through contact holes 65a and 65b formed on the W layers 57b and 57g. Then, a SiO₂ layer 66 having a flat upper surface is formed to cover the whole. Then, a bit wiring metal layer BL and an inverted bit wiring metal layer RBL are formed through contact holes 67a and 67b formed on the W layers 57a and 57h. Thus, a high-density static random access memory (SRAM) cell circuit is formed on the P-layer substrate 1.

As illustrated in FIGS. 1ZA to 1ZD, a selection SGT is formed at the Si pillar 6a, a load SGT is formed at the Si pillar 6c, and drive SGTs are formed at the Si pillars 6d and 6e. Similarly, drive SGTs are formed at the Si pillars 6f and 6g, a load SGT is formed at the Si pillar 6h, and a selection SGT is formed at the Si pillar 6j.

In the description of the present embodiment, the N⁺ layer 3a uses a structure in which the N⁺ layer 3a extends from a bottom portion of the Si pillar 6a in the horizontal direction and is connected to the P⁺ layer 4a. The same applies to the N⁺ layers 3b, 3c, and 3d and the P⁺ layer 5a. The N⁺ layers 3a, 3b, 3c, and 3d and the P⁺ layers 4a and 5a may be formed using another structure. For example, an N⁺ layer may be formed to surround the side surface of the bottom portion of the Si pillar 6a using, for example, selective epitaxial growth. The N⁺ layers 3b, 3c, and 3d and the P⁺ layers 4a and 5a may be formed by the same method. In this case, the N⁺ layers 3a, 3b, 3c, and 3d and the P⁺ layers 4a and 5a are formed to be connected to the side surfaces of the Si pillars 6a, 6c, 6d, 6e, 6f, 6g, 6h, and 6j. When thermal diffusion is performed from the N⁺ layers and the P⁺ layers connected to the side surfaces of the Si pillars 6a, 6c, 6d, 6e, 6f, 6g, 6h, and 6j to bottom portions of the Si pillars 6a, 6c, 6d, 6e, 6f, 6g, 6h, and 6j, the N⁺ layers and the P⁺ layers are formed to be connected to the inside and the side surfaces of the Si pillars 6a, 6c, 6d, 6e, 6f, 6g, 6h, and 6j. As described above, the method for forming the N⁺ layers 3a, 3b, 3c, and 3d and the P⁺ layers 4a and 5a formed at the bottom portions and/or the side surfaces of the Si pillars 6a, 6c, 6d, 6e, 6f, 6g, 6h, and 6j is selected in accordance with requirements of circuit design and production.

Although the present embodiment has been described by taking the SRAM as an example, when the present invention is applied to another circuit, the polarities of impurity layers corresponding to the N⁺ layers 3a, 3b, 3c, and 3d and the P⁺ layers 4a and 5a may be the same or different in accordance with circuit design specifications.

In the first embodiment, as illustrated in FIGS. 1YA to 1YD, the IV⁺ layers 56a, 56c, 56d, 56e, 56f, and 56h and the P⁺ layers 56b and 56g are formed to surround the top portions of the Si pillars 6a, 6c, 6d, 6e, 6f, 6h, and 6j by selective epitaxial growth. Thereafter, donor impurity atoms or acceptor impurity atoms may be thermally diffused into the top portions of the Si pillars 6a, 6c, 6d, 6e, 6f, 6h, and 6j by heat treatment to form N⁺ layers or P⁺ layers inside the top portions of the Si pillars 6a, 6c, 6d, 6e, 6f, 6h, and 6j. As described above, the method for forming the N⁺ layers 56a, 56c, 56d, 56e, 56f, and 56h and the P⁺ layers 56b and 56g inside the top portions and/or to surround the top portions of the Si pillars 6a, 6c, 6d, 6e, 6f, 6g, 6h, and 6j is selected in accordance with requirements of circuit design and production.

In the present embodiment, the example of forming one SGT at each of the Si pillars 6a, 6c, 6d, 6e, 6f, 6g, 6h, and 6j has been described. The present invention is also applicable to a case where a plurality of SGTs are formed at one semiconductor pillar. In this case, the N⁺ layers 56a, 56c, 56d, 56e, 56f, and 56h and the P⁺ layers 56b and 56g formed to surround the top portions of the Si pillars 6a, 6c, 6d, 6e, 6f, 6g, 6h, and 6j illustrated in FIGS. 1ZA to 1ZD may be formed on the outer peripheral portions of the side surfaces of the semiconductor pillars, the inside thereof, or on both the outer peripheral portions of the side surfaces and the inside thereof. As described above, the impurity layers corresponding to the N⁺ layers 56a, 56c, 56d, 56e, 56f, and 56h and the P⁺ layers 56b and 56g can be disposed inside the upper portions of the semiconductor pillars and/or can surround the upper portions of the semiconductor pillars.

In FIGS. 1QA to 1QC, the gate HfO₂ layer 36 is formed on the side surfaces of the Si pillars 6a, 6b, 6c, 6d, 6e, 6f, 6g, 6h, 6i, and 6j at the same time. Alternatively, the side surfaces of the Si pillars 6a and 6b may be surrounded by a first gate insulating layer, and the Si pillars 6c, 6d, and 6e may be surrounded by a second gate insulating layer different from the first gate insulating layer. Thus, the side surface of the Ta pillar 41a of the contact portion is supported by the first gate insulating layer connected from the Si pillar 6a. Alternatively, the side surfaces of the Si pillars 6b, 6c, 6d, and 6e may be surrounded by a first gate insulating layer, and the Si pillar 6a may be surrounded by a second gate insulating layer different from the first gate insulating layer. Thus, the side surface of the Ta pillar 41a of the contact portion is supported by the first gate insulating layer connected from the Si pillars 6c, 6d, and 6e. The TiN layer 37a and the TiN layer 37b serving as a gate conductor layer may be formed of different conductor material layers.

According to the producing method of the first embodiment, the following features are obtained.

Feature 1

The Ta pillar 41a of the contact portion for connecting the N⁺ layer 3a and the P⁺ layer 4a, and the Ta pillar 41b of the contact portion for connecting the N⁺ layer 3c and the P⁺ layer 5a are formed at positions at which the Si pillars 6b and 6i are formed to have the same outer peripheral shapes as those of the Si pillars 6b and 6i. Since the Si pillars 6b and 6i are formed in self-alignment with the Ta pillars 41a and 41b, the Ta pillars 41a and 41b of the contact portions are formed in self-alignment with the Si pillars 6a, 6c, 6d, 6e, 6f, 6g, 6h, and 6j. This leads to an increase in the density of the SRAM cell.

Feature 2

In the present embodiment, as illustrated in FIGS. 1VA to 1VD, after the gate TiN layers 37a, 37b, 37c, and 37d are formed, the Ta pillars 41a and 41b stand apart independently from the TiN layers 37a, 37b, 37c, and 37d. The HfO₂ layer 36 serving as the gate insulating layer surrounding the entire side surfaces of the Si pillars 6a, 6c, 6d, 6e, 6f, 6g, 6h, and 6j, is continuously formed on the entire side surfaces of the Ta pillars 41a and 41b. Since the Ta pillars 41a and 41b are metal pillars, the Ta pillars 41a and 41b are softer than the single-crystal Si pillars 6a, 6c, 6d, 6e, 6f, 6g, 6h, and 6j. For this reason, when only the Ta pillars 41a and 41b stand, a problem of falling or tilting occurs in a step such as cleaning. In contrast, in the present embodiment, the HfO$_2$ layer 36 connected from the side surfaces of the Si pillars 6a, 6c, 6d, 6e, 6f, 6g, 6h, and 6j functions as a layer for preventing the occurrence of falling or tilting.

Feature 3

In the present embodiment, the Ta pillars 41a and 41b are formed such that the positions of bottom portions of the Ta pillars 41a and 41b are lower than the positions of the upper surfaces of the N$^+$ layers 3a, 3b, 3c, and 3d and the P$^+$ layers 4a and 5a surrounding the Ta pillars 41a and 41b. Thus, the supporting points that support the Ta pillars 41a and 41b are two points: the bottom portion of the HfO$_2$ layer 36 and the bottom portions of the Ta pillars 41a and 41b. Thus, this can further improve the prevention of falling or tilting of the Ta pillars 41a and 41b.

Feature 4

By forming the Ta pillars 41a and 41b serving as the contact portions in self-alignment with the Si pillars 6a, 6c, 6d, 6e, 6f, 6g, 6h, and 6j, the distances between the Ta pillar 41a and the Si pillars 6a and 6c and between the Ta pillar 41b and the Si pillars 6h and 6j can be reduced. The distances between the Ta pillar 41a and the Si pillars 6a and 6c are determined by the thicknesses of the band-shaped SiGe layers 18a and 12aa, as illustrated in FIGS. 1HA to 1HC. The distances between the Ta pillar 41b and the Si pillars 6h and 6j are determined by the thicknesses of the band-shaped SiGe layers 18b and 12ab. The band-shaped SiGe layers 18a and 18b are simultaneously formed by ALD. Similarly, the band-shaped SiGe layers 12aa and 12ab are simultaneously formed by ALD. In ALD, a material layer can be deposited with good control for one atomic layer or one molecular layer. Thus, in plan view, the thicknesses of the band-shaped SiGe layers 18a, 18b, 12aa, and 12ab can be narrowed with high accuracy in accordance with requirements of design. Thus, the gate TiN layer 37b can be formed in a contact manner between the side surfaces of the Si pillars 6c, 6d, and 6e, and the gate TiN layer 37c can be formed in a contact manner between the side surfaces of the Si pillars 6f, 6g, and 6h. Thus, the distances between the Si pillars 6c, 6d, and 6e and the distances between the Si pillars 6f, 6g, and 6h each can be reduced to twice the sum of the thicknesses of the gate HfO$_2$ layer 36 and the gate TiN layer 37b or 37c. As described above, since the Ta pillars 41a and 41b serving as the contact portions are formed by self-alignment, and since the distances between the Ta pillars 41a and 41b serving as the contact portions and the Si pillars 6a, 6c, 6h, and 6j on both sides thereof are determined by the thicknesses of the band-shaped SiGe layers 12aa, 12ab, 18a, and 18b formed by ALD, the density of the SRAM cell can be increased.

Second Embodiment

Figure 2A:
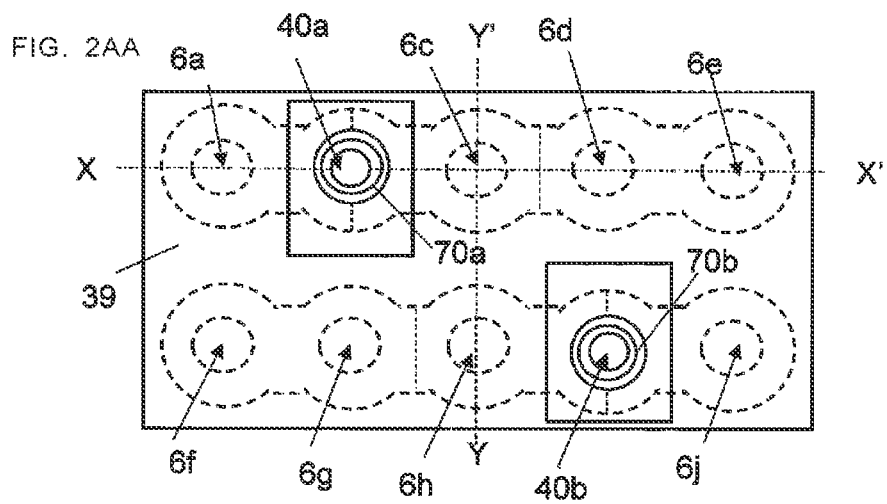
FIGS. 2AA, 2AB, and 2AC are a plan view and sectional structural views for describing a method for producing a pillar-shaped semiconductor device including a SGT according to a second embodiment of the present invention.
Figure 2A:
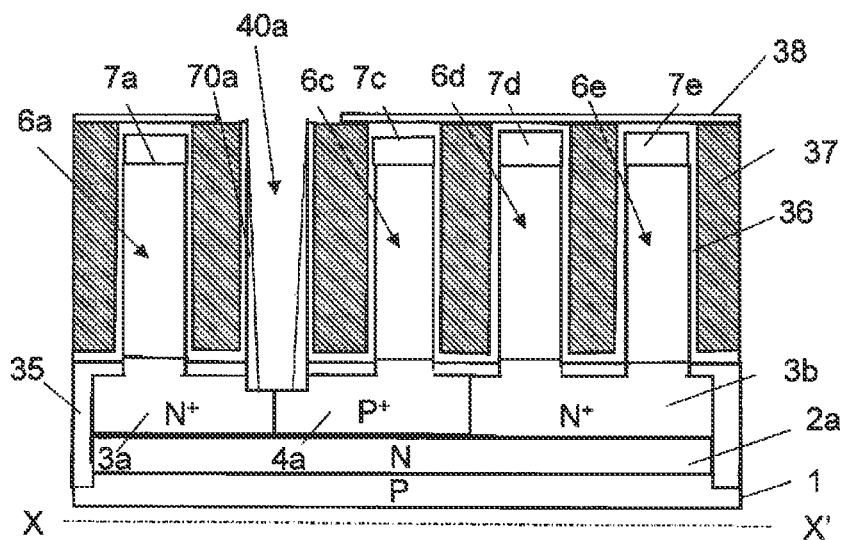
Figure 2A:
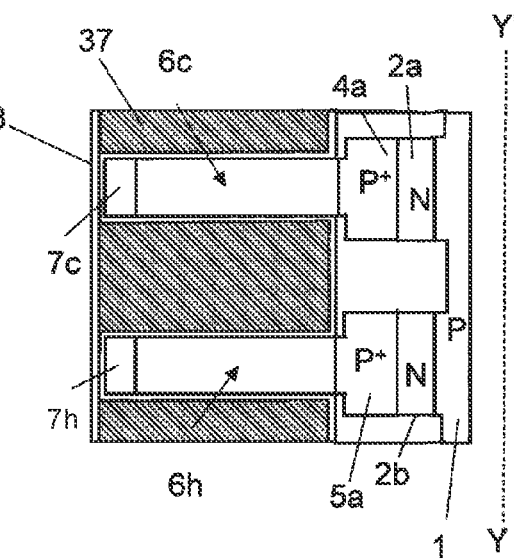

Hereinafter, a method for producing a pillar-shaped semiconductor device including a SGT according to a second embodiment of the present invention will be described with reference to FIGS. 2AA to 2BD. In the respective drawings, figures suffixed with A are plan views, figures suffixed with B are sectional structural views taken along lines X-X' in the corresponding figures suffixed with A, figures suffixed with C are sectional structural views taken along lines Y-Y' in the corresponding figures suffixed with A, and figures suffixed with D are sectional structural views taken along lines Y1-Y1' in the corresponding figures suffixed with A. Components that are the same as or correspond to the components in the first embodiment are denoted by the same reference numerals, and redundant description thereof is omitted.

The same steps as those illustrated in FIGS. 1AA to 1RC are performed. In this case, the holes 40a and 40b are formed such that the positions of bottom portions of the holes 40a and 40b are lower than the positions of the upper surfaces of the N$^+$ layers 3a, 3b, 3c, and 3d and the P$^+$ layers 4a and 5a. Next, the whole is covered with a W layer by ALD. Then, as illustrated in FIGS. 2AA to 2AC, the W layer at the bottom portion is removed by RIE to form W layers 70a and 70b on side surfaces of the holes 40a (corresponding to a first hole in the claims) and 40b. Note that the W layers 70a and 70b may be a metal, alloy, or insulating layer constituted by one layer or a plurality of layers.

Figure 2B:
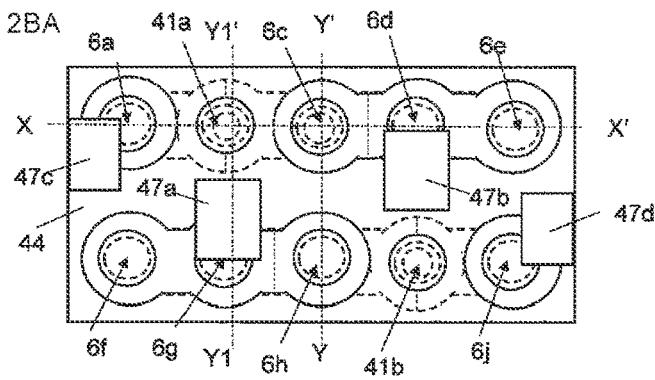
FIGS. 2BA, 2BB, 2BC, and 2BD are a plan view and sectional structural views for describing the method for producing the pillar-shaped semiconductor device including the SGT according to the second embodiment.
Figure 2B:
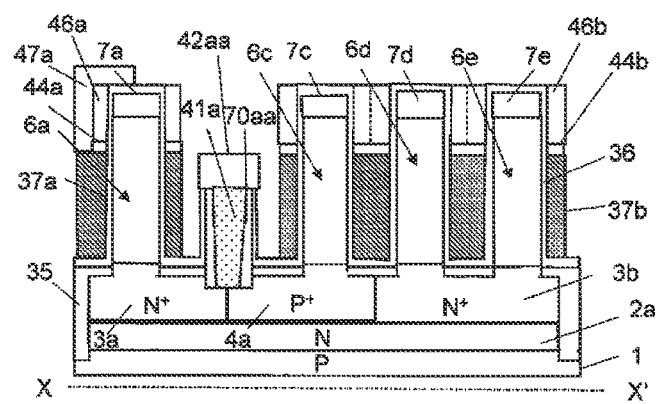
Figure 2B:
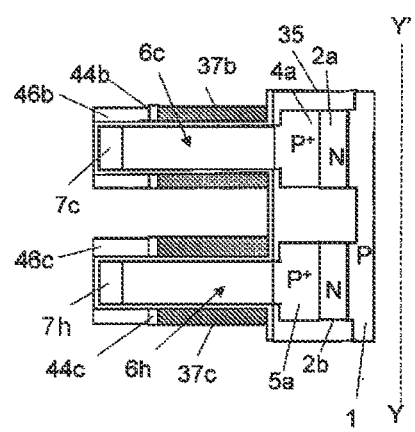
Figure 2B:
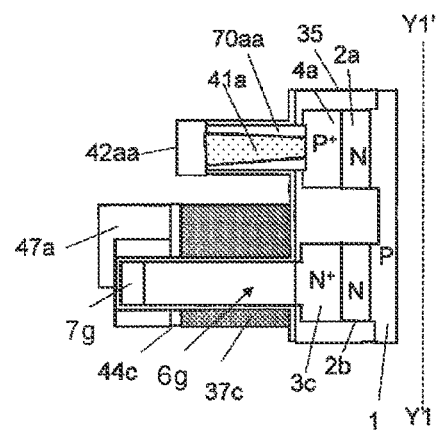

Next, the same steps as those illustrated in FIGS. 1SA to 1VD are performed. Thus, as illustrated in FIGS. 2BA to 2BD, W layers 70aa and 70bb (not illustrated) are formed between the Ta pillars 41a and 41b and the HfO$_2$ layer 36 surrounding the outer peripheries thereof. SiO$_2$ layers 42aa and 42bb (not illustrated) are formed on the Ta pillars 41a and 41b and the W layers 70aa (corresponding to a first material layer in the claims) and 70bb. Then, a high-density SRAM cell circuit is formed on the P-layer substrate 1 by performing the same steps as those illustrated in FIGS. 1WA to 1ZD.

According to the producing method of the second embodiment, the following features are obtained.

Feature 1

In the first embodiment, the HfO$_2$ layer 36 surrounding the side surfaces of the Ta pillars 41a and 41b is used to prevent the Ta pillars 41a and 41b serving as the contact portions from falling or tilting. In contrast, in the present embodiment, by forming the W layers 70aa and 70bb to further surround the side surfaces of the Ta pillars 41a and 41b, it is possible to further prevent the Ta pillars 41a and 41b from falling or tilting. Even when an insulating layer is used instead of the W layers 70aa and 70bb, since sectional center portions of the Ta pillars 41a and 41b serving as the contact portions are conductor layers constituted by Ta, there is no problem in electrical connection with the N$^+$ layers 3a and 3d and the P$^+$ layers 4a and 5a.

Feature 2

In the first embodiment, only the HfO$_2$ layer 36 serving as the gate insulating layer is used to prevent the Ta pillars 41a and 41b from falling or tilting. The HfO$_2$ layer 36 has limitations in use, such as film thickness and physical constant, as a gate insulating layer required by circuit design. In contrast, in the present embodiment, the W layers 70aa and 70bb can be designed by using another metal layer, an alloy layer, or an insulating layer for more proper process design for preventing falling or tilting.

Feature 3

In the present embodiment, the W layers 70aa and 70bb are formed such that the positions of bottom portions of the W layers 70aa and 70bb are lower than the positions of the upper surfaces of the N$^+$ layers 3a, 3b, 3c, and 3d and the P$^+$ layers 4a and 5a. Thus, the supporting points that support the Ta pillars 41a and 41b are two points: the bottom portion of the HfO$_2$ layer 36 and the bottom portions of the W layers 70aa and 70bb. Thus, this can further improve the prevention of falling or tilting of the Ta pillars 41a and 41b.

Third Embodiment

Hereinafter, a method for producing a pillar-shaped semiconductor device including a SGT according to a third embodiment of the present invention will be described with reference to FIGS. 3AA to 3BC. In the respective drawings, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A. The present embodiment is an example in which a SRAM cell is constituted by six SGTs in contrast to the example in which the SRAM cell is constituted by eight SGTs in the first embodiment.

Figure 3A:
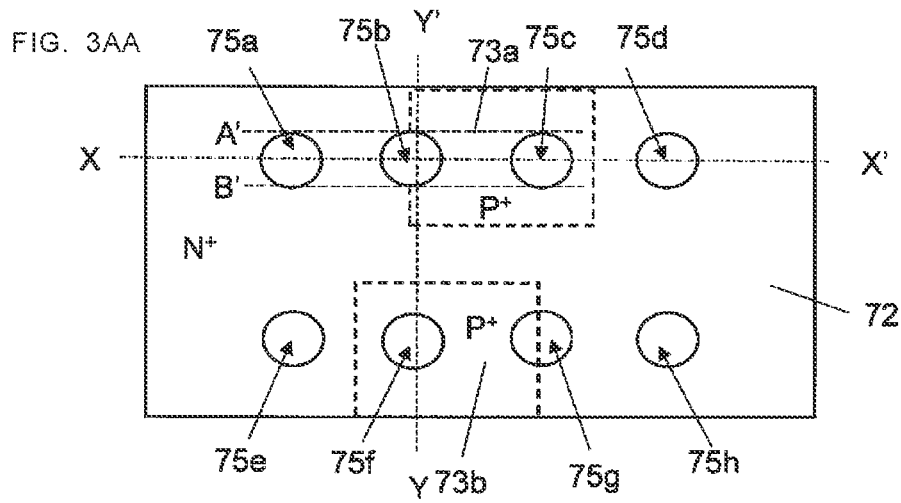
FIGS. 3AA, 3AB, and 3AC are a plan view and sectional structural views for describing a method for producing a pillar-shaped semiconductor device including a SGT according to a third embodiment of the present invention.
Figure 3A:
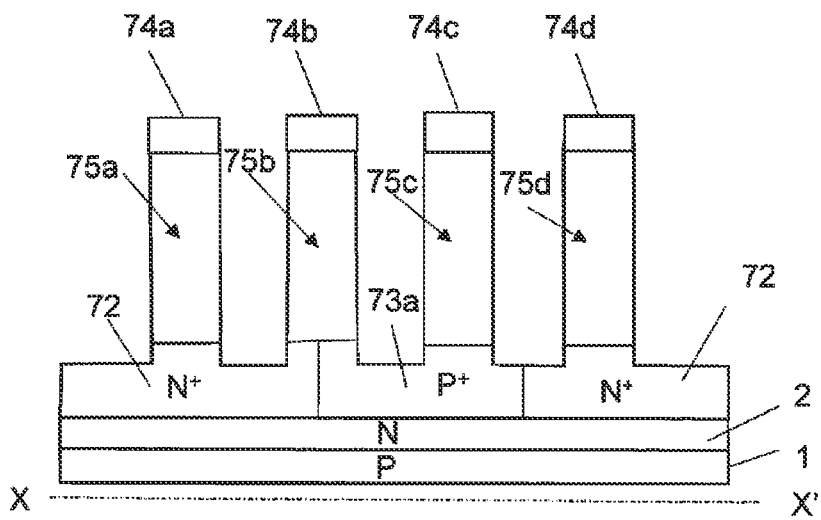
Figure 3A:
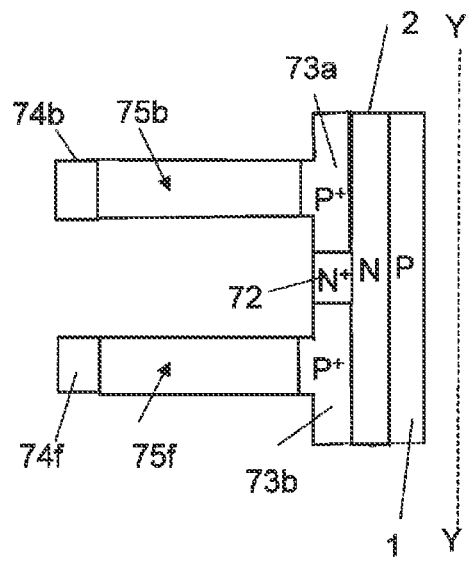

Steps equivalent to the steps illustrated in FIGS. 1AA to 1NC are performed to form Si pillars 75a, 75b, 75c, 75d, 75e, 75f, 75g, and 75h on an N$^+$ layer 72 and P$^+$ layers 73a and 73b as illustrated in FIGS. 3AA to 3AC. Mask material layers 74a, 74b, 74c, 74d, 74e (not illustrated), 74f, 74g (not illustrated), and 74h (not illustrated) are formed on top portions of the Si pillars 75a to 75h. The N$^+$ layer 72 and the P$^+$ layers 73a and 73b are formed on the P-layer substrate 1 and the N layer 2 as in the first embodiment. Thus, while the eight Si pillars 6a to 6j are formed in one cell region in the first embodiment, the six Si pillars 75a, 75c, 75d, 75e, 75f, and 75h are formed in one SRAM cell in the present embodiment. In plan view, the Si pillars 75a, 75b, and 75c are disposed in contact with two common tangent lines A' and B'. Similarly, the Si pillars 75f, 75g, and 75h are disposed in contact with two common tangent lines.

Figure 3B:
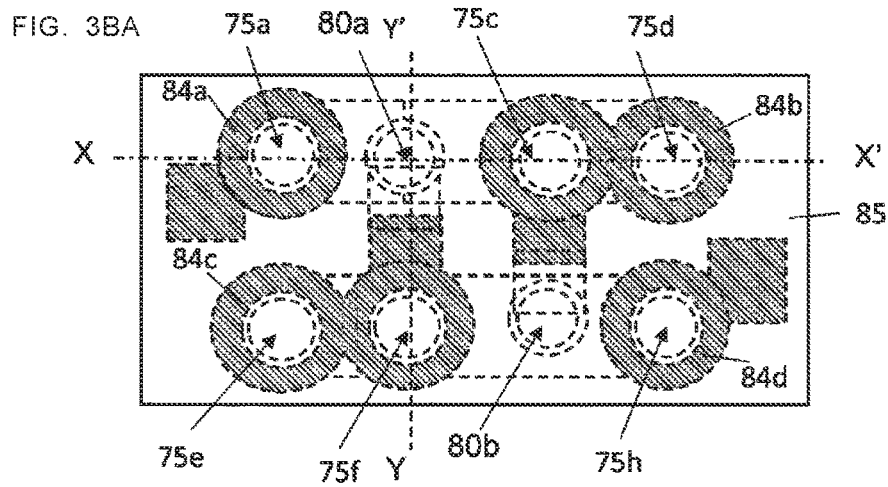
FIGS. 3BA, 3BB, and 3BC are a plan view and sectional structural views for describing the method for producing the pillar-shaped semiconductor device including the SGT according to the third embodiment of the present invention.
Figure 3B:
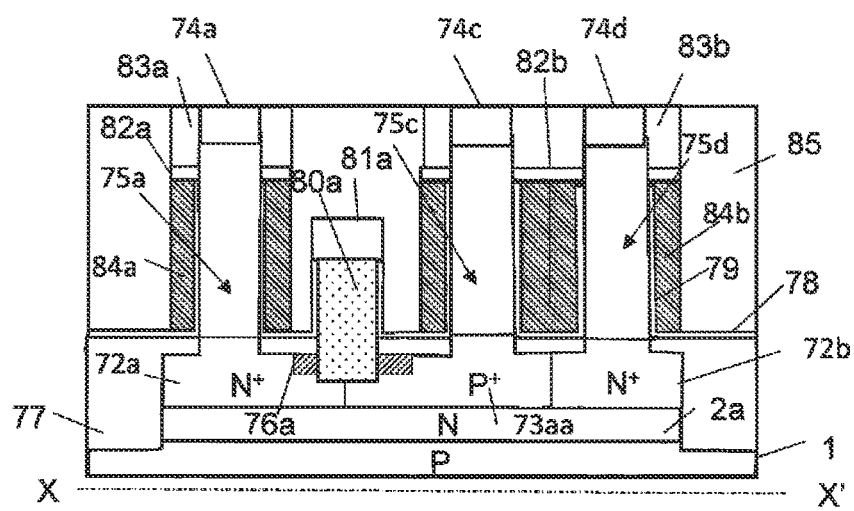
Figure 3B:
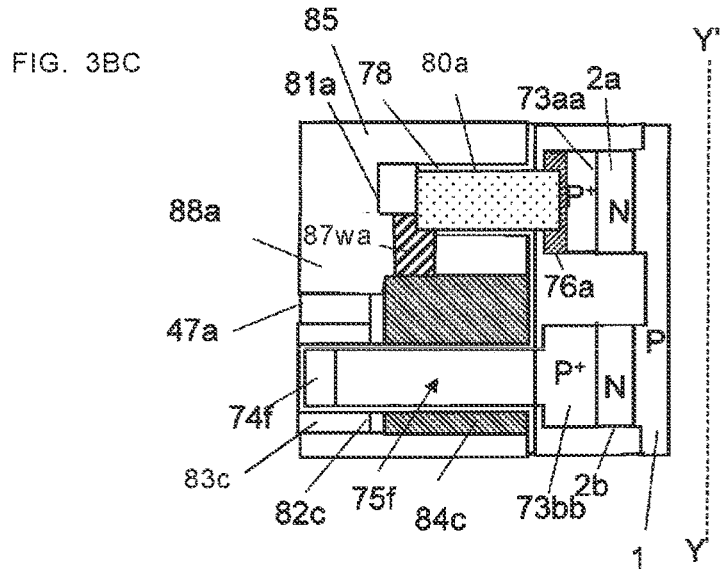

Next, steps equivalent to the steps illustrated in FIGS. 1OA to 1XD are performed. Then, an alloy layer 76a of such as NiSi is formed in upper surfaces of an N$^+$ layer 72a and a P$^+$ layer 73aa on an outer peripheral portion of a bottom portion of a hole (not illustrated). Similarly, an alloy layer (not illustrated) is formed in upper surfaces of an N$^+$ layer 72d and a P$^+$ layer 73bb. Then, as illustrated in FIGS. 3BA to 3BC, Ta pillars 80a and 80b serving as contact portions are formed at the locations of the Si pillars 75b and 75g. The N$^+$ layers 72a and 72b and the P$^+$ layer 73aa are formed on the N layer 2a. Similarly, the N$^+$ layers 72c and 72d (not illustrated) and the P$^+$ layer 73bb are formed on the N layer 2b. Then, a SiO$_2$ layer 77 is formed on outer peripheral portions of bottom portions of the Si pillars 75a, 75c, 75d, 75e, 75f, and 75h and the Ta pillars 80a and 80b. Then, a HfO$_2$ layer 78 serving as a gate insulating layer is formed on side surfaces of the Si pillars 75a, 75c, 75d, 75e, 75f, and 75h and the Ta pillars 80a and 80b and on the SiO$_2$ layer 77. On an outer side of the HfO$_2$ layer 78, a TiN layer 84a serving as a gate conductor layer surrounding the Si pillar 75a, a TiN layer 84b serving as a gate conductor layer surrounding the Si pillars 75c and 75d, a TiN layer 84c serving as a gate conductor layer surrounding the Si pillars 75e and 75f, and a TiN layer 84d serving as a gate conductor layer surrounding the Si pillar 75h are formed. A SiN layer 82a and a SiO$_2$ layer 83a surrounding side surfaces of the Si pillar 75a and the mask material layer 74a are formed on the TiN layer 84a. Similarly, a SiN layer 82b and a SiO$_2$ layer 83b surrounding side surfaces of the Si pillars 75c and 75d and the mask material layers 74c and 74d are formed on the TiN layer 84b. Similarly, a SiN layer 82c and a SiO$_2$ layer 83c surrounding side surfaces of the Si pillars 75e and 75f and the mask material layers 74e and 74f are formed on the TiN layer 84c. Similarly, a SiN layer 82d (not illustrated) and a SiO$_2$ layer 83d (not illustrated) surrounding side surfaces of the Si pillar 75h and the mask material layer 74h are formed on the TiN layer 84d. Then, SiO$_2$ layers 81a and 81b (not illustrated) are formed on the Ta pillars 80a and 80b. Then, a SiO$_2$ layer 85 is formed such that the SiO$_2$ layer 85 surrounds the whole and the position of an upper surface thereof meets the positions of upper surfaces of the mask material layers 74a, 74c, 74d, 74e, 74f, and 74h. Then, a W layer 87wa for connecting the Ta pillar 80a and the TiN layer 84c is formed. Similarly, a W layer 87wb (not illustrated) for connecting the Ta pillar 80b and the TiN layer 84b is formed. Then, a SiO$_2$ layer 88a is formed on the W layer 87wa, and a SiO$_2$ layer 88b (not illustrated) is formed on the W layer 87wb. Then, steps equivalent to the steps illustrated in FIGS. 1YA to 1ZD are performed. Thus, a SRAM cell circuit is formed on the P-layer substrate 1. In plan view, the Si pillars 75a and 75c and the Ta pillar 80a are disposed in contact with the two common tangent lines A' and B' illustrated in FIG. 3AA. Similarly, the Si pillars 75f and 75h and the Ta pillar 80b are disposed in contact with the two common tangent lines.

In FIGS. 3BA to 3BC, a selection SGT is formed at the Si pillar 75a, a load SGT is formed at the Si pillar 75c, and a drive SGT is formed at the Si pillar 75d. Similarly, a drive SGT is formed at the Si pillar 75e, a load SGT is formed at the Si pillar 75f, and a selection SGT is formed at the Si pillar 75h.

According to the producing method of the third embodiment, the following features are obtained.

Feature 1

The Ta pillar 80a serving as the contact portion for connecting the N$^+$ layer 72a and the P$^+$ layer 73aa and the Ta pillar 80b serving as the contact portion for connecting the N$^+$ layer 72d and the P$^+$ layer 73bb are formed at positions at which the Si pillars 75b and 75g are formed to have the same outer peripheral shapes. Since the Si pillars 75b and 75g are formed in self-alignment with the Ta pillars 80a and 80b, the Ta pillars 80a and 80b serving as the contact portions are formed in self-alignment with the Si pillar 75a, 75c, 75d, 75e, 75f, and 75h. This leads to an increase in the density of the SRAM cell.

Feature 2

In the present embodiment, as in the first embodiment, the HfO$_2$ layer 78 serving as the gate insulating layer surrounding the entire side surfaces of the Ta pillars 80a and 80b and surrounding the entire side surface of the Si pillar 75a, 75c, 75d, 75e, 75f, and 75h is continuously formed. In the present embodiment, the HfO$_2$ layer 78 connected from the side surfaces of the Si pillars 75a, 75c, 75d, 75e, 75f, and 75h to the side surfaces of the Ta pillars 80a and 80b functions as a layer for preventing the Ta pillars 80a and 80b from falling or tilting.

Feature 3

As in the first embodiment, by forming the Ta pillars 80a and 80b serving as the contact portions in self-alignment with the Si pillars 75a, 75c, 75d, 75e, 75f, and 75h, the distances between the Ta pillar 80a and the Si pillars 75a and 75c and between the Ta pillar 80b and the Si pillars 75f and 75h can be reduced. Thus, the gate TiN layer 84b is provided in a contact manner between the side surfaces of the Si pillars 75c and 75d, and the gate TiN layer 84c is provided in a contact manner between the side surfaces of the Si pillars 75e and 75f. Hence, the distances between the Si pillars 75c and 75d and between the Si pillars 75e and 75f can be reduced to twice the sum of the thicknesses of the gate HfO$_2$ layer 78 and the gate TiN layer 84b or 84c. Thus, the density of the SRAM cell can be increased.

Fourth Embodiment

Hereinafter, a method for producing a pillar-shaped semiconductor device including a SGT for logic circuit according to a fourth embodiment of the present invention will be described with reference to FIGS. 4AA to 4DC. In the respective drawings, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

Figure 4A:
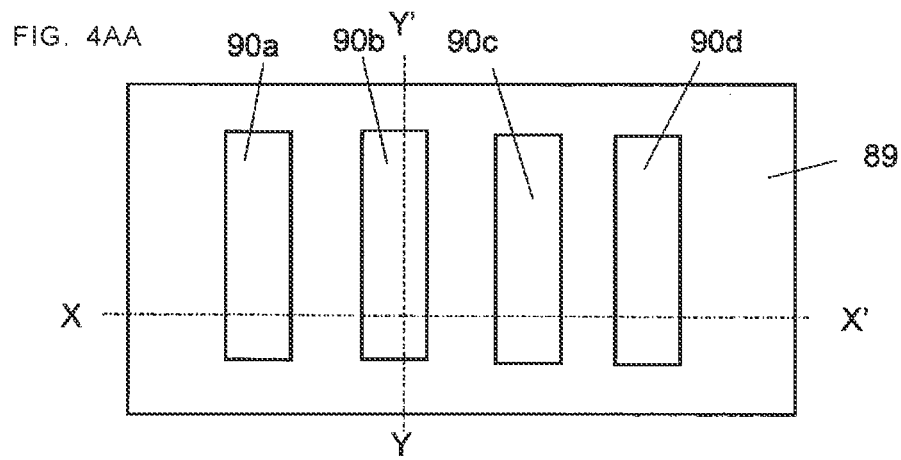
FIGS. 4AA, 4AB, and 4AC are a plan view and sectional structural views for describing a method for producing a pillar-shaped semiconductor device including a SGT according to a fourth embodiment.
Figure 4A:
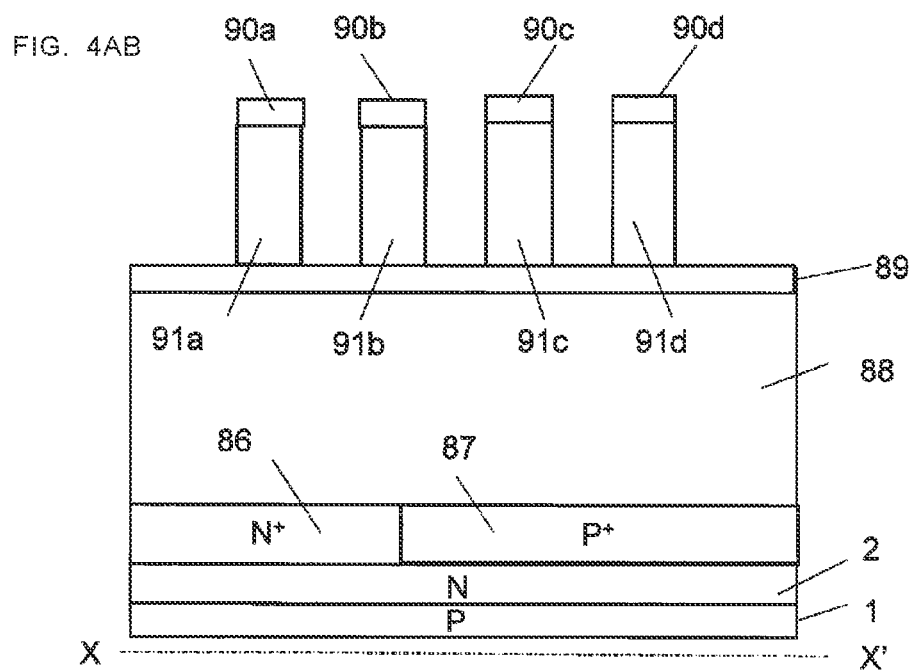
Figure 4A:
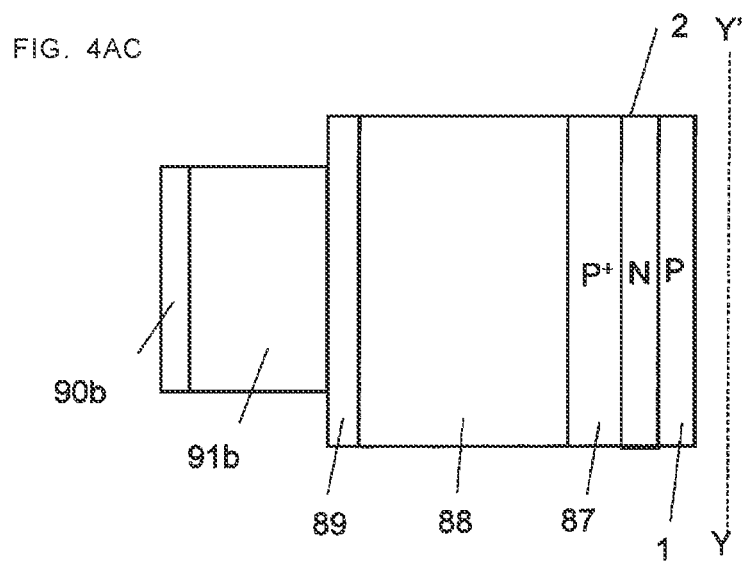

Steps equivalent to the steps illustrated in FIGS. 1AA to 1IC are performed to form rectangular SiN layers 91a, 91b, 91c, and 91d arranged in parallel in the X direction in plan view on a mask insulating layer 89 as illustrated in FIGS. 4AA to 4AC. Below the mask insulating layer 89, a P-layer substrate 1, an N layer 2, an $N^+$ layer 86, a $P^+$ layer 87, and an i layer 88 are formed in this order from the bottom. Then, rectangular mask material layers 90a, 90b, 90c, and 90d are formed on the respective rectangular SiN layers 91a, 91b, 91c, and 91d.

Figure 4B:
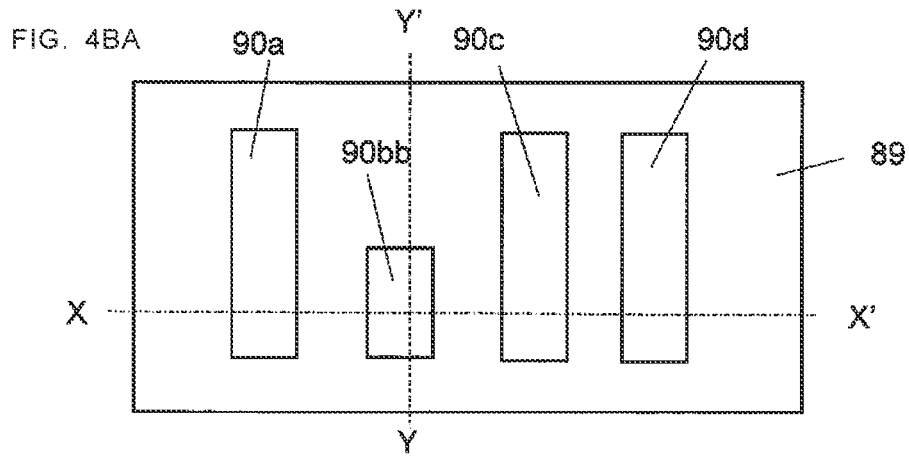
FIGS. 4BA, 4BB, and 4BC are a plan view and sectional structural views for describing the method for producing the pillar-shaped semiconductor device including the SGT according to the fourth embodiment.
Figure 4B:
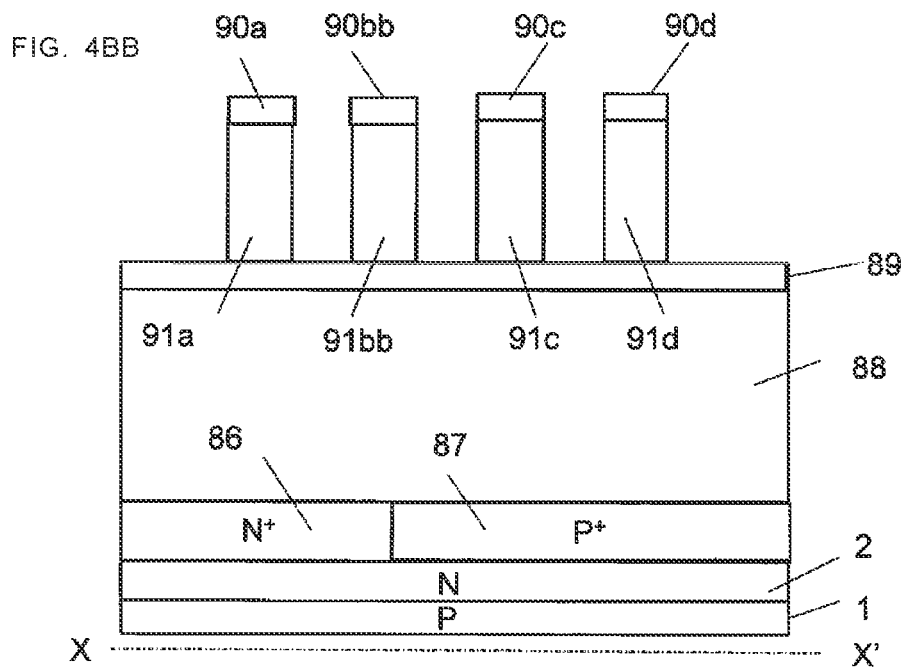
Figure 4B:
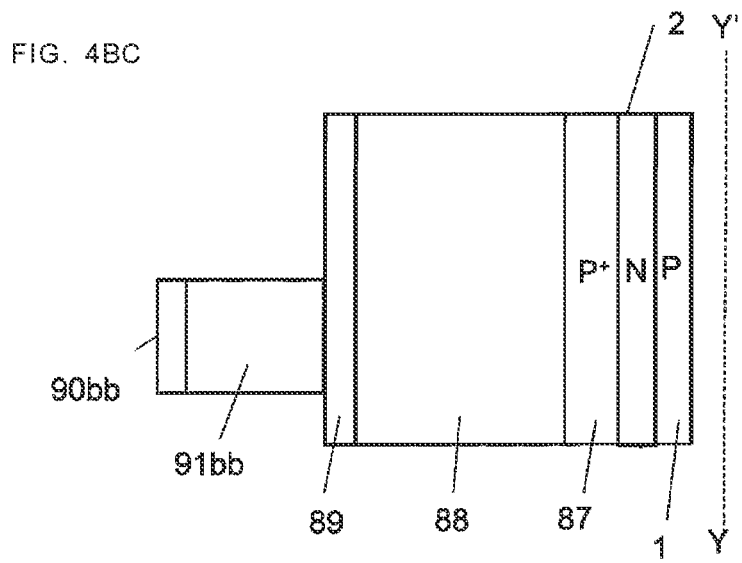

Next, as illustrated in FIGS. 4BA to 4BC, upper portions of the rectangular mask material layer 90b and the rectangular SiN layer 91b in plan view are removed by lithography and RIE etching to form a rectangular mask material layer 90bb and a rectangular SiN layer 91bb.

Figure 4C:
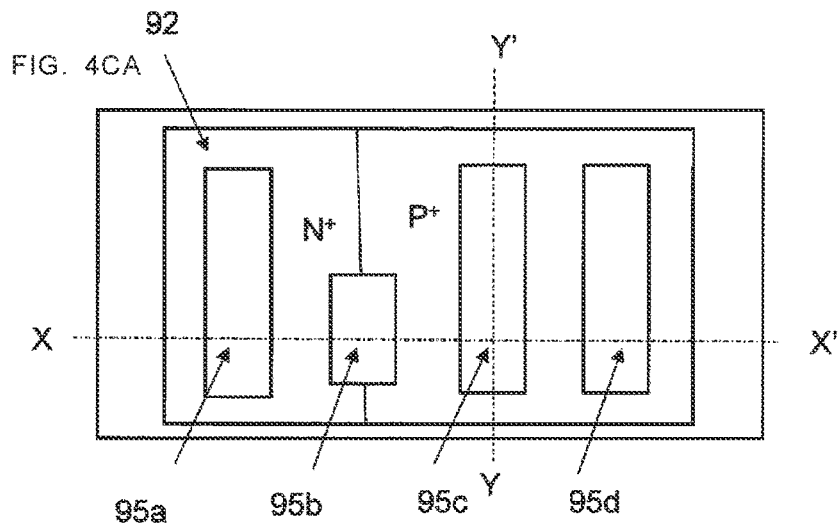
FIGS. 4CA, 4CB, and 4CC are a plan view and sectional structural views for describing the method for producing the pillar-shaped semiconductor device including the SGT according to the fourth embodiment.
Figure 4C:
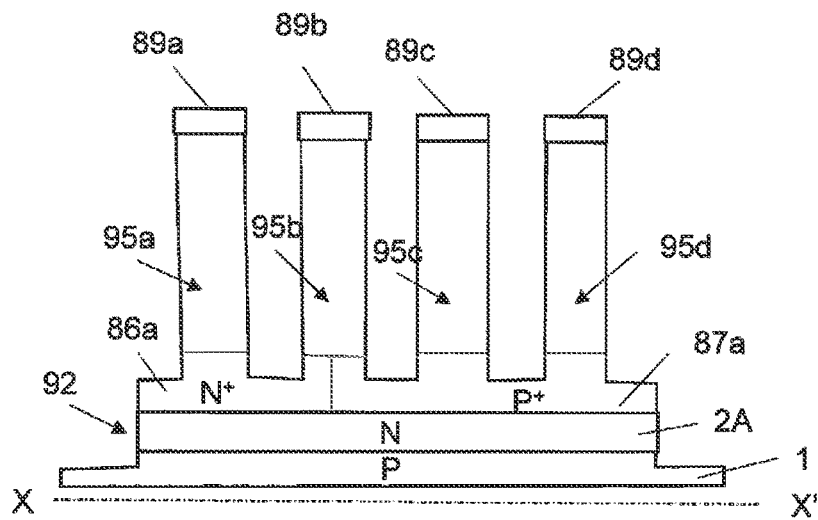
Figure 4C:
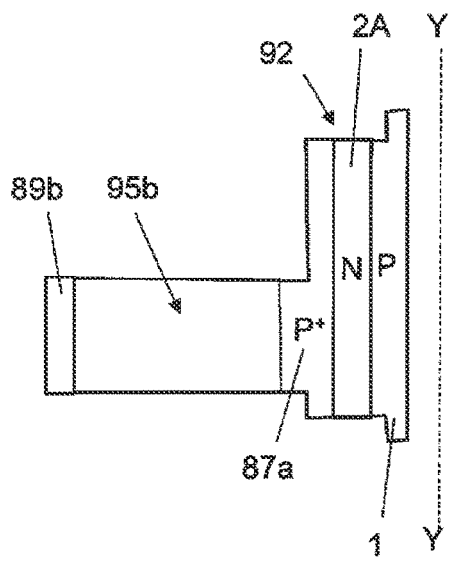

Next, the mask material layer 89 is etched using the rectangular mask material layers 90a, 90bb, 90c, and 90d and the rectangular SiN layers 91a, 91bb, 91c, and 91d as masks to form rectangular mask material layers 89a, 89b, 89c, and 89d as illustrated in FIGS. 4CA to 4CC. Then, the remaining rectangular mask material layers 90a, 90bb, 90c, and 90d and rectangular SiN layers 91a, 91bb, 91c, and 91d are removed. Then, the i layer 88, the $N^+$ layer 86, and the $P^+$ layer 87 are etched using the rectangular mask material layers 89a, 89b, 89c, and 89d as masks to form Si pillars 95a, 95b, 95c, and 95d. Then, the $N^+$ layer 86, the $P^+$ layer 87, the N layer 2, and the P-layer substrate 1 at the outer peripheral portions of the Si pillars 95a, 95b, 95c, and 95d are etched to form a silicon base 92 constituted by an N layer 2A, an $N^+$ layer 86a, and a $P^+$ layer 87a on the P-layer substrate 1.

Figure 4D:
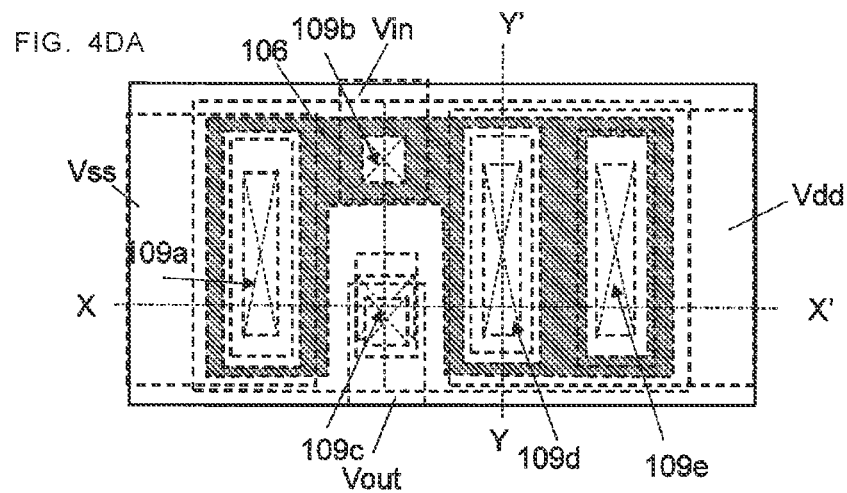
FIGS. 4DA, 4DB, and 4DC are a plan view and sectional structural views for describing the method for producing the pillar-shaped semiconductor device including the SGT according to the fourth embodiment.
Figure 4D:
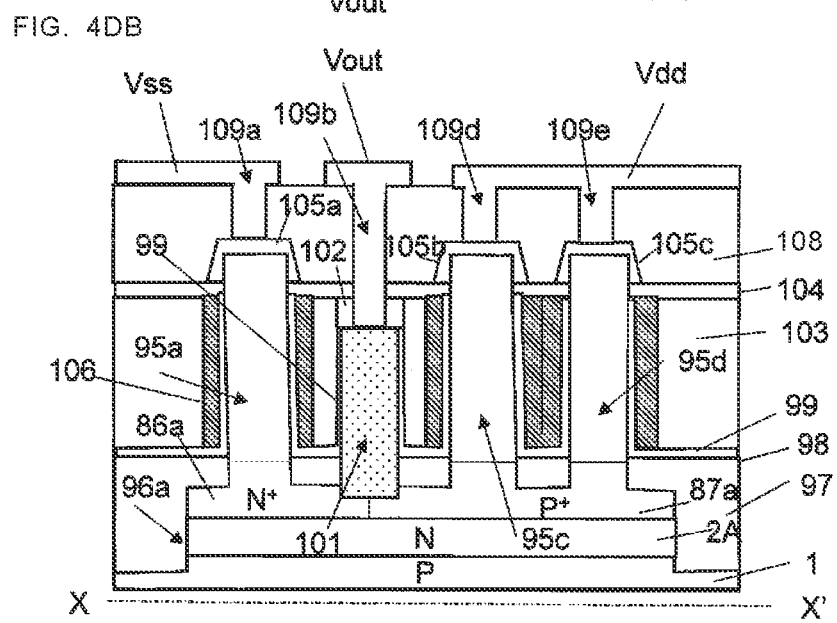
Figure 4D:
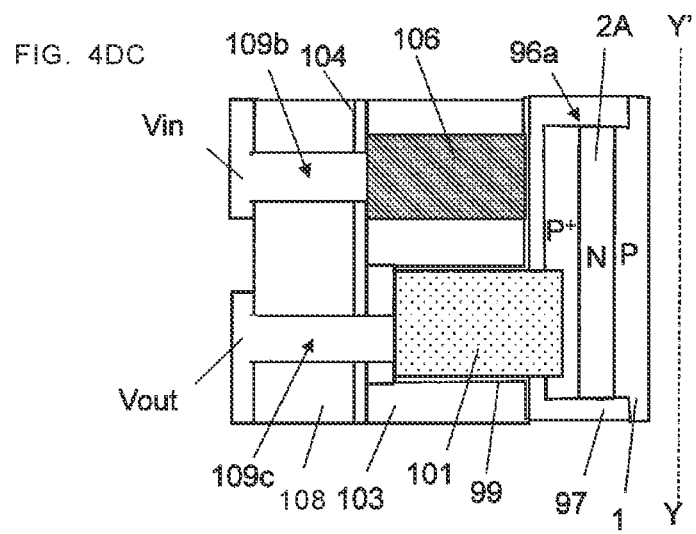
Figure 5:
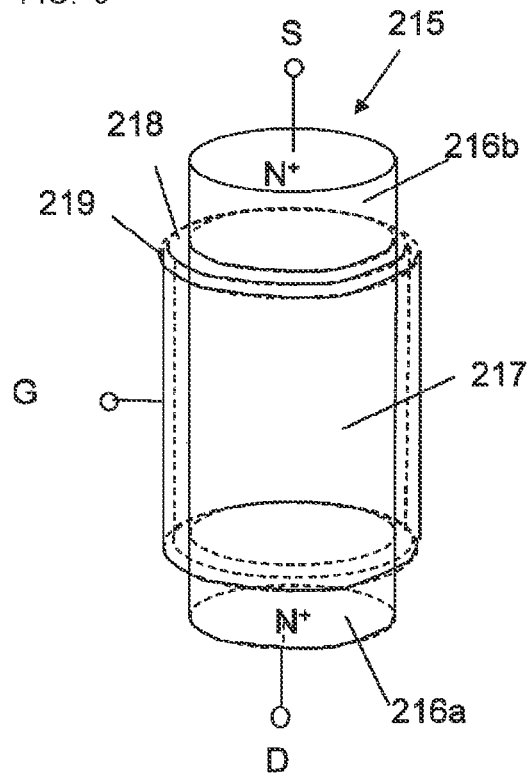
FIG. 5 is a schematic structural view illustrating a SGT of related art.
Figure 6:
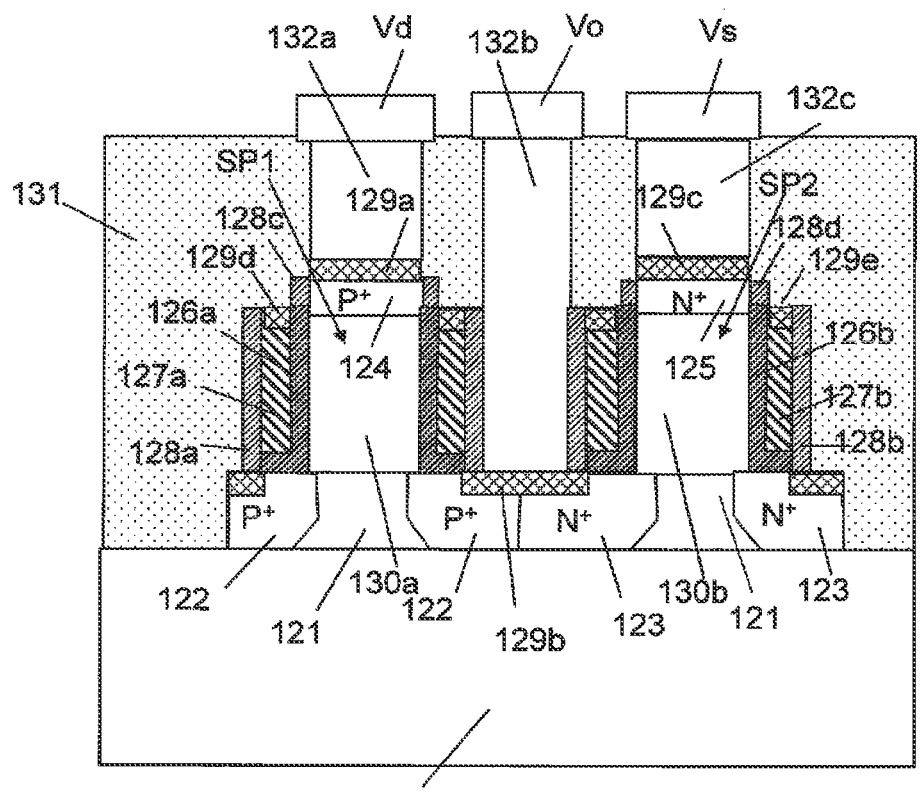
FIG. 6 is a schematic structural view illustrating an inverter circuit using a SGT of related art.

Next, steps equivalent to the steps illustrated in FIGS. 1PA and 1ZD are performed to form a rectangular Ta pillar 101 serving as a contact portion at the location of the rectangular Si pillar 95b as illustrated in FIGS. 4DA to 4DC. A $SiO_2$ layer 97 is formed on outer peripheral portions of bottom portions of the rectangular Si pillars 95a, 95c, and 95d and the rectangular Ta pillar 101. Then, a $HfO_2$ layer 99 serving as a gate insulating layer is formed on side surfaces of the rectangular Si pillars 95a, 95c, and 95d and the rectangular Ta pillar 101 and on the $SiO_2$ layer 97. On an outer side of the $HfO_2$ layer 99, a TiN layer 106 serving as a gate conductor layer surrounding and connected to the rectangular Si pillars 95a, 95c, and 95d and the rectangular Ta pillar 101 is formed. The TiN layer 106 is not formed on a side surface of the $HfO_2$ layer 99 surrounding the rectangular Ta pillar 101. Then, a $SiO_2$ layer 103 is formed on outer peripheral portions of the TiN layer 106 and the rectangular Ta pillar 101. Then, a $SiO_2$ layer 102 is formed on the rectangular Ta pillar 101. Then, a SiN layer 104 is formed on outer peripheral portions of top portions of the rectangular Si pillars 95a, 95c, and 95d. Then, an $N^+$ layer 105a surrounding the top portion of the rectangular Si pillar 95a and $P^+$ layers 105b and 105c surrounding the top portions of the rectangular Si pillars 95c and 95d are formed. Then, a $SiO_2$ layer 108 is formed to cover the whole. Then, a contact hole 109a is formed on the $N^+$ layer 105a, a contact hole 109b is formed on the TiN layer 106, a contact hole 109c is formed on the rectangular Ta pillar 101, and contact holes 109d and 109e are formed on the $P^+$ layers 105b and 105c. Then, a ground wiring metal layer Vss connected to the $N^+$ layer 105a through the contact hole 109a, an input wiring metal layer Vin connected to the TiN layer 106 through the contact hole 109b, an output wiring metal layer Vout connected to the rectangular Ta pillar 101 through the contact hole 109c, a ground wiring metal layer Vss connected to the $N^+$ layer 105a through the contact hole 109a, and a power supply wiring metal layer Vdd connected to the $P^+$ layers 105b and 105c through the contact holes 109d and 109e are formed. Thus, a CMOS inverter circuit is formed on the P-layer substrate 1.

Feature 1

In the present embodiment, the rectangular Ta pillar 101 serving as the contact portion is formed at the location of the rectangular Si pillar 95b formed by self-alignment with the rectangular Si pillars 95a, 95c, and 95d. Thus, the rectangular Ta pillar 101 is formed in self-alignment with the rectangular Si pillars 95a, 95c, and 95d. Thus, a high-density CMOS inverter circuit is formed on the P-layer substrate 1.

Feature 2

In the present embodiment, as in the other embodiments, the $HfO_2$ layer serving as a gate insulating layer surrounding the rectangular Si pillars 95a, 95c, and 95d is formed in a connected manner to surround the rectangular Ta pillar 101 serving as the contact portion. Thus, the $HfO_2$ layer 36 serves as a layer for preventing the rectangular Ta pillar 101 from falling or tilting. By forming the rectangular Ta pillar 101 such that the position of the bottom portion of the rectangular Ta pillar 101 is lower than upper surfaces of the $N^+$ layer 86a and the $P^+$ layer 87a, the rectangular Ta pillar 101 is further prevented from falling or tilting.

Feature 3

The CMOS inverter circuit of the present embodiment can be formed by the same step as that of the SRAM circuit described in the other embodiments. Thus, a high-density inverter circuit and a high-density SRAM circuit can be formed on the same P-layer substrate 1. Moreover, another high-density logic circuit is formed by changing the arrangement and structure of the $N^+$ layers 86a and 105a, the $P^+$ layers 87a, 105b, and 105c, and the gate TiN layer 106 and the shape of the wiring. Thus, a high-density SRAM circuit and a high-density logic circuit can be formed on the same P-layer substrate 1.

Feature 4

In the present embodiment, in order to obtain a large drive current, the rectangular Si pillars 95a, 95c, and 95d extending in the Y direction in plan view are formed. Thus, the contact hole 109b for connecting the gate TiN layer 106 and the output wiring metal layer Vout can be formed between the rectangular Si pillars 95a and 95c in plan view by making the length of the rectangular Ta pillar 101 in the Y direction smaller than the lengths of the rectangular Si pillars 95a, 95c, and 95d. Thus, a CMOS inverter circuit with a further high density is formed. This can be applied to formation of another logic circuit. Thus, a high-density logic circuit is formed.

Although one SGT is formed at one semiconductor pillar in the description of the present invention, the present invention can also be applied to formation of a circuit in which two or more SGTs are formed.

In the first embodiment, the mask material layer 7 is formed by stacking the $SiO_2$ layer, the aluminum oxide ($Al_2O_3$, hereinafter referred to as AlO) layer, and the $SiO_2$ layer. Then, the silicon nitride (SiN) layer 8 is deposited. Then, the mask material layer 9 made of the $SiO_2$ layer is deposited. Then, the mask material layer 10 made of the SiN layer is deposited. As the mask material layers 7, 9, and 10 and the SiN layer 8, another material layer constituted by one layer or a plurality of layers may be used as long as the material is suitable for the object of the present invention. This also applies to the other embodiments according to the present invention.

In the first embodiment, as illustrated in FIGS. 1EA to 1EC, the band-shaped SiGe layers 12aa and 12ab are formed by ALD. As the band-shaped SiGe layers 12aa and 12ab, another material layer constituted by one layer or a plurality of layers may be used as long as the material is suitable for the object of the present invention. This also applies to the band-shaped SiGe layers 18a and 18b. The material base of the band-shaped SiGe layers 12aa and 12ab does not have to be the same as that of the band-shaped SiGe layers 18a and 18b. This also applies to the other embodiments according to the present invention.

In the first embodiment, as the band-shaped mask material layers 15a, 15b, 17a, 17b, 19a, 19b, 21a, and 21b and the band-shaped SiN layers 16a, 16b, 20a, and 20b, another material layer constituted by one layer or a plurality of layers may be used as long as the material is suitable for the object of the present invention. This also applies to the other embodiments according to the present invention.

In the first embodiment, the band-shaped mask material layers 9a, 15a, 15b, 17a, 17b, 19a, 19b, 21a, and 21b are formed such that the positions of the respective upper surfaces thereof are the same and the positions of the respective bottom portions thereof are be the same. However, the positions of the respective upper surfaces may be different and the positions of the respective bottom portions may be different in the vertical direction as long as such formation is suitable for the object of the present invention. This also applies to the other embodiments according to the present invention.

In the first embodiment, the thicknesses and shapes of the band-shaped mask material layers 9a, 15a, 15b, 17a, 17b, 19a, 19b, 21a, and 21b are changed by polishing by CMP, RIE etching, and cleaning. This change does not cause any problem as long as it is within a range that is suitable for the object of the present invention. This also applies to the other embodiments according to the present invention.

In the first embodiment, as the $SiO_2$ layer 22, the SiN layer 24, the band-shaped SiGe layer 25, the band-shaped mask material layer 26 constituted by the SiN layer, the band-shaped mask material layers 27a and 27b, and the band-shaped SiN layers 28a and 28b illustrated in FIGS. 1QA to 1SC, a material layer constituted by one layer or a plurality of layers may be used as long as the material is suitable for the object of the present invention. This also applies to the other embodiments according to the present invention.

In the first embodiment, the Ta pillars 41a and 41b of the contact portions are formed at the locations of the Si pillars 6b and 6i. A Ta pillar of a contact portion may be formed at a Si pillar other than the Si pillars 6b and 6i in accordance with circuit design. This can be applied to formation of a circuit other than the SRAM cell circuit. This also applies to the other embodiments according to the present invention.

In the first embodiment, as illustrated in FIGS. 1ZA to 1ZD, the TiN layers 37a, 37b, 37c, and 37d are used as the gate metal layers. As the TiN layers 37a, 37b, 37c, and 37d, a material layer constituted by one layer or a plurality of layers can be used as long as the material is suitable for the object of the present invention. The TiN layers 37a, 37b, 37c, and 37d can be formed of a metal layer constituted by one layer or a plurality of layers having at least a desired work function. For example, a W layer may be formed on an outer side of the TiN layers 37a, 37b, 37c, and 37d. In this case, the W layer serves as a metal wiring layer for connecting the gate metal layers. A metal layer constituted by one layer or a plurality of layers other than the W layer may be used. The outer peripheral portions of the Si pillars 6c and 6h forming the P-channel SGTs and the gate conductor layer of the outer peripheral portions of the Si pillars 6a, 6d, 6e, 6f, 6g, and 6j forming the N-channel SGTs may be formed of different materials. This also applies to the other embodiments according to the present invention.

In the description of the first to third embodiments of the present invention, the example of forming the SRAM cell has been described. In the fourth embodiment, the application example of the present invention to the logic circuit has been described. The present invention can be applied to formation of a circuit in which a SRAM circuit and a logic circuit are formed on the same chip, for example, a microprocessor circuit.

In the first embodiment, the mask material layers 7a to 7j having a circular shape in plan view are formed. The shapes of the mask material layers 7a to 7j may be elliptical. This also applies to the other embodiments according to the present invention.

In the first embodiment, the $HfO_2$ layer 36 is used as the gate insulating layer and the TiN layers 37a, 37b, 37c, and 37d are used as the gate material layers; however, another material layer constituted by one layer or a plurality of layers may be used. Similarly, as the W layer, another material layer constituted by one layer or a plurality of layers may be used. This also applies to the other embodiments according to the present invention.

In the first embodiment, as illustrated in FIGS. 1YA to 1YD, the $N^+$ layers 56a, 56c, 56d, 56e, 56f, and 56h and the $P^+$ layers 56b and 56g are formed by using selective epitaxial growth. Thereafter, donor impurity atoms or acceptor impurity atoms may be thermally diffused into the top portions of the Si pillars 6a, 6c, 6d, 6e, 6f, 6h, and 6j by heat treatment to form $N^+$ layers or $P^+$ layers at the top portions of the Si pillars 6a, 6c, 6d, 6e, 6f, 6h, and 6j. This also applies to the other embodiments according to the present invention.

Although the SGT is formed on the P-layer substrate 1 in the first embodiment, a silicon on insulator (SOI) substrate may be used instead of the P-layer substrate 1. Alternatively, a substrate formed of another material may be used as long as the resultant serves as a substrate. This also applies to the other embodiments according to the present invention.

In the first embodiment, the SGTs constituting a source and a drain by using the $N^+$ layers 3a, 3b, 3c, 3d, 56a, 56c, 56d, 56e, 56f, and 56h and the $P^+$ layers 56b and 56g having conductivity of the same polarity and disposed above and below the Si pillars 6a, 6c, 6d, 6e, 6f, 6h, and 6j have been described; however, the present invention can also be applied to tunnel SGTs having a source and a drain of different polarities. This also applies to the other embodiments according to the present invention.

In each of the above-described embodiments, the example of using Si (silicon) as semiconductor regions such as a channel, a source, and a drain has been described. However, the present invention is not limited thereto, and the technical idea of the present invention can also be applied to a three-dimensional semiconductor device using a semiconductor material containing Si such as SiGe or a semiconductor material other than Si.

In the first embodiment, the Si pillars 6a to 6j are formed of one Si layer; however, a channel of SGT may be formed by stacking semiconductor layers made of different semiconductor bases in the vertical direction. This also applies to the other embodiments according to the present invention.

In a vertical NAND flash memory circuit, a semiconductor pillar is used as a channel, and a plurality of memory cells each constituted by a tunnel oxide layer, a charge storage layer, an interlayer insulating layer, and a control conductor layer surrounding the semiconductor pillar are formed in the vertical direction in multiple stages. The semiconductor pillars at both ends of these memory cells include a source line impurity layer corresponding to a source and a bit line impurity layer corresponding to a drain. For one memory cell, when one of the memory cells on both sides thereof is a source, the other serves as a drain. As described above, a vertical NAND flash memory circuit is one of SGT circuits. Therefore, the present invention can be applied to a NAND flash memory circuit.

Various embodiments and modifications of the present invention are possible without departing from the broad spirit and scope of the present invention. The above-described embodiments are intended to illustrate one embodiment of the present invention and are not intended to limit the scope of the present invention. The above-described embodiments and modifications can be freely combined. Furthermore, it is within the scope of the technical idea of the present invention to remove some of the components of the above-described embodiments as necessary.

With the pillar-shaped semiconductor device and the method for producing the pillar-shaped semiconductor device according to the present invention, a high-density pillar-shaped semiconductor device can be obtained.

What is claimed is:

1. A SGT pillar-shaped semiconductor device, comprising:
    a first semiconductor pillar and a second semiconductor pillar standing in a vertical direction on a substrate;
    a first impurity layer that is connected to a bottom portion of the first semiconductor pillar and/or to a side surface of the bottom portion and that serves as a drain or a source, and a second impurity layer that is connected to a bottom portion of the second semiconductor pillar and/or to a side surface of the bottom portion and that serves as a source or a drain;
    a third impurity layer that is provided inside an upper portion of the first semiconductor pillar and/or provided to surround the upper portion and that serves as a drain or a source, and a fourth impurity layer that is provided inside an upper portion of the second semiconductor pillar and/or provided to surround the upper portion and that serves as a source or a drain;
    a first gate insulating layer surrounding the first semiconductor pillar and the second semiconductor pillar;
    a first gate conductor layer surrounding the first gate insulating layer on an outer periphery of the first semiconductor pillar, and a second gate conductor layer surrounding the first gate insulating layer on an outer periphery of the second semiconductor pillar; and
    a first contact pillar located between the first impurity layer and the second impurity layer in plan view, standing in the vertical direction, and including a conductor layer at least in a central portion of the first contact pillar,
    wherein the first gate insulating layer extends to and connects to the first contact pillar and surrounds a side surface of the first contact pillar.

2. The SGT pillar-shaped semiconductor device according to claim 1,
    wherein a position of a bottom portion of the first contact pillar in the vertical direction is lower than positions of the bottom portions of the first semiconductor pillar and the second semiconductor pillar.

3. The SGT pillar-shaped semiconductor device according to claim 1,
    wherein two parallel virtual tangent lines in contact with the first semiconductor pillar and the second semiconductor pillar are also in contact with the first contact pillar in plan view.

4. The SGT pillar-shaped semiconductor device according to claim 1,
    wherein the first gate insulating layer is made of different materials at an outer peripheral portion of the first semiconductor pillar and an outer peripheral portion of the second semiconductor pillar, and the first gate insulating layer of one of the first semiconductor pillar and the second semiconductor pillar is connected to an outer peripheral portion of the first contact pillar.

5. The SGT pillar-shaped semiconductor device according to claim 1,
    wherein a first material layer constituted by one layer or a plurality of layers of a metal, alloy, or insulating layer is provided on an outer peripheral portion of the contact pillar in plan view.

6. The SGT pillar-shaped semiconductor device according to claim 1,
    wherein a midpoint of the first contact pillar is located on a first line connecting a midpoint of the first semiconductor pillar and a midpoint of the second semiconductor pillar in plan view,
    wherein the SGT pillar-shaped semiconductor device comprises a third semiconductor pillar being adjacent to the second semiconductor pillar on a side opposite to the first contact pillar and having a midpoint on the first line,
    wherein the first gate insulating layer extends from the second semiconductor pillar and surrounds a side surface of the third semiconductor pillar,
    wherein the second gate conductor layer extends from the second semiconductor pillar and surrounds a side surface of an outer peripheral portion of the third semiconductor pillar, and
    wherein the second gate conductor layer is in contact with an entire side surface of the first gate insulating layer of the second semiconductor pillar and the third semiconductor pillar.

7. The SGT pillar-shaped semiconductor device according to claim 6, comprising:
    a fourth semiconductor pillar being adjacent to the third semiconductor pillar on a side opposite to the second semiconductor pillar and having a midpoint on the first line,
    wherein the first gate insulating layer extends from the second semiconductor pillar and the third semiconductor pillar and surrounds a side surface of the fourth semiconductor pillar,
    wherein the second gate conductor layer extends from the second semiconductor pillar and the third semiconductor pillar and surrounds a side surface of an outer peripheral portion of the fourth semiconductor pillar, and
    wherein the second gate conductor layer is in contact with an entire side surface of the first gate insulating layer of the second semiconductor pillar, the third semiconductor pillar, and the fourth semiconductor pillar.

8. The SGT pillar-shaped semiconductor device according to claim 7,
   wherein the first semiconductor pillar includes a selection SGT,
   wherein the second semiconductor pillar includes a load SGT,
   wherein the third semiconductor pillar includes a drive SGT,
   wherein the fourth semiconductor pillar includes a drive SGT, and
   wherein the first semiconductor pillar, the second semiconductor pillar, the third semiconductor pillar, and the fourth semiconductor pillar constitute a SRAM cell.

9. The SGT pillar-shaped semiconductor device according to claim 6,
   wherein the first semiconductor pillar includes a selection SGT,
   wherein the second semiconductor pillar includes a load SGT,
   wherein the third semiconductor pillar includes a drive SGT, and
   wherein the first semiconductor pillar, the second semiconductor pillar, and the third semiconductor pillar constitute a SRAM cell.

10. The SGT pillar-shaped semiconductor device according to claim 1,
   wherein the first semiconductor pillar, the second semiconductor pillar, and the first contact pillar have rectangular shapes extending in one direction in plan view, and are arranged in parallel to each other in plan view.

11. A method for producing a SGT pillar-shaped semiconductor device, the method comprising:
   a step of forming a first semiconductor pillar, a fifth semiconductor pillar, and a second semiconductor pillar on a substrate such that midpoints of the first semiconductor pillar, the fifth semiconductor pillar, and the second semiconductor pillar are on a first line in plan view,
   a step of forming a first impurity layer that is connected to a bottom portion of the first semiconductor pillar and that serves as a source or a drain, and forming a second impurity layer that is connected to a bottom portion of the second semiconductor pillar and that serves as a drain or a source;
   a step of forming a first gate insulating layer that surrounds and is connected to the first semiconductor pillar, the fifth semiconductor pillar, and the second semiconductor pillar;
   a step of forming a first conductor layer that surrounds and is connected to the first semiconductor pillar, the fifth semiconductor pillar, and the second semiconductor pillar on an outer side of the first gate insulating layer;
   a step of etching the fifth semiconductor pillar to form a first hole;
   a step of forming a first contact pillar in the first hole, at least a central portion of the first contact pillar being a conductor;
   a step of etching the first conductor layer to remove the first conductor layer surrounding an outer peripheral portion of the first contact pillar and to form a first gate conductor layer constituted by the first conductor layer surrounding the first semiconductor pillar and a second gate conductor layer constituted by the first conductor layer surrounding the second semiconductor pillar; and
   a step of forming a first insulating layer on outer peripheral portions of the first gate conductor layer, the first gate insulating layer surrounding the first contact pillar, and the second gate conductor layer,
   wherein the first contact pillar is electrically connected to the first impurity layer and the second impurity layer, and the connection extends in a vertical direction.

12. The method for producing a SGT pillar-shaped semiconductor device according to claim 11,
   wherein the first hole is formed such that a position of a bottom portion of the first hole is below positions of the bottom portions of the first semiconductor pillar and the second semiconductor pillar in the vertical direction.

13. The method for producing a SGT pillar-shaped semiconductor device according to claim 11, the method comprising:
   a step of forming a first material layer constituted by one layer or a plurality of layers of a metal, alloy, or insulating layer on a side surface of the hole after the first hole is formed; and
   a step of forming a second conductor layer on an inner side of the first material layer in plan view,
   wherein the first material layer and the second conductor layer are the first contact pillar.

14. The method for producing a SGT pillar-shaped semiconductor device according to claim 11, the method comprising:
   a step of forming the first semiconductor pillar, the fifth semiconductor pillar, and the second semiconductor pillar in rectangular shapes extending in a direction perpendicular to the first line in plan view.

15. The method for producing a SGT pillar-shaped semiconductor device according to claim 14, the method comprising:
   before the first semiconductor pillar, the fifth semiconductor pillar, and the second semiconductor pillar extending in the direction perpendicular to the first line are formed,
   a step of removing one of upper and lower partial regions in plan view of a first etching mask layer for forming the fifth semiconductor pillar, the first etching mask layer being included in an etching mask material layer for forming the first semiconductor pillar, the fifth semiconductor pillar, and the second semiconductor pillar.

16. The method for producing a SGT pillar-shaped semiconductor device according to claim 11, the method comprising:
   a step of forming a third semiconductor pillar being adjacent to the second semiconductor pillar on a side opposite to the first contact pillar and having a midpoint on a first line, the first line connecting the midpoint of the first semiconductor pillar and the midpoint of the fifth semiconductor pillar in plan view;
   a step of extending the first gate insulating layer from the second semiconductor pillar to surround a side surface of the third semiconductor pillar; and
   a step of forming the second gate conductor layer to be in contact with an entire side surface of the first gate insulating layer of the second semiconductor pillar and the third semiconductor pillar.

17. The method for producing a SGT pillar-shaped semiconductor device according to claim 16, the method comprising:
   a step of forming, on the first line, a fourth semiconductor pillar being adjacent to the third semiconductor pillar on a side opposite to the second semiconductor pillar;

a step of extending the first gate insulating layer from the third semiconductor pillar to surround a side surface of the fourth semiconductor pillar; and a step of forming the second gate conductor layer to be in contact with an entire side surface of the first gate insulating layer of the second semiconductor pillar, the third semiconductor pillar, and the fourth semiconductor pillar.

18. The method for producing a SGT pillar-shaped semiconductor device according to claim 17, the method comprising:

a step of forming a selection SGT at the first semiconductor pillar, forming a load SGT at the second semiconductor pillar, forming a drive SGT at the third semiconductor pillar, and forming a drive SGT at the fourth semiconductor pillar, wherein the first semiconductor pillar, the second semiconductor pillar, the third semiconductor pillar, and the fourth semiconductor pillar constitute a portion of a SRAM cell.

19. The method for producing a SGT pillar-shaped semiconductor device according to claim 16, the method comprising:

a step of forming a selection SGT at the first semiconductor pillar, forming a load SGT at the second semiconductor pillar and forming a drive SGT at the third semiconductor pillar, wherein the first semiconductor pillar, the second semiconductor pillar, and the third semiconductor pillar constitute a portion of a SRAM cell.

* * * * *

UNITED STATES PATENT AND TRADEMARK OFFICE
CERTIFICATE OF CORRECTION

PATENT NO. : 12,029,022 B2
APPLICATION NO. : 17/730561
DATED : July 2, 2024
INVENTOR(S) : Fujio Masuoka and Nozomu Harada It is certified that error appears in the above-identified patent and that said Letters Patent is hereby corrected as shown below:

In the Claims

Column 27, Claim 8, Line 2, delete "claim 7" and replace with --claim 6--

Column 27, Claim 8, Lines 9-10, delete "wherein the fourth semiconductor pillar includes a drive SGT,"

Column 27, Claim 8, Lines 12-13, delete "the third semiconductor pillar, and the fourth semiconductor pillar" and replace with --, and the third semiconductor pillar--

Column 27, Claim 9, Line 15, delete "claim 6" and replace with --claim 7--

Column 27, Claim 9, Line 21, delete "and" and replace with --wherein the fourth semiconductor pillar includes a drive SGT, and--

Column 27, Claim 9, Line 23, delete "and the third semiconductor pillar" and replace with --the third semiconductor pillar, and the fourth semiconductor pillar--

Column 29, Claim 18, Line 10, delete "claim 17" and replace with --claim 16--

Column 29, Claim 18, Line 14, delete "," and replace with --and--

Column 29, Claim 18, Lines 15-16, delete "and forming a drive SGT at the fourth semiconductor pillar,"

Column 29, Claim 18, Lines 18-19, delete "the third semiconductor pillar, and the fourth semiconductor pillar" and replace with --and the third semiconductor pillar--

Column 29, Claim 19, Line 22, delete "claim 16" and replace with --claim 17--

Signed and Sealed this
Twentieth Day of August, 2024

Katherine Kelly Vidal
*Director of the United States Patent and Trademark Office*

CERTIFICATE OF CORRECTION (continued)
U.S. Pat. No. 12,029,022 B2

Column 29, Claim 19, Line 27, delete "and" and replace with --,--

Column 29, Claim 19, Line 28, delete "," and replace with --, and forming a drive SGT at the fourth semiconductor pillar,--

Column 29, Claim 19, Line 30, delete "and the third semiconductor pillar" and replace with --the third semiconductor pillar, and the fourth semiconductor pillar--